(12) United States Patent
Hirose et al.

(10) Patent No.: US 9,991,669 B2
(45) Date of Patent: Jun. 5, 2018

(54) SEMICONDUCTOR LIGHT-EMITTING DEVICE AND MANUFACTURING METHOD FOR THE SAME

(71) Applicant: HAMAMATSU PHOTONICS K.K., Hamamatsu-shi, Shizuoka (JP)

(72) Inventors: Kazuyoshi Hirose, Hamamatsu (JP); Yoshitaka Kurosaka, Hamamatsu (JP); Takahiro Sugiyama, Hamamatsu (JP); Yuu Takiguchi, Hamamatsu (JP); Yoshiro Nomoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days. days.

(21) Appl. No.: 15/656,096

(22) Filed: Jul. 21, 2017

(65) Prior Publication Data
US 2018/0026419 A1 Jan. 25, 2018

(30) Foreign Application Priority Data

Jul. 25, 2016 (JP) .................................. 2016-145584
Mar. 17, 2017 (JP) .................................. 2014-053409
May 31, 2017 (JP) .................................. 2017-107933

(51) Int. Cl.
*H01S 5/00* (2006.01)
*H01S 5/183* (2006.01)
(Continued)

(52) U.S. Cl.
CPC .......... *H01S 5/0085* (2013.01); *H01S 5/0265* (2013.01); *H01S 5/183* (2013.01);
(Continued)

(58) Field of Classification Search
CPC ...... H01S 5/0085; H01S 5/0265; H01S 5/187; H01S 5/183; H01S 5/18338;
(Continued)

(56) References Cited

U.S. PATENT DOCUMENTS 9,614,352 B2 *  4/2017  Takiguchi ............... H01S 5/105
9,748,737 B2 *  8/2017  Takiguchi ............... H01S 5/105
(Continued)

FOREIGN PATENT DOCUMENTS

WO    WO-2014/136962 A1    9/2014

OTHER PUBLICATIONS

Yoshitaka Kurosaka et al., "Effects of non-lasing band in two-dimensional photonic-crystal lasers clarified using omnidirectional band structure," Optics Express, Sep. 10, 2012, pp. 21773-21783, vol. 20, No. 19.

*Primary Examiner* — Bao-Luan Le
(74) *Attorney, Agent, or Firm* — Drinker Biddle & Reath LLP

(57) ABSTRACT

The embodiment relates to a semiconductor light-emitting device comprising a semiconductor substrate, a first cladding layer, an active layer, a second cladding layer, a contact layer, and a phase modulation layer located between the first cladding and active layers or between the active and second cladding layers. The phase modulation layer comprises a basic layer and plural first modified refractive index regions different from the basic layer in a refractive index. In a virtual square lattice set on the phase modulation layer such that the modified refractive index region is allocated in each of unit constituent regions constituting square lattices, the modified refractive index region is arranged to allow its gravity center position to be separated from the lattice point of the corresponding unit constituent region, and to have a rotation angle about the lattice point according a desired optical image.

26 Claims, 66 Drawing Sheets

(51) Int. Cl.
*H01S 5/026* (2006.01)
*H01S 5/187* (2006.01)

(52) U.S. Cl.
CPC .......... *H01S 5/187* (2013.01); *H01S 5/18338* (2013.01); *H01S 5/18363* (2013.01); *H01S 5/18386* (2013.01); *H01S 5/18391* (2013.01); *H01S 5/18394* (2013.01)

(58) Field of Classification Search
CPC ............. H01S 5/18363; H01S 5/18386; H01S 5/18391; H01S 5/18394
See application file for complete search history.

(56) References Cited

U.S. PATENT DOCUMENTS

| | | | | |
|---|---|---|---|---|
| 2009/0010298 | A1* | 1/2009 | Kiyota | B82Y 20/00 372/96 |
| 2009/0016395 | A1* | 1/2009 | Noda | H01S 5/105 372/41 |
| 2009/0135871 | A1* | 5/2009 | Noda | G11B 7/127 372/44.01 |
| 2011/0188526 | A1* | 8/2011 | Noda | H01S 5/105 372/41 |
| 2011/0261856 | A1* | 10/2011 | Fattal | H01S 5/18363 372/46.012 |
| 2016/0020580 | A1* | 1/2016 | Takiguchi | H01S 5/105 372/44.011 |
| 2016/0036201 | A1* | 2/2016 | Takiguchi | H01S 5/12 359/492.01 |

* cited by examiner

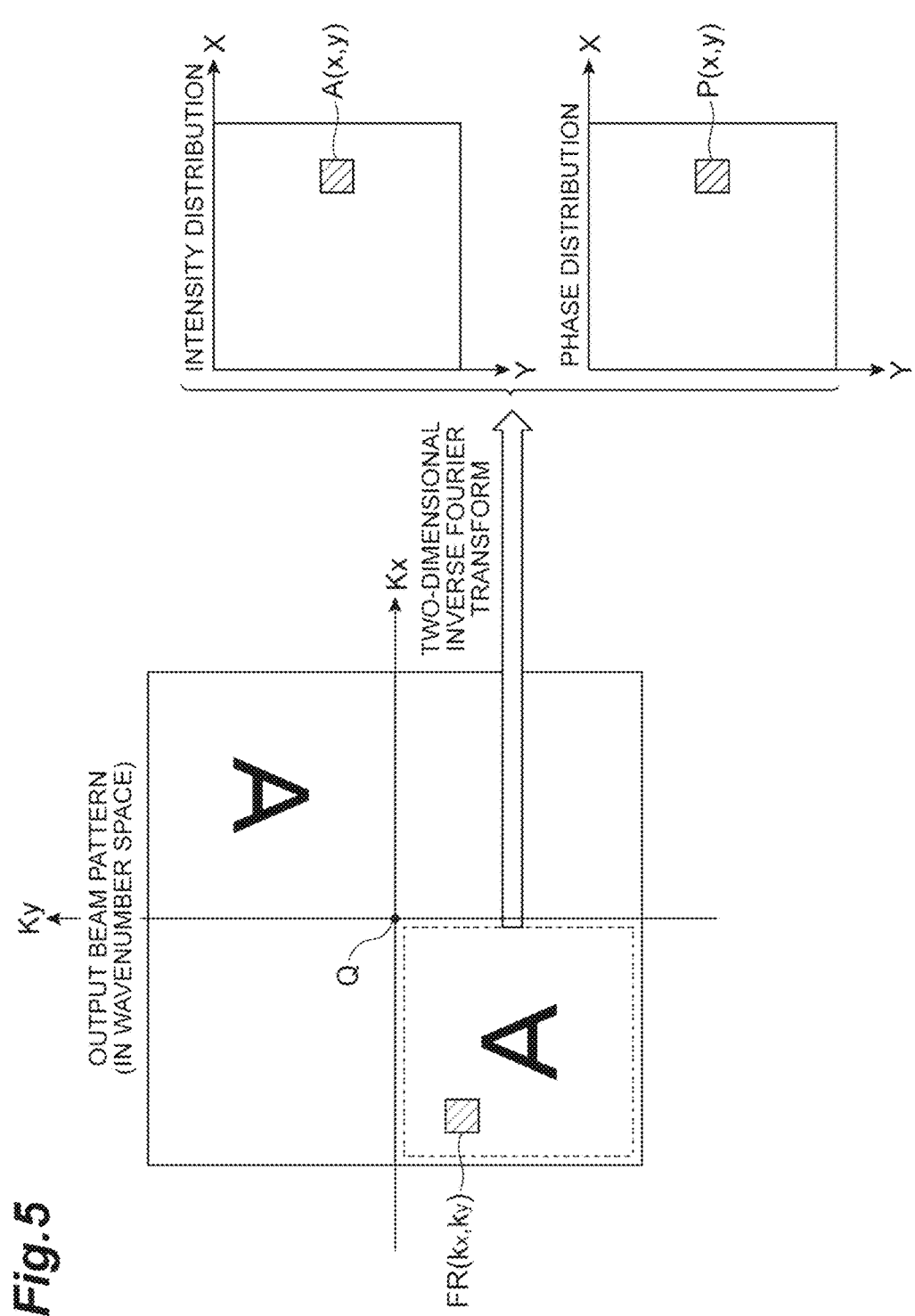

Fig.6A

| A2 | A1 |
|---|---|
| A3 | A4 |

ORIGINAL IMAGE

Fig.6B

| A4 | A3 |
|---|---|
| A2 ROTATED | A1 ROTATED |
| A1 | A2 |
| A3 ROTATED | A4 ROTATED |

OBTAINED BEAM PATTERN

*Fig.*9
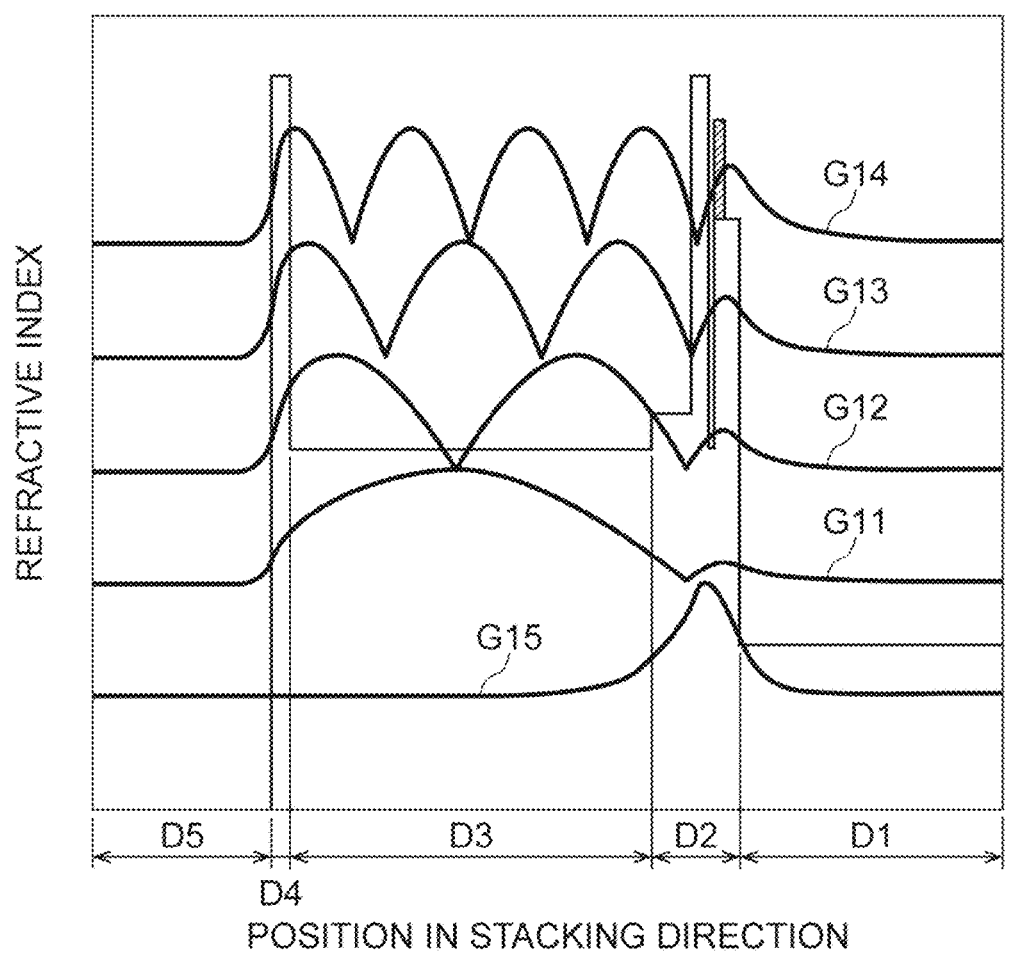

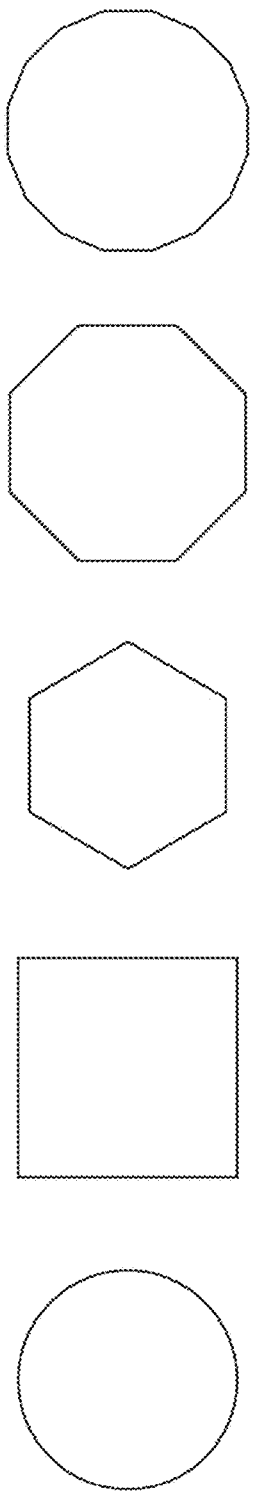

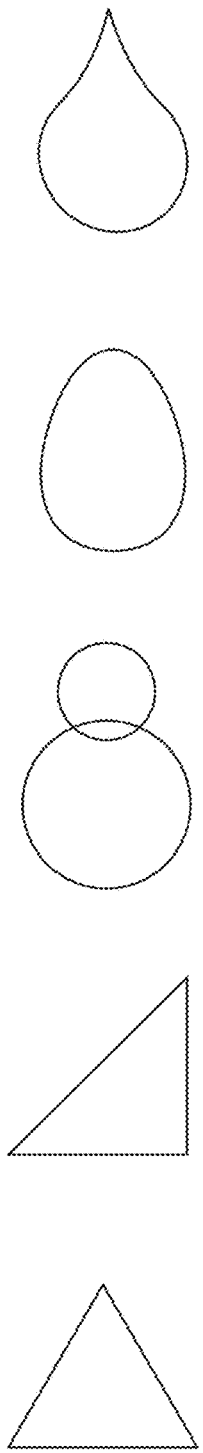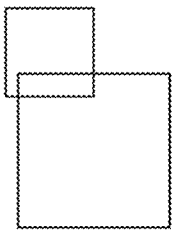
Fig.14A Fig.14B Fig.14C Fig.14D Fig.14E Fig.14F Fig.14G Fig.14H Fig.14I Fig.14J Fig.14K

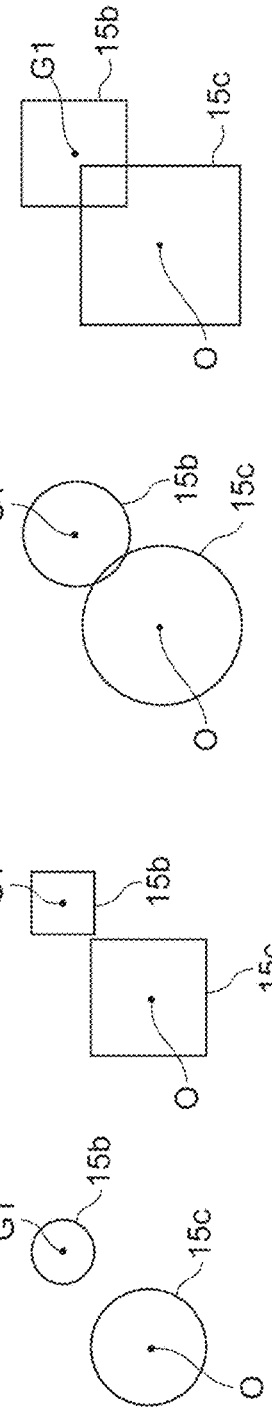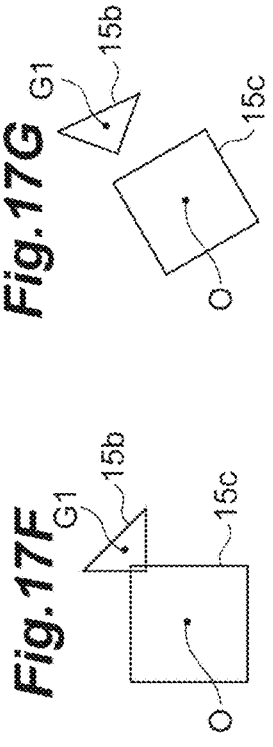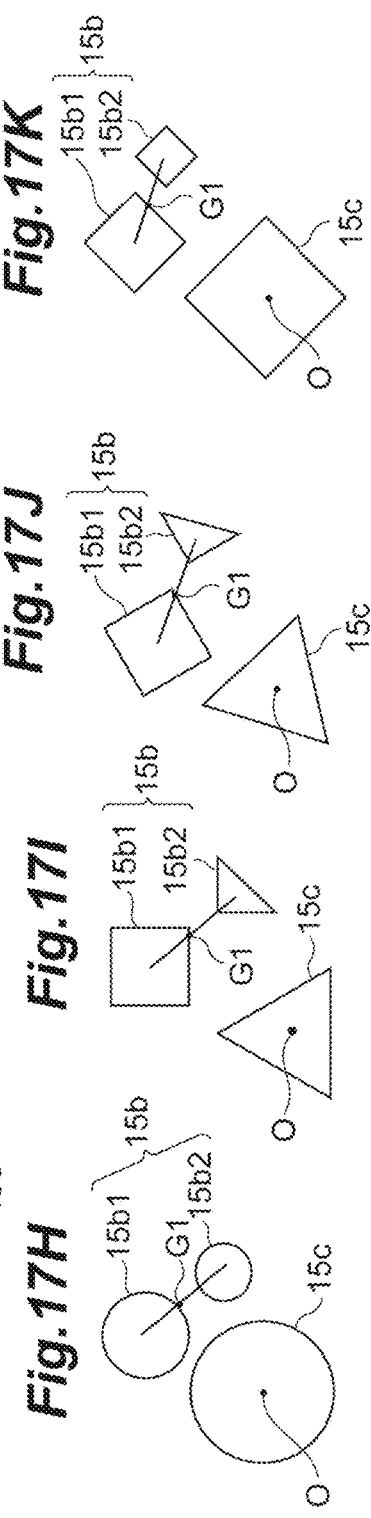

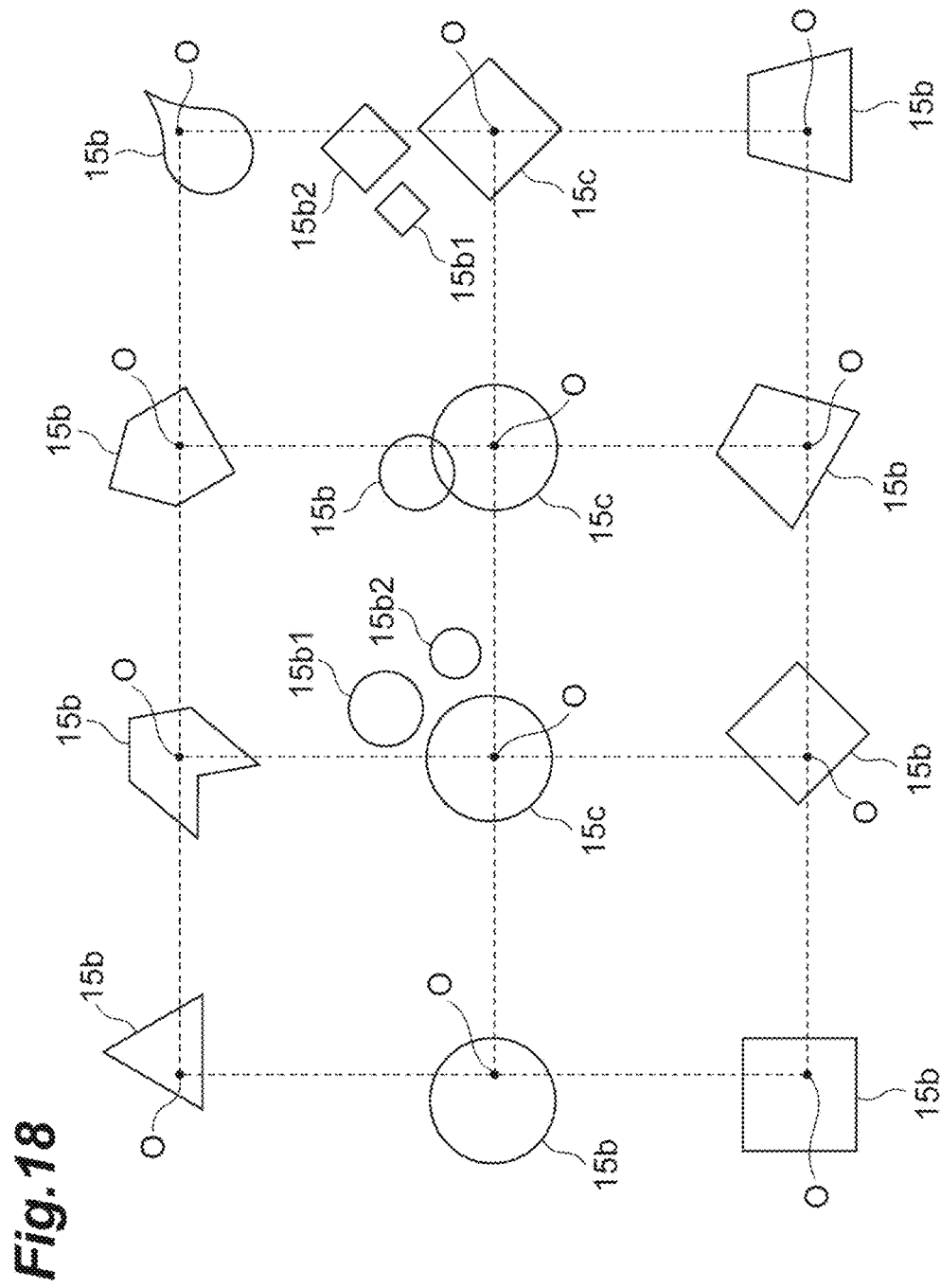

Fig.19

| LAYER No. | CONDUCTIVITY TYPE | LAYER STRUCTURE | FILM THICKNESS (nm) | REFRACTIVE INDEX |
|---|---|---|---|---|
| 1 | P-TYPE | GaAs CONTACT LAYER | 100 | 3.55 |
| 2 | P-TYPE | AlGaAs CLADDING LAYER | 700 | 3.12 |
| 3 | I-TYPE | PHASE MODULATION LAYER (GaAs/CAVITY, CAVITY FF = 15%) | 250 | 3.30 |
| 4 | I-TYPE | InGaAs/AlGaAs ACTIVE LAYER | 225 | 3.46 |
| 5 | N-TYPE | AlGaAs CLADDING LAYER | 2000 | 3.27 |

Fig.21

| LAYER No. | CONDUCTIVITY TYPE | LAYER STRUCTURE | FILM THICKNESS (nm) | REFRACTIVE INDEX |
|---|---|---|---|---|
| 1 | P-TYPE | GaInAsP (Eg = 1.15 eV) CONTACT LAYER | 100 | 3.35 |
| 2 | P-TYPE | InP CLADDING LAYER | 1000 | 3.21 |
| 3 | I-TYPE | PHASE MODULATION LAYER (GaInAsP (Eg = 1.0 eV)/CAVITY, CAVITY FF = 15%) | 300 | 3.20 |
| 4 | I-TYPE | GaInAsP ACTIVE LAYER | 275 | 3.42 |
| 5 | N-TYPE | InP CLADDING LAYER | 2000 | 3.21 |

Fig.23

| LAYER No. | CONDUCTIVITY TYPE | LAYER STRUCTURE | FILM THICKNESS (nm) | REFRACTIVE INDEX |
|---|---|---|---|---|
| 1 | P-TYPE | GaN CONTACT LAYER | 100 | 2.55 |
| 2 | P-TYPE | AlGaN CLADDING LAYER | 600 | 2.53 |
| 3 | P-TYPE | AlGaN CARRIER BARRIER LAYER | 20 | 2.48 |
| 4 | I-TYPE | InGaN ACTIVE LAYER | 130 | 2.59 |
| 5 | N-TYPE | GaN GUIDE LAYER | 150 | 2.55 |
| 6 | N-TYPE | PHASE MODULATION LAYER (GaN/CAVITY, CAVITY FF = 15%) | 100 | 2.39 |
| 7 | N-TYPE | AlGaN CLADDING LAYER | 2000 | 2.54 |

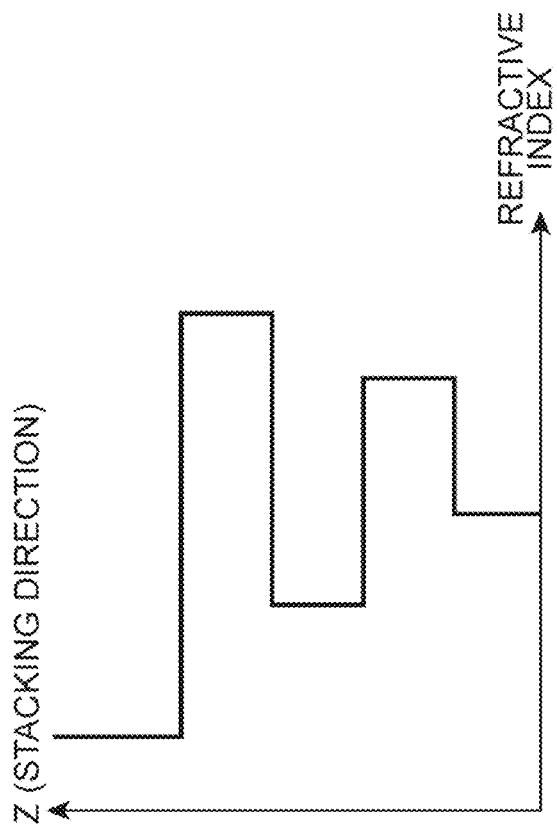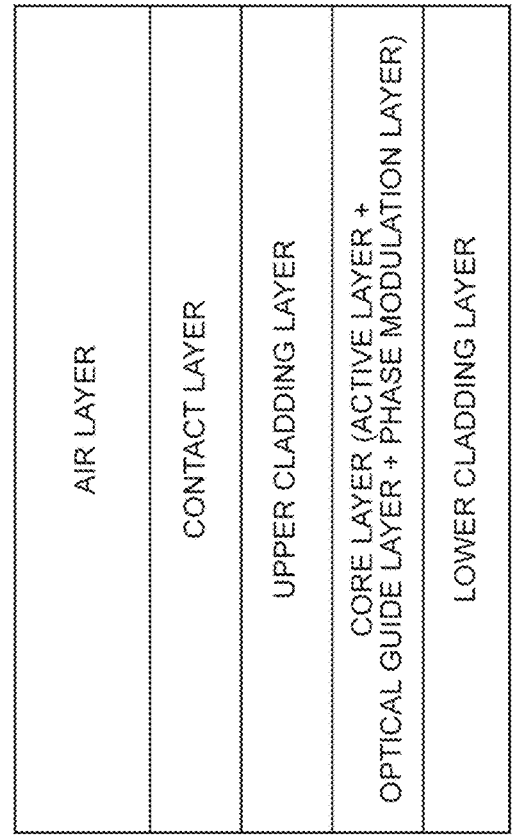

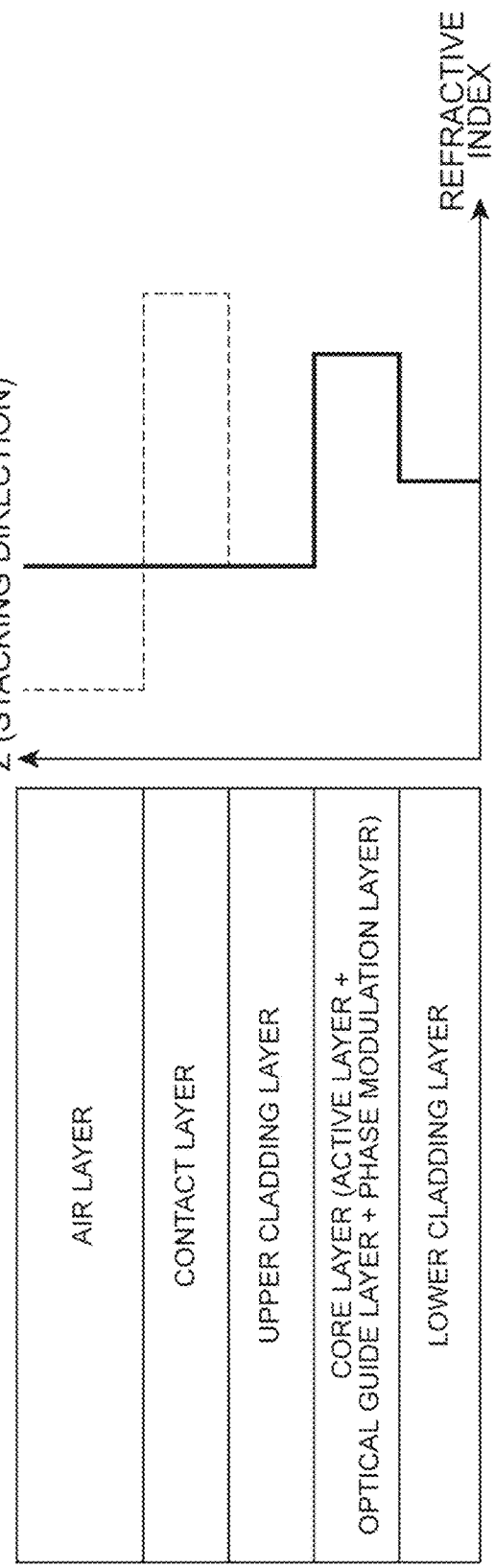

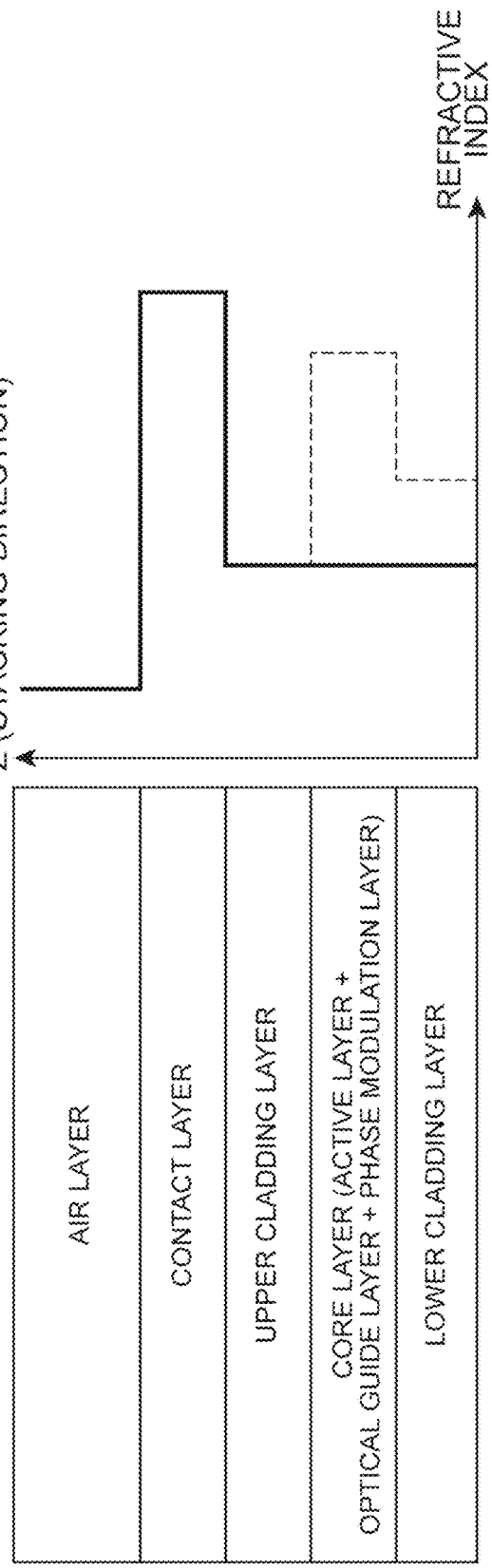

Fig.32

| LAYER No. | CONDUCTIVITY TYPE | LAYER STRUCTURE | FILM THICKNESS (nm) | REFRACTIVE INDEX |
|---|---|---|---|---|
| 1 | - | AIR | ∞ | 1.00 |
| 2 | P-TYPE | GaAs CONTACT LAYER | 100 | 3.55 |
| 3 | P-TYPE | AlGaAs CLADDING LAYER | 700 | 3.12 |
| 4 | I-TYPE | CORE LAYER (PHASE MODULATION + QUANTUM WELL + GUIDE LAYER) | 475 | 3.38 |
| 5 | N-TYPE | AlGaAs CLADDING LAYER | 2000 | 3.27 |

Fig.33A

| WAVELENGTH | 940nm |
|---|---|
| $n_1$ | 3.38 |
| $n_2$ | 3.27 |
| $n_3$ | 3.12 |
| $a'$ | 1.40 |
| $n_{clad}$ | 3.12 |

Fig.33B

| ORDER | $V_1$ | FILM THICKNESS (nm) |
|---|---|---|
| 0 | 0.869 | 157 |
| 1 | 4.01 | 723 |

*Fig.35A*

| WAVELENGTH | 940nm |
|---|---|
| n4 | 3.55 |
| n5 | 3.12 |
| n6 | 1.00 |
| a' | 3.04 |
| nclad | 3.27 |

*Fig.35B*

| b | V2 | FILM THICKNESS (nm) |
|---|---|---|
| 0.335 | 2.17 | 192 |

Fig.38

| LAYER No. | CONDUCTIVITY TYPE | LAYER STRUCTURE | FILM THICKNESS (nm) | REFRACTIVE INDEX |
|---|---|---|---|---|
| 1 | — | AIR | ∞ | 1.00 |
| 2 | P-TYPE | GaInAsP (Eg = 1.15 eV) CONTACT LAYER | 100 | 3.35 |
| 3 | P-TYPE | InP CLADDING LAYER | 1000 | 3.21 |
| 4 | I-TYPE | PHASE MODULATION LAYER (GaInAsP (Eg = 1.0 eV)/CAVITY, CAVITY FF = 15%) | 300 | 3.20 |
| 5 | I-TYPE | CORE LAYER (QUANTUM WELL + GUIDE LAYER) | 275 | 3.42 |
| 6 | N-TYPE | InP CLADDING LAYER | ∞ | 3.21 |

Fig.39A

| WAVELENGTH | 1300nm |
|---|---|
| n₁ | 3.42 |
| n₂ | 3.21 |
| n₃ | 3.20 |
| a' | 0.0267 |
| nclad | 3.21 |

Fig.39B

| b | V₂ | FILM THICKNESS (nm) |
|---|---|---|
| 0 | 0.162 | 28 |
| 0 | 3.30 | 579 |

*Fig.41A*

| WAVELENGTH | 1300nm |
|---|---|
| $n_4$ | 3.35 |
| $n_5$ | 3.21 |
| $n_6$ | 1.00 |
| a' | 10.1 |
| $n_{clad}$ | 3.21 |

*Fig.41B*

| b | $V_2$ | FILM THICKNESS (nm) |
|---|---|---|
| 0 | 1.27 | 273 |

Fig.44

| LAYER No. | CONDUCTIVITY TYPE | LAYER STRUCTURE | FILM THICKNESS (nm) | REFRACTIVE INDEX |
|---|---|---|---|---|
| 1 | — | AIR | ∞ | 1.00 |
| 2 | P-TYPE | GaN CONTACT LAYER | 100 | 2.55 |
| 3 | P-TYPE | AlGaN CLADDING LAYER | 600 | 2.53 |
| 4 | I/N-TYPE | CORE LAYER (QUANTUM WELL + GUIDE LAYER) | 300 | 2.57 |
| 5 | N-TYPE | PHASE MODULATION LAYER (GaN/CAVITY, CAVITY FF = 15%) | 100 | 2.39 |
| 6 | N-TYPE | AlGaN CLADDING LAYER | ∞ | 2.54 |

Fig.45A

| WAVELENGTH | 405nm |
|---|---|
| n₁ | 2.57 |
| n₂ | 2.53 |
| n₃ | 2.39 |
| a' | 3.59 |
| nclad | 2.54 |

Fig.45B

| b | V₁ | FILM THICKNESS (nm) |
|---|---|---|
| 0.224 | 1.86 | 273 |
| 0.224 | 5.43 | 795 |

*Fig.47A*

| WAVELENGTH | 405nm |
|---|---|
| $n_4$ | 2.55 |
| $n_5$ | 2.53 |
| $n_6$ | 1.00 |
| a' | 40.8 |
| $n_{clad}$ | 2.54 |

*Fig.47B*

| b | $V_2$ | FILM THICKNESS (nm) |
|---|---|---|
| 0.33 | 2.51 | 445 |

Fig.61

| LAYER STRUCTURE | REFRACTIVE INDEX | FILM THICKNESS (nm) | DOPING CONCENTRATION ($cm^{-3}$) | Γ |
|---|---|---|---|---|
| p-GaAs CONTACT LAYER | — | 200 | Zn: $1\times10^{20}$ | — |
| p-(Al$_{0.7}$Ga$_{0.3}$)$_{0.5}$In$_{0.5}$P UPPER CLADDING LAYER | 3.21 | 5000 | Zn: $1\times10^{18}$ | 0.004 |
| Air/i-(Al$_x$Ga$_{1-x}$)$_{0.5}$In$_{0.5}$P (x~0.03) PHASE MODULATION LAYER (FFave = 15%) | 3.20 | 200 | — | 0.093 |
| i-(Al$_x$Ga$_{1-x}$)$_{0.5}$In$_{0.5}$P (x~0.03) PHASE MODULATION LAYER | 3.45 | 20 | — | 0.038 |
| i-(Al$_{0.7}$Ga$_{0.3}$)$_{0.5}$In$_{0.5}$P CARRIER BLOCKING LAYER | 3.21 | 20 | — | 0.049 |
| i-(Al$_x$Ga$_{1-x}$)$_{0.5}$In$_{0.5}$P (x~0.03) BARRIER LAYER | 3.45 | 50 | — | 0.180 |
| i-GaInP WELL LAYER | 3.50 | 10 | — | 0.044 |
| i-(Al$_x$Ga$_{1-x}$)$_{0.5}$In$_{0.5}$P (x~0.03) BARRIER LAYER | 3.45 | 10 | — | 0.045 |
| i-GaInP WELL LAYER | 3.50 | 10 | — | 0.046 |
| i-(Al$_x$Ga$_{1-x}$)$_{0.5}$In$_{0.5}$P (x~0.03) BARRIER LAYER | 3.45 | 10 | — | 0.046 |
| i-GaInP WELL LAYER | 3.50 | 10 | — | 0.045 |
| i-(Al$_x$Ga$_{1-x}$)$_{0.5}$In$_{0.5}$P (x~0.03) BARRIER LAYER | 3.45 | 60 | — | 0.219 |
| n-(Al$_{0.6}$Ga$_{0.4}$)$_{0.5}$In$_{0.5}$P LOWER CLADDING LAYER | 3.24 | 2000 | Si: $1\times10^{18}$ | 0.192 |
| n-GaAs BUFFER LAYER | — | — | Si: $3\times10^{17}$ | 0.000 |
| n-GaAs SEMICONDUCTOR SUBSTRATE | — | — | — | — |

SEMICONDUCTOR LIGHT-EMITTING DEVICE AND MANUFACTURING METHOD FOR THE SAME

TECHNICAL FIELD

The present invention relates to a semiconductor light-emitting device and a manufacturing method for the semiconductor light-emitting device.

BACKGROUND

A semiconductor light-emitting device described in International Publication No. WO 2014/136962 (Patent Document 1) includes an active layer, a pair of cladding layers sandwiching the active layer, and a phase modulation layer optically coupled to the active layer. The phase modulation layer includes a basic layer and a plurality of modified refractive index regions each having a refractive index different from the refractive index of the basic layer. In a case where a square lattice is set on the phase modulation layer, each of modified refractive index regions (main holes) is arranged so as to match the center point (lattice point) of the corresponding region (having a square shape) in the square lattice. An auxiliary modified refractive index region (auxiliary hole) is provided around the modified refractive index region, enabling light having a predetermined beam pattern to be emitted.

SUMMARY

The inventors found the following problems as a result of examinations on conventional semiconductor light-emitting devices. There is a semiconductor light-emitting device under study which outputs an arbitrary optical image by controlling a phase spectrum and an intensity spectrum of the light emitted from a plurality of two-dimensionally arranged light-emitting points. Structures of such a semiconductor light-emitting device include a structure including a lower cladding layer, an active layer, and an upper cladding layer provided on a semiconductor substrate, and including a phase modulation layer between the lower cladding layer and the active layer, or between the active layer and the upper cladding layer. The phase modulation layer is constituted with a basic layer and a plurality of modified refractive index regions each having a refractive index different from the refractive index of the basic layer. In a case where a virtual square lattice is set within a plane perpendicular to a thickness direction of the phase modulation layer, the gravity center position of the modified refractive index region allocated to each of the plurality of square regions constituting the square lattice deviates from the lattice point position of the square region allocated in accordance with an optical image to be generated. Such a semiconductor light-emitting device is referred to as a static-integrable phase modulating (S-iPM) laser and outputs a beam for forming an optical image of a two-dimensional arbitrary shape in a direction (normal direction) perpendicular to the main surface of the semiconductor substrate, or in a direction having a predetermined divergence angle with respect to the normal direction.

Unfortunately, however, when the inventors fabricated the above-described conventional semiconductor light-emitting device, it was found noise light having a mesh-formed dark portion superposed on a beam pattern corresponding to the optical image emitted from the device, degrading the quality of the optical image. FIG. 64A to FIG. 65B are images illustrating the state. FIGS. 64A and 65A illustrate designed optical images (original images), and FIGS. 64B and 65B illustrate actually measured beam patterns corresponding to FIGS. 64A and 65A, respectively. In these images, the center of each of the figures corresponds to a direction perpendicular to the main surface of the semiconductor substrate. In FIGS. 64B and 65B, each of the bright spots at the center indicates zero-order light, that is, light emitted in the direction perpendicular to the main surface of the semiconductor substrate, not to be used for forming the optical image. The light existing on the upper right and the lower left of the bright spot is the light (signal light) to be used for forming the optical image. Note that in order to form a standing wave on a layer surface of the phase modulation layer (surface parallel to the main surface of the semiconductor substrate) for oscillation, there is a need to combine the light waves traveling in opposite directions by 180° to each other. As a specific example, in the case of a square lattice, light waves traveling in four directions different from each other by 90° are combined to form a two-dimensional standing wave state. This leads to the presence of the light waves traveling in four directions different from each other by 90° along the layer surface in the phase modulation layer, with the light waves traveling in these four directions being scattered in each of the modified refractive index regions. This leads to very high probability of forming an optical image rotated by 180° in addition to the desired optical image. That is, even in a case where a designed optical image (original image) as illustrated in FIGS. 64A and 65A is given, a pair of beam patterns 180° rotationally symmetrical to each other is observed as illustrated in FIGS. 64B and 65B. Referring to FIGS. 64B and 65B, it can be seen that noise light having a mesh-formed dark portion superposed on the light (signal light) used for forming the optical image. Particularly, as illustrated in FIG. 64A, in a case where the designed optical image is bright as a whole, as illustrated in FIG. 65B, the superposition of the noise light having the mesh-formed dark portion becomes noticeable.

The present invention is intended to solve the above-described problem, and an object of the present invention is to provide a semiconductor light-emitting device having a structure for reducing noise light having a mesh-formed dark portion superposed on a beam pattern corresponding to an optical image, and a manufacturing method for the same.

In order to solve the above-described problem, a semiconductor light-emitting device according to the present embodiment includes a semiconductor substrate, and includes a first cladding layer, an active layer, a second cladding layer, and a contact layer sequentially provided on the semiconductor substrate, and further includes a phase modulation layer located between the first cladding layer and the active layer or between the active layer and the second cladding layer and constituted with a basic layer and a plurality of modified refractive index regions each having a refractive index different from the refractive index of the basic layer, and a manufacturing method according to the present embodiment is provided for manufacturing the semiconductor light-emitting device having such a structure. In particular, in the semiconductor light-emitting device and the manufacturing method for the same according to the present embodiment, in a case where a virtual square lattice is set within a plane perpendicular to a thickness direction of the phase modulation layer, the phase modulation layer is configured such that the modified refractive index region allocated in each of unit constituent regions constituting the square lattice (regions having square shapes) is arranged so as to allow the gravity center position of the modified refractive index region to be separated from the lattice point corresponding to the center of the unit constituent region, and so as to have a rotation angle about the lattice point in accordance with a desired optical image.

BRIEF DESCRIPTION OF THE DRAWINGS

FIG. 5 is a diagram for explaining a relationship between an optical image obtained as an output beam pattern of the laser device and the rotation angle in the phase modulation layer;

FIGS. 6A and 6B are diagrams illustrating points to be noted in obtaining the rotation angle from a result of Fourier transform on the optical image and determining the arrangement of the modified refractive index region;

FIG. 9 is a graph illustrating a state of mode generation in a case where the refractive index of the upper cladding layer is larger than the refractive index of the lower cladding layer;

FIGS. 13A to 13G illustrate examples of mirror-symmetrical shapes among the shapes of the modified refractive index regions within the X-Y plane;

FIGS. 14A to 14K illustrate examples of shapes not having rotational symmetry of 180° among the shapes of the modified refractive index region within the X-Y plane;

FIGS. 17A to 17K illustrate examples of the shape of the modified refractive index region within the X-Y plane according to the modification of the present embodiment;

FIG. 18 illustrates an example of the shape of the modified refractive index region within the X-Y plane;

FIG. 19 is a table illustrating a layer structure in a case where the laser device is formed of a GaAs-based compound semiconductor (emission wavelength 940 nm band);

FIG. 21 is a table illustrating a layer structure in a case where the laser device is formed of an InP-based compound semiconductor (emission wavelength 1300 nm band);

FIG. 23 is a table illustrating a layer structure in a case where the laser device is formed of a nitride-based compound semiconductor (emission wavelength 405 nm band);

FIGS. 26A and 26B illustrate a cross-sectional view and refractive index distribution for explaining a case where the waveguide structure is approximated by five-layer slab waveguides;

FIGS. 29A and 29B illustrate a cross-sectional view and refractive index distribution illustrating a three-layer slab structure related to an optical waveguide layer in the five-layer slab waveguide;

FIGS. 30A and 30B illustrate a cross-sectional view and refractive index distribution illustrating a three-layer slab structure with respect to a contact layer in a five-layer slab waveguide;

FIG. 32 is a table illustrating an example of a five-layer slab structure in a case where the laser device is formed of a GaAs-based compound semiconductor;

FIG. 33A is a table illustrating refractive indices $n_1$, $n_2$, and $n_3$, an asymmetric parameter a' and a refractive index $n_{clad}$ of the lower cladding layer used for the calculation, and FIG. 33B is a table illustrating a result of calculation of a lower limit value and an upper limit value;

FIG. 35A is a table illustrating refractive indices $n_4$, $n_5$, and $n_6$, the asymmetric parameter a' and the refractive index $n_{clad}$ of the lower cladding layer used for calculation, and FIG. 35B is a table illustrating a result of the calculation result of the upper limit value;

FIG. 38 is a table illustrating an example of a six-layer slab structure in a case where the laser device is formed of an InP-based compound semiconductor;

FIG. 39A is a table illustrating refractive indices $n_1$, $n_2$, and $n_3$, an asymmetric parameter a' and a refractive index $n_{clad}$ of the lower cladding layer used for the calculation, and FIG. 39B is a table illustrating a result of calculation of a lower limit value and an upper limit value;

FIG. 41A is a table illustrating refractive indices $n_4$, $n_5$, and $n_6$, the asymmetric parameter a' and the refractive index $n_{clad}$ of the lower cladding layer used for calculation, and FIG. 41B is a table illustrating a result of the calculation of the upper limit value;

FIG. 44 is a table illustrating an example of a six-layer slab structure in a case where the laser device is formed of a nitride-based compound semiconductor;

FIG. 45A is a table illustrating the refractive indices $n_1$, $n_2$, and $n_3$, the asymmetric parameter a' and the refractive index $n_{clad}$ of the lower cladding layer used for calculation, and FIG. 45B illustrates a result of calculation of the lower limit value and the upper limit value;

FIG. 47A is a table illustrating refractive indices $n_4$, $n_5$, and $n_6$, the asymmetric parameter a' and the refractive index $n_{clad}$ of the lower cladding layer used for calculation, and FIG. 47B is a table illustrating a result of the calculation of the upper limit value;

FIG. 61 is a table illustrating a specific layer structure of the laser device according to Example;

DETAILED DESCRIPTION

Description of Embodiment of Present Invention

First, embodiments of the present invention will be individually enumerated and described.

(1) A semiconductor light-emitting device according to the present embodiment is a device configured to output an optical image of an arbitrary shape in one or both of a normal direction of a main surface of a semiconductor substrate and an inclined direction having a predetermined inclination and a divergence angle with respect to the normal direction, and a manufacturing method for the semiconductor light-emitting device according to the present embodiment is used for manufacturing the device. In one aspect of the semiconductor light-emitting device and the manufacturing method for the same according to the present embodiment, the semiconductor light-emitting device includes a semiconductor substrate, a first cladding layer, an active layer, a second cladding layer, a contact layer, and a phase modulation layer. Specifically, the first cladding layer is provided on the semiconductor substrate, and the active layer is provided on the first cladding layer. The second cladding layer is provided on the active layer and has a refractive index equal to or less than a refractive index of the first cladding layer. The contact layer is provided on the second cladding layer. The phase modulation layer is provided between the first cladding layer and the active layer or between the active layer and the second cladding layer. The phase modulation layer is constituted with a basic layer having a predetermined refractive index and a plurality of first modified refractive index regions each having a refractive index different from that of the basic layer.

In particular, in one aspect of the semiconductor light-emitting device and the manufacturing method for the same according to the present embodiment, as a first precondition, a virtual square lattice each having a square shape, formed with M1 (integer of one or more)×N1 (integer of one or more) unit constituent regions R is set on a X-Y plane including an X-axis and a Y-axis orthogonal to each other and matching one surface of a phase modulation layer including a plurality of first modified refractive index regions, in an XYZ orthogonal coordinate system defined by a Z-axis that matches the normal direction and by the X-Y plane.

Figure 66:
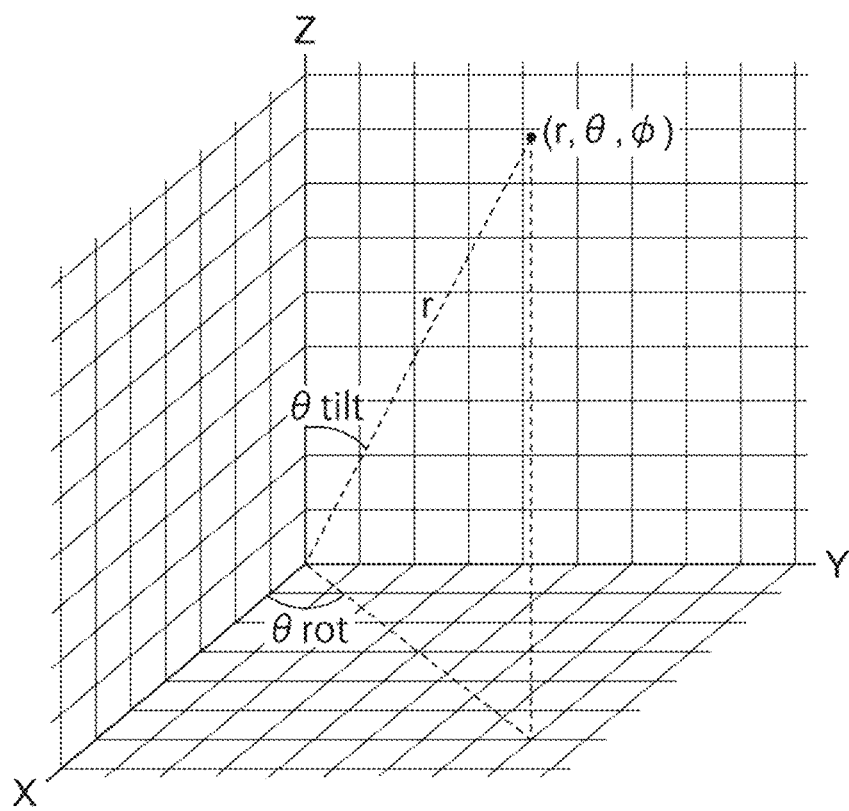
FIG. 66 is a diagram for explaining coordinate transformation from spherical coordinates (r, $\theta_{tilt}$, $\theta_{rot}$) to coordinates (x, y, z) in the XYZ orthogonal coordinate system.

As a second precondition, the coordinates (x, y, z) in the XYZ orthogonal coordinate system satisfy a relationship expressed by the following formulas (1) to (3) with respect to spherical coordinates (r, $\theta_{tilt}$, $\theta_{rot}$) defined by a radius vector length r, an inclination angle $\theta_{tilt}$ from the Z-axis, and a rotation angle θ from the X-axis specified on the X-Y plane, as illustrated in FIG. 66. Note that FIG. 66 is a diagram for explaining the coordinate transformation from the spherical coordinates (r, $\theta_{tilt}$, $\theta_{rot}$) to the coordinates (x, y, z) in the XYZ orthogonal coordinate system, and the coordinates (x, y, z), represent a designed optical image on a predetermined plane set in the XYZ orthogonal coordinate system as the real space. When a beam pattern corresponding to the optical image outputted from the semiconductor light-emitting device is a set of bright spots directed in a direction defined by the angles $\theta_{tilt}$ and $\theta_{rot}$, the angles $\theta_{tilt}$ and $\theta_{rot}$ are converted into a coordinate value $k_x$ on a Kx-axis corresponding to the X-axis, that is, a normalized wavenumber defined by the following formula (4) and into a coordinate value $k_y$ on a Ky-axis corresponding to the Y-axis and orthogonal to the Kx-axis, that is, a normalized wavenumber defined by the following formula (5). The normalized wavenumber represents a wavenumber normalized on the basis of the wavenumber corresponding to the lattice spacing of the virtual square lattice as 1.0. At this time, a specific wavenumber range including a beam pattern corresponding to the optical image is constituted with square-shaped M2 (integer of one or more)×N2 (integer of one or more) image regions FR in a wavenumber space defined by the Kx-axis and the Ky-axis. Note that the integer M2 does not need to match the integer M1. Similarly, the integer N2 does not need to match the integer N1. Moreover, the formulas (4) and (5) are disclosed in Y. Kurosaka et al., "Effects of non-lasing band in two-dimensional photonic-crystal lasers clarified using omnidirectional band structure," Opt. Express 20, 21773-21783 (2012).

$$x = r\sin\theta_{tilt}\cos\theta_{rot} \quad (1)$$

$$y = r\sin\theta_{tilt}\sin\theta_{rot} \quad (2)$$

$$z = r\cos\theta_{tilt} \quad (3)$$

$$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: lattice constant of the virtual square lattice
λ: oscillation wavelength of the semiconductor light-emitting device As a third precondition, a complex amplitude F (x, y) is given by the following formula (6) with j being an imaginary unit, the complex amplitude F (x, y) being obtained, in the wavenumber space, by performing two-dimensional inverse Fourier transform on an image region FR ($k_x$, $k_y$) specified individually by a coordinate component $k_x$ (integer of one or more and M2 or less) in the Kx-axis direction and a coordinate component $k_y$ (integer of one or more and N2 or less) in the Ky-axis direction so as to be transformed onto a unit constituent region R (x, y) on the X-Y plane, specified by a coordinate component x (integer of one or more and M1 or less) in the X-axis direction and a coordinate component y (integer of one or more and N1 or less) in the Y-axis direction. Moreover, when an amplitude term is A (x, y) and a phase term is P (x, y), the complex amplitude F (x, y) is defined by the following formula (7). Furthermore, as a fourth precondition, the unit constituent region R (x, y) is defined by an s-axis and a t-axis each being parallel to the X-axis and the Y-axis, respectively, and orthogonal to each other on a lattice point O (x, y) as a center of the unit constituent region R (x, y).

$$F(x, y) = \sum_{k_x=1}^{M2} \sum_{k_y=1}^{N2} FR(k_x, k_y) \exp[j2\pi(k_x x + k_y y)] \quad (6)$$

$$F(x, y) = A(x, y) \times \exp[jP(x, y)] \quad (7)$$

Under the above-described first to fourth preconditions, the phase modulation layer is configured to satisfy the following first and second conditions. The first condition is that corresponding any of the plurality of first modified refractive index regions is arranged with a gravity center G1 of the first modified refractive index region being away from the lattice point O (x, y) in the unit constituent region R (x, y). The second condition is that, in a state where a length r (x, y) of a line segment from the lattice point O (x, y) to the gravity center G1 of the corresponding first modified refractive index region is set to a common value in each of the M1×N1 unit constituent regions R, the corresponding first, modified refractive index region is arranged in the unit constituent region R (x, y) such that an angle φ (x, y) formed by the line segment connecting the lattice point O (x, y) with the gravity center G1 of the corresponding first modified refractive index region and the s-axis satisfies the following relationship.

φ(x, y)=C×P(x, y)+B
C: proportionality constant, for example 180°/π
B: arbitrary constant, for example zero.

As a result of studies, the inventors of the present invention have found that the noise light having the mesh-formed dark portion is caused by a higher-order mode in a stacking direction inside the semiconductor light-emitting device. The fundamental mode in the stacking direction is a mode having an intensity distribution in which one peak is present over the region including the active layer and sandwiched between the first cladding layer and the second cladding layer. The higher-order mode is a mode having an intensity distribution in which two or more peaks are present. Note that the peak of the intensity distribution in the fundamental mode is formed in the vicinity of the active layer, whereas the peak in the intensity distribution in the higher-order mode is formed also in the first cladding layer, the second cladding layer, the contact layer, or the like. While there are a guided mode and a leakage mode as modes in the stacking direction, solely the guided mode will be focused herein because the leakage mode is not stably present. Moreover, while the guided mode includes a TE mode in which an electric field vector exists in an in-plane direction of the layer and a TM mode in which an electric field vector exists in a direction perpendicular to the layer surface, solely the TE mode will be focused herein. The inventors have found that generation of such a higher-order mode is noticeable in a case where the refractive index of the second cladding layer (upper cladding layer) between the active layer and the contact layer is higher than the refractive index of the first cladding layer (lower cladding layer) between the active layer and the semiconductor substrate. Normally, the refractive index of each of the active layer and the contact layer is significantly larger than the refractive index of each of the cladding layers. Accordingly, in a case where the refractive index of the second cladding layer is larger than the refractive index of the first cladding layer, light is confined also in the second cladding layer, thereby forming the guided mode. This results in the generation of the higher-order modes.

In the semiconductor light-emitting device having the above-described structure, the refractive index of the second cladding layer is equal to or less than the refractive index of the first cladding layer. With this configuration, it is possible to suppress the generation of the high-order mode as described above, and to reduce the noise light having a mesh-formed dark portion superposed on the beam pattern.

In the phase modulation layer, it is preferable that a distance r between the center (lattice point) of each of the unit constituent regions constituting the virtual square lattice and the gravity center G1 of the corresponding modified refractive index region is a constant value over the entire phase modulation layer. With this arrangement, in a case where the phase distribution (distribution of the phase term P (x, y) in the complex amplitude F (x, y) allocated to the unit constituent region R (x, y)) in the entire phase modulation layer is as equalized as 0 to 2π (rad), the gravity center of the modified refractive index region matches on average the lattice point of the unit constituent region R in the square lattice. Therefore, effects of the two-dimensionally distributed Bragg diffraction in the above-described phase modulation layer comes close to the effects of the two-dimensionally distributed Bragg diffraction for a case where the modified refractive index region is arranged on each of lattice points of the square lattice, making it possible to facilitate formation of a standing wave and to expect reduction of threshold current for oscillation.

(2) In one aspect of a semiconductor light-emitting device and a manufacturing method for the same according to the present embodiment, it is preferable that each of the first cladding layer, the active layer, and the second cladding layer is a compound semiconductor layer formed by elements included in a group constituted with group III elements Ga, Al, and In and Group V element As. Moreover, the refractive index of the second cladding layer is preferably smaller than the refractive index of the first cladding layer. In this case, it is also possible to suppress the generation of the high-order mode as described above, and to reduce the noise light having a mesh-formed dark portion superposed on the beam pattern.

(3) In one aspect of a semiconductor light-emitting device and a manufacturing method for the same according to the present embodiment, it is preferable that a three-layer slab waveguide structure including an optical waveguide layer and two layers adjacent to the optical waveguide layer satisfies the following condition. Specifically, the optical waveguide layer in the three-layer slab waveguide structure is formed of the active layer in a case where the refractive index of the phase modulation layer is smaller than the refractive index of the first cladding layer. In contrast, the optical waveguide layer is formed with the phase modulation layer and the active layer in a case where the refractive index of the phase modulation layer is the refractive index of the first cladding layer, or more. In either case, the optical waveguide layer does not include the first and second cladding layers. In such a three-layer slab waveguide structure, when a normalized waveguide width $V_1$ in the TE mode is defined by the following formulas (8) and (9), and when an asymmetric parameter a' and a normalized propagation coefficient b are real numbers satisfying the following formulas (10) and (11), respectively, the normalized waveguide width $V_1$ and the normalized propagation coefficient b are set so as to be within a range having one solution to the normalized waveguide width $V_1$.

$$V_1 = \frac{1}{\sqrt{1-b}} \left[ \tan^{-1} \sqrt{\frac{b}{1-b}} + \tan^{-1} \sqrt{\frac{b+a'}{1-b}} + N_1 \pi \right] \quad (8)$$

$$b \geq \frac{n_{clad}^2 - n_2^2}{n_1^2 - n_2^2} \quad (9)$$

$$a' = \frac{n_2^2 - n_3^2}{n_1^2 - n_2^2} \quad (10)$$

$$b = \frac{n_{eff}^2 - n_2^2}{n_1^2 - n_2^2} \quad (11)$$

Herein, the TE mode is a propagation mode in a layer thickness direction, $n_1$ is a refractive index of the optical waveguide layer including the active layer, $n_2$ is a refractive index of the layer having a higher refractive index among the layers adjacent to the optical waveguide layer, $N_1$ is a mode order, $n_{clad}$ is a refractive index of the first cladding layer, $n_3$ is a refractive index of a layer having a lower refractive index among the layers adjacent to the optical waveguide layer, and $n_1$ is an equivalent refractive index of the TE mode in the three-layer slab waveguide structure.

According to the studies of the inventors, it was found that higher-order mode is generated also in the optical waveguide layer (high refractive index layer) including the active layer. It was also found that higher-order modes can be suppressed by appropriately controlling the thickness and the refractive index of the optical waveguide layer. That is, when the value of the normalized waveguide width $V_1$ of the optical waveguide layer satisfies the above-described conditions, it is possible to further suppress the generation of the higher-order mode, and to further reduce the noise light having the mesh-formed dark portion superposed on the beam pattern.

(4) In another aspect of the semiconductor light-emitting device and the manufacturing method for the same according to the present embodiment, another three-layer slab waveguide structure including the contact layer and two layers adjacent to the contact layer satisfies the following condition. That is, in such another three-layer slab waveguide structure, when a normalized waveguide width $V_2$ of the contact layer is defined by the following formulas (12) and (13), and when the asymmetric parameter a' and the normalized propagation coefficient b are real numbers satisfying the following formulas (14) and (15), respectively, the normalized waveguide width $V_2$ and the normalized propagation coefficient b are set so as to be within a range having no solution to the normalized waveguide width $V_2$.

$$V_2 = \frac{1}{\sqrt{1-b}} \left[ \tan^{-1} \sqrt{\frac{b}{1-b}} + \tan^{-1} \sqrt{\frac{b+a'}{1-b}} + N_2\pi \right] \quad (12)$$

$$b \geq \frac{n_{clad}^2 - n_5^2}{n_4^2 - n_5^2} \quad (13)$$

$$a' = \frac{n_5^2 - n_6^2}{n_4^2 - n_5^2} \quad (14)$$

$$b = \frac{n_{eff}^2 - n_5^2}{n_4^2 - n_5^2} \quad (15)$$

Herein, $n_4$ is a refractive index of the contact layer, $n_5$ is a refractive index of a layer having a higher refractive index among the layers adjacent to the contact layer, $n_6$ is a refractive index of a layer having a lower refractive index among the layers adjacent to the contact layer, $N_2$ is the mode order, and n is an equivalent refractive index of the TE mode in the other three-layer slab waveguide structure.

In this manner, by appropriately controlling the thickness of the contact layer, it is possible to suppress the generation of the guided mode caused by the contact layer and further suppress the generation of higher-order mode in the laser device.

(5) In one aspect of the semiconductor light-emitting device and the manufacturing method for the same according to the present embodiment, it is preferable that sizes of the plurality of first modified refractive index regions are equal to each other within the X-Y plane. As one aspect of the semiconductor light-emitting device and the manufacturing method for the same according to the present embodiment, it is preferable that lengths of the plurality of first modified refractive index regions in a Z direction orthogonal to the X-Y plane and matching the thickness direction of the phase modulation layer, are equal to each other. As a result of examination by the inventors in the case of forming the modified refractive index region by a dry etching step, for example, there is a case where the depths of holes (that is, the lengths of individual modified refractive index regions in the Z direction) are mutually different in a case where the sizes of the holes (that is, the sizes of individual modified refractive index regions within the X-Y plane) are mutually different. Variation in the lengths of the modified refractive index regions in the Z direction causes an unintended phase shift, leading to a decrease in reproducibility of the output beam pattern. Accordingly, the size of each of the modified refractive index regions within the X-Y plane is preferably a constant value over the entire phase modulation layer. For the similar reason, the length of each of the modified refractive index regions in the Z direction is preferably a constant value over the entire phase modulation layer.

(6) As one aspect of the semiconductor light-emitting device and the manufacturing method for the same according to the present embodiment, it is preferable that the shape of each of the plurality of first modified refractive index regions has mirror symmetry in the X-Y plane. Moreover, as one aspect of the semiconductor light-emitting device according to the present embodiment and the manufacturing method for the same, it is preferable that the shape of each of the plurality of first modified refractive index regions has no rotational symmetry of 180° in the X-Y plane. Furthermore, as one aspect of the semiconductor light-emitting device according to the present embodiment and the manufacturing method for the same, it is preferable that the plurality of first modified refractive index regions has an identical shape in the X-Y plane. As a result of examinations by the inventors, it was found that patterning can be performed with high accuracy in a case where the shape of each of the modified refractive index regions within the X-Y plane has mirror symmetry. Moreover, it was found that in a case where the shape of each of the modified refractive index regions within the X-Y plane has no rotational symmetry of 180°, the light output increases. Moreover, it was found that in a case where the shapes of the plurality of modified refractive index regions within the X-Y plane are identical to each other, it is possible to suppress the generation of the noise light and the zero-order light to be the noise within the beam pattern.

(7) As one aspect of the semiconductor light-emitting device and the manufacturing method for the same according to the present embodiment, the phase modulation layer may include a plurality of second modified refractive index regions other than the plurality of first modified refractive index regions, provided in each of the unit constituent regions constituting a square lattice. Specifically, the phase modulation layer further includes the plurality of second modified refractive index regions provided corresponding to each of the M1×N1 unit constituent regions R. At this time, the second modified refractive index region provided within the unit constituent region R (x, y) among the plurality of second modified refractive index regions preferably includes the lattice point O (x, y) of the unit constituent region R (x, y) and is preferably arranged within a region away from the corresponding first modified refractive index region, within the X-Y plane. Furthermore, as one aspect of the semiconductor light-emitting device according to the present embodiment and the manufacturing method for the same, it is preferable that each of the plurality of second modified refractive index regions is arranged such that a gravity center G2 of the second modified refractive index region matches the lattice point O (x, y) in the corresponding unit constituent region R (x, y). As a result of examination by the inventors, it was found that light leakage in the in-plane direction is suppressed and oscillation threshold current is reduced in a case where a region including another second modified refractive index region formed on the lattice point O (x, y) is provided in an outer peripheral portion of the region including the arrangement of the first modified refractive index region designed to obtain a desired beam pattern in the phase modulation layer.

(8) In one aspect of the semiconductor light-emitting device and the manufacturing method for the same according to the present embodiment, a beam for forming the optical image may be emitted from the second cladding layer side with respect to the active layer. With this configuration, it is possible to reduce light absorption in the semiconductor substrate and to increase a light output effect of the semiconductor light-emitting device. This configuration is effective particularly in the case of outputting an optical image in an infrared region.

As described above, each aspect listed in [Description of Embodiment of Present Invention] is applicable to all of the remaining aspects or to all combinations of these remaining aspects.

DETAILS OF EMBODIMENT OF PRESENT INVENTION

Specific examples of a semiconductor light-emitting device and a manufacturing method for the same according to the present invention will be described in detail below with reference to the accompanying drawings. It is to be understood that the present invention is not limited to these examples, but is to be indicated by the scope of the claims, and it is intended to include meanings equivalent to the claims and all modifications within the scope. The same reference signs are given to same components and duplicate descriptions will be omitted.

First Embodiment

Figure 1:
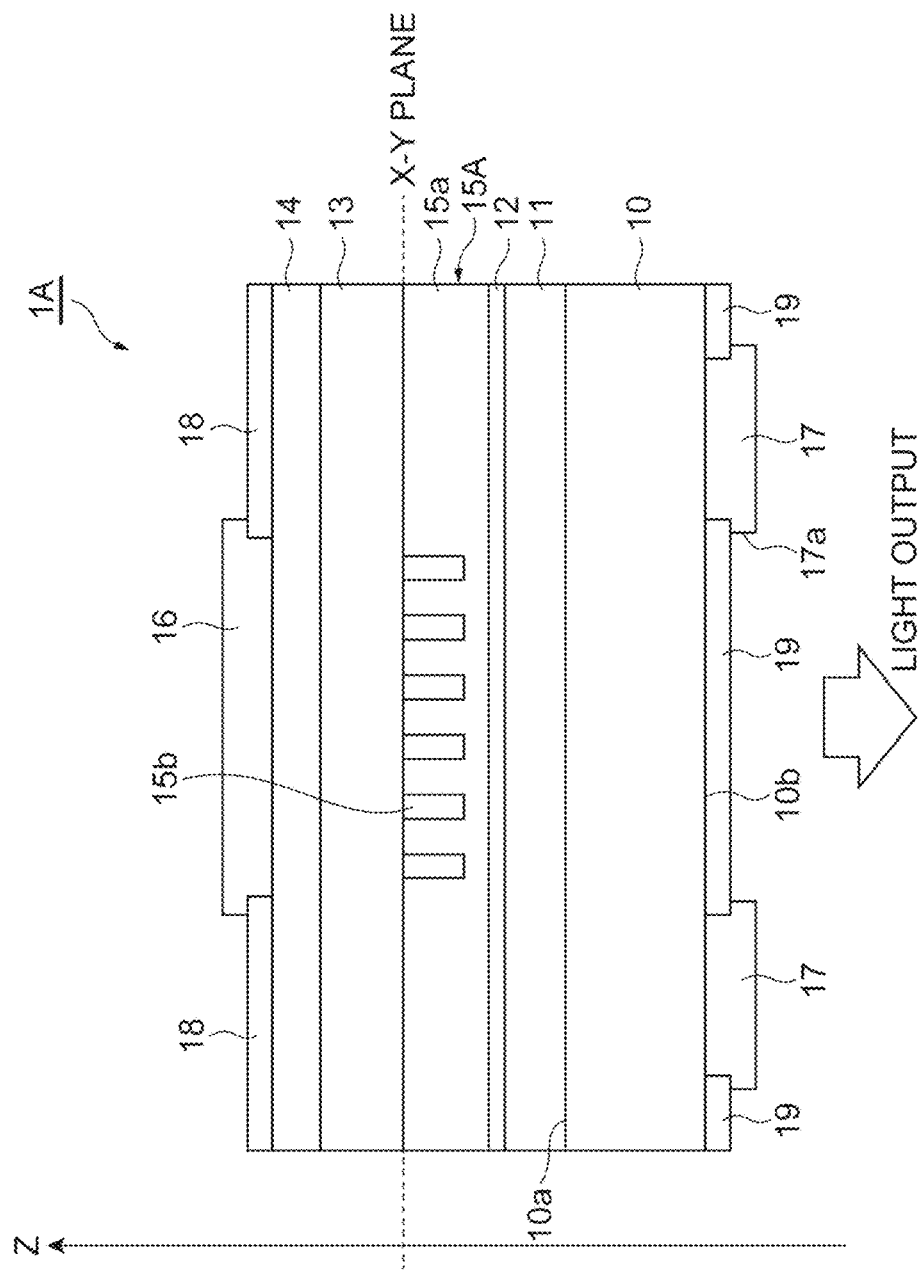
FIG. 1 is a diagram illustrating a configuration of a laser device as an example of a semiconductor light-emitting device according to a first embodiment.
Figure 2:
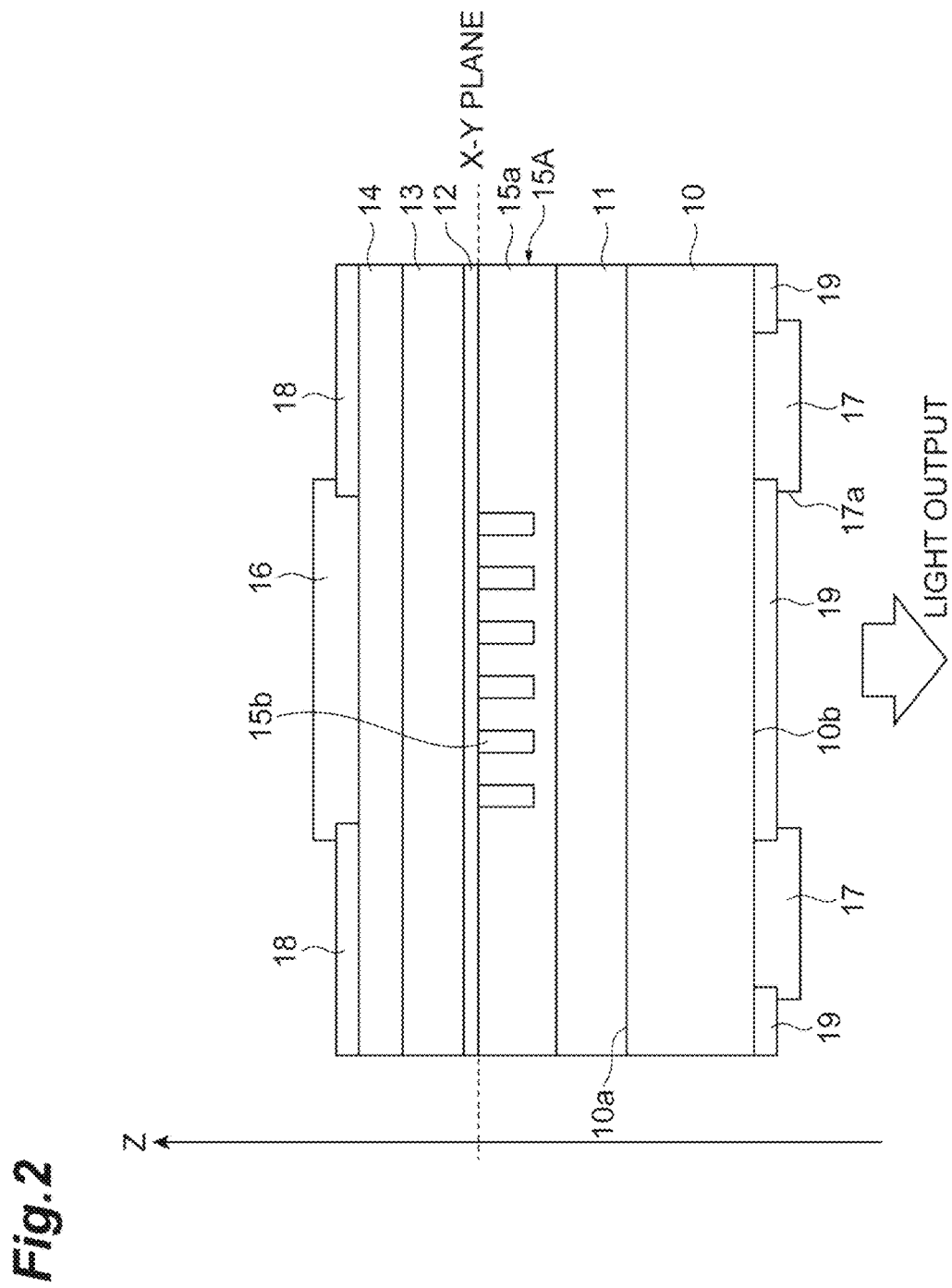
FIG. 2 is a diagram illustrating a configuration including a phase modulation layer provided between a lower cladding layer and an active layer as another example of the semiconductor light-emitting device according to the first embodiment.

FIG. 1 is a diagram illustrating a configuration of a laser device 1A as an example of a semiconductor light-emitting device according to a first embodiment. FIG. 2 is another example of the semiconductor light-emitting device according to the first embodiment. FIG. 1 defines an XYZ orthogonal coordinate system in which the thickness direction of the laser device 1A is determined as the Z-axis. The laser device 1A is a laser light source (light source that outputs a two-dimensional arbitrary-shaped optical image) that forms a standing wave within the X-Y plane and outputs a phase-controlled plane wave in the Z direction. As described below, the laser device 1A outputs a beam for forming the optical image in a direction (normal direction) perpendicular to a main surface 10a of a semiconductor substrate 10 and a direction having a predetermined divergence angle with respect to the normal direction.

The laser device 1A includes a lower cladding layer 11 (first cladding layer) provided on the semiconductor substrate 10, an active layer 12 provided on the lower cladding layer 11, an upper cladding layer 13 (second cladding layer) provided on the active layer 12, and a contact layer 14 provided on the upper cladding layer 13. The semiconductor substrate 10 and each of the layers 11 to 14 are formed with a compound semiconductor such as a GaAs-based semiconductor, an InP-based semiconductor, or a nitride-based semiconductor. The energy band gap of the lower cladding layer 11 and the energy band gap of the upper cladding layer 13 are larger than the energy band gap of the active layer 12.

The laser device 1A further includes a phase modulation layer 15A provided between the active layer 12 and the upper cladding layer 13. Note that it is allowable to provide an optical guide layer as necessary at least at one of a portion between the active layer 12 and the upper cladding layer 13 and a portion between the active layer 12 and the lower cladding layer 11. In a case where the optical guide layer is provided between the active layer 12 and the upper cladding layer 13, the phase modulation layer 15A is provided between the upper cladding layer 13 and the optical guide layer.

As illustrated in FIG. 2, the phase modulation layer 15A may be provided between the lower cladding layer 11 and the active layer 12. Furthermore, in a case where the optical guide layer is provided between the active layer 12 and the lower cladding layer 11, the phase modulation layer 15A is provided between the lower cladding layer 11 and the optical guide layer.

The relationship between the refractive index of the semiconductor substrate 10 and the refractive indices of the semiconductor layers provided on the semiconductor substrate 10 is as follows. The refractive indices of the lower cladding layer 11 and the upper cladding layer 13 are smaller than the refractive indices of the semiconductor substrate 10, the active layer 12, and the contact layer 14. Furthermore, in the present embodiment, the refractive index of the upper cladding layer 13 is equal to or smaller than the refractive index of the lower cladding layer 11. The refractive index of the phase modulation layer 15A may be larger or smaller than the refractive index of the lower cladding layer 11 (or the upper cladding layer 13).

Now, a preferable thickness of the optical waveguide layer including the active layer 12 will be described. As a premise, in a case where the refractive index of the phase modulation layer 15A is smaller than the refractive index of the lower cladding layer 11, the optical waveguide layer is determined to include solely the active layer 12 (optical waveguide layer does not include the lower cladding layer 11, the upper cladding layer 13, nor the phase modulation layer 15A), and it is regarded as a three-layer slab waveguide structure including such an optical waveguide layer and two layers, namely, upper and lower layers adjacent to the optical waveguide layer. In contrast, in a case where the refractive index of the phase modulation layer 15A is the refractive index of the lower cladding layer 11 or more, the optical waveguide layer is determined to include the phase modulation layer 15A and the active layer 12 (lower cladding layer 11 and the upper cladding layer 13 are not included), and it is regarded as a three-layer slab waveguide structure including such an optical waveguide layer and two layers, namely, upper and lower layers adjacent to the optical waveguide layer. Note that the guided mode in the layer thickness direction is the TE mode. At this time, the normalized waveguide width $V_1$ of the optical waveguide layer and the normalized propagation coefficient b of the TE mode are defined by the following formula (16).

$$V_1 = \frac{1}{\sqrt{1-b}} \left[ \tan^{-1} \sqrt{\frac{b}{1-b}} + \tan^{-1} \sqrt{\frac{b+a'}{1-b}} + N_1 \pi \right] \quad (16)$$

Note that in a case where the guided mode is formed in the optical waveguide layer (mode order is $N_1$), in order to avoid leakage of the guided mode to the semiconductor substrate 10 via the lower cladding layer 11, the equivalent refractive index of the TE mode needs to be higher than the refractive index of the lower cladding layer 11, and thus, the normalized propagation coefficient b needs to satisfy the following formula (17).

$$b \geq \frac{n_{clad}^2 - n_2^2}{n_1^2 - n_2^2} \quad (17)$$

At this time, in a case where the setting is within a range having solely one solution to the normalized waveguide width $V_1$ satisfying the above-described formulas (16) and (17), the mode of guiding the optical waveguide layer would be single. a' and b represent an asymmetric parameter and a normalized propagation coefficient in the three-layer slab waveguide, respectively, and are real numbers satisfying the following formulas (18) and (19), respectively. In the formulas (17) to (19), $n_{clad}$ is the refractive index of the lower cladding layer 11, $n_1$ is the refractive index of the optical waveguide layer including the active layer 12, $n_2$ is the refractive index of a layer having a higher refractive index among the layers adjacent to the optical waveguide layer, $n_3$ is a refractive index of a layer having a lower refractive index among the layers adjacent to the optical waveguide layer, and $n_{eff}$ is an equivalent refractive index of the TE mode with respect to the three-layer slab waveguide structure including the optical waveguide layer and two layers, namely, the upper and lower layers adjacent to the optical waveguide layer.

$$a' = \frac{n_2^2 - n_3^2}{n_1^2 - n_2^2} \quad (18)$$

$$b = \frac{n_{eff}^2 - n_2^2}{n_1^2 - n_2^2} \quad (19)$$

The normalized waveguide width $V_1$ of the optical waveguide layer is expressed by the following formula (20).

$$V_1 = k_0 n_1 d\sqrt{2\Delta} \quad (20)$$

Note that d is the thickness of the optical waveguide layer, and the wavenumber $k_0$ and the relative refractive index difference $\Delta$ in the vacuum are given by the following formulas (21) and (22), and $\lambda$ is the emission wavelength.

$$k_0 = 2\pi/\lambda \quad (21)$$

$$\Delta = \frac{n_1^2 - n_2^2}{2n_1^2} \quad (22)$$

A preferable thickness of the contact layer 14 is as follows. That is, in the three-layer slab waveguide structure including the contact layer 14 and the two layers, namely, the upper and lower layers adjacent to the contact layer 14, the normalized waveguide width $V_2$ and the normalized propagation coefficient b of the TE mode are defined by the following formula (23).

$$V_2 = \frac{1}{\sqrt{1-b}} \left[ \tan^{-1}\sqrt{\frac{b}{1-b}} + \tan^{-1}\sqrt{\frac{b+a'}{1-b}} + N_2\pi \right] \quad (23)$$

Note that in a case where a guided mode is formed in the contact layer (mode order is $N_2$), in order to avoid leakage of the guided mode to the semiconductor substrate 10 via the lower cladding layer 11, the equivalent refractive index of the TE mode needs to be higher than the refractive index of the first cladding layer, and thus, the normalized propagation coefficient b need to satisfy the following formula (24).

$$b \geq \frac{n_{clad}^2 - n_5^2}{n_4^2 - n_5^2} \quad (24)$$

At this time, in a case where the setting is within a range having no solution to the normalized waveguide width $V_2$ satisfying the above-described formulas (23) and (24), there would be no mode, including the fundamental mode, for guiding the contact layer 14.

a' and b represent an asymmetric parameter and a normalized propagation coefficient in the three-layer slab waveguide, respectively, and are real numbers satisfying the following formulas (25) and (26), respectively. In the formulas (25) and (26), $n_4$ is the refractive index of the contact layer 14, $n_5$ is the refractive index of the layer having a higher refractive index among the layers adjacent to the contact layer 14, $n_6$ is the refractive index of the layer having a lower refractive index among the layers adjacent to the contact layer 14, and $n_{eff}$ is the equivalent refractive index of the TE mode with respect to the three-layer slab waveguide structure formed with the contact layer 14 and two layers, namely, upper and lower layers adjacent to the contact layer 14.

$$a' = \frac{n_5^2 - n_6^2}{n_4^2 - n_5^2} \quad (25)$$

$$b = \frac{n_{eff}^2 - n_5^2}{n_4^2 - n_5^2} \quad (26)$$

The normalized waveguide width $V_2$ of the contact layer 14 is expressed by the following formula (27).

$$V_2 = k_0 n_4 d\sqrt{2\Delta} \quad (27)$$

Note that d is the thickness of the contact layer, and the wavenumber $k_0$ and the relative refractive index difference $\Delta$ in the vacuum are given by the following formulas (28) and (29), and $\lambda$ is the emission wavelength.

$$k_0 = 2\pi/\lambda \quad (28)$$

$$\Delta = \frac{n_4^2 - n_5^2}{2n_4^2} \quad (29)$$

The phase modulation layer 15A includes a basic layer 15a formed with a first refractive index medium and includes a plurality of modified refractive index regions 15b (first modified refractive index region) formed with a second refractive index medium having a refractive index different from the refractive index of the first refractive index medium, and present within the basic layer 15a. The plurality of modified refractive index regions 15b include a substantially periodic structure. When the effective refractive index of the phase modulation layer 15A is n, the wavelength $\lambda_0$ (=a×n, a is the lattice spacing) selected by the phase modulation layer 15A is included within the emission wavelength range of the active layer 12. The phase modulation layer (diffraction grating layer) 15 can select a wavelength $\lambda_0$ of the emission wavelength of the active layer 12, and can output the light of the selected wavelength to the outside.

The laser device 1A further includes an electrode 16 provided on the contact layer 14 and an electrode 17 provided on a back surface 10b of the semiconductor substrate 10. The electrode 16 is in ohmic contact with the contact layer 14, while the electrode 17 is in ohmic contact with the semiconductor substrate 10. Furthermore, the electrode 17 includes an opening 17a. Portions other than the electrode 16 on the contact layer 14 are covered with a protective film 18. Note that the contact layer 14 not in contact with the electrode 16 may be removed. Portions (including the inside of the opening 17a) of the back surface 10b of the semiconductor substrate 10 other than the electrode 17 are covered with an antireflection film 19. The antireflection film 19 in a region other than the opening 17a may be removed.

When a driving current is supplied between the electrode 16 and the electrode 17, recombination of electrons and holes occurs in the active layer 12 (light emission). The electrons and holes contributing to the light emission and the generated light are efficiently confined between the lower cladding layer 11 and the upper cladding layer 13.

The laser light emitted from the active layer 12 enters the inside of the phase modulation layer 15A and forms a predetermined mode corresponding to the lattice structure inside the phase modulation layer 15A. The laser light scattered and emitted in the phase modulation layer 15A is reflected on the electrode 16 and is then, emitted from the back surface 10b to the outside through the opening 17a. At this time, the zero-order light of the laser light is emitted in a direction perpendicular to the main surface 10a. In contrast, the signal light of the laser light is emitted in a direction perpendicular to the main surface 10a (normal direction) and in a direction having a predetermined divergence angle with respect to the normal direction. The light that forms a desired optical image is the signal light, and the zero-order light is not used in the present embodiment.

For example, the semiconductor substrate 10 is a GaAs substrate, while each of the lower cladding layer 11, the active layer 12, the phase modulation layer 15A, the upper cladding layer 13, and the contact layer 14 is a compound semiconductor layer formed by elements included in a group constituted with group III elements Ga, Al, and In and Group V element As. As specific examples, the lower cladding layer 11 is an AlGaAs layer, the active layer 12 has a multiple quantum well structure (barrier layer: AlGaAs/well layer: InGaAs), the basic layer 15a of the phase modulation layer 15A is GaAs, the modified refractive index region 15b is a void space, the upper cladding layer 13 is an AlGaAs layer, and the contact layer 14 is a GaAs layer.

As another example, the semiconductor substrate 10 is an InP substrate, while each of the lower cladding layer 11, the active layer 12, the phase modulation layer 15A, the upper cladding layer 13, and the contact layer 14 is formed with a compound semiconductor that is not formed solely with elements included in a group constituted with Group III elements Ga, Al, and In and a group V element As, that is, formed with, for example, an InP-based compound semiconductor. As specific examples, the lower cladding layer 11 is an InP layer, the active layer 12 has a multiple quantum well structure (barrier layer: GaInAsP/well layer: GaInAsP), the basic layer 15a of the phase modulation layer 15A is GaInAsP, the modified refractive index region 15b is a void space, the upper cladding layer 13 is an InP layer, and the contact layer 14 is a GaInAsP layer.

As still another example, the semiconductor substrate 10 is an GaN substrate, while each of the lower cladding layer 11, active layer 12, the phase modulation layer 15A, the upper cladding layer 13, and the contact layer 14 is formed with a compound semiconductor layer that is not formed solely with elements included in a group constituted with Group III elements Ga, Al, and In and a group V element As, that is, formed with, for example, a nitride-based compound semiconductor. As specific examples, the lower cladding layer 11 is an AlGaN layer, the active layer 12 has a multiple quantum well structure (barrier layer: InGaN/well layer: InGaN), the basic layer 15a of the phase modulation layer 15A is GaN, The modified refractive index region 15b is a void space, the upper cladding layer 13 is an AlGaN layer, and the contact layer 14 is a GaN layer.

The lower cladding layer 11 is provided with the same conductivity type as that of the semiconductor substrate 10, and the upper cladding layer 13 and the contact layer 14 are provided with a conductivity type opposite to that of the semiconductor substrate 10. In one example, the semiconductor substrate 10 and the lower cladding layer 11 are n-type and upper cladding layer 13 and contact layer 14 are p-type. In a case where the phase modulation layer 15A is provided between the active layer 12 and the lower cladding layer 11, the phase modulation layer 15A has the same conductivity type as that of the semiconductor substrate 10. In contrast, in a case where the phase modulation layer 15A is provided between the active layer 12 and the upper cladding layer 13, the phase modulation layer 15A has a conductivity type opposite to that of the semiconductor substrate 10. The impurity concentration is, for example, $1\times10^{17}/cm^3$ to $1\times10^{21}/cm^3$.

While in the above-described structure, the modified refractive index region 15b is a void space, the modified refractive index region 15b may be formed by embedding a semiconductor having a refractive index different from that of the basic layer 15a in the void space. In that case, for example, the void space of the basic layer 15a may be formed by etching. Semiconductors may be embedded in the void space using metal organic chemical vapor deposition, sputtering or epitaxy. Moreover, after the modified refractive index region 15b is formed by embedding a semiconductor in the void space of the basic layer 15a, the semiconductor identical to the modified refractive index region 15b may be further deposited thereon. In a case where the modified refractive index region 15b is a void space, an inert gas such as argon, nitrogen, or hydrogen or air may be enclosed in the void space.

The antireflection film 19 is formed of a dielectric monolayer film such as silicon nitride (for example, SiN), silicon oxide (for example, $SiO_2$), or a dielectric multilayer film. As examples the dielectric multilayer film, it is possible to apply a film on which two or more types of dielectric layers selected from the group of dielectric layers such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$) are stacked. For example, a film having a thickness of $\lambda/4$ is stacked with an optical film thickness for light of wavelength $\lambda$. The protective film 18 is an insulating film such as silicon nitride (for example, SiN) and silicon oxide (for example, $SiO_2$).

Figure 3:
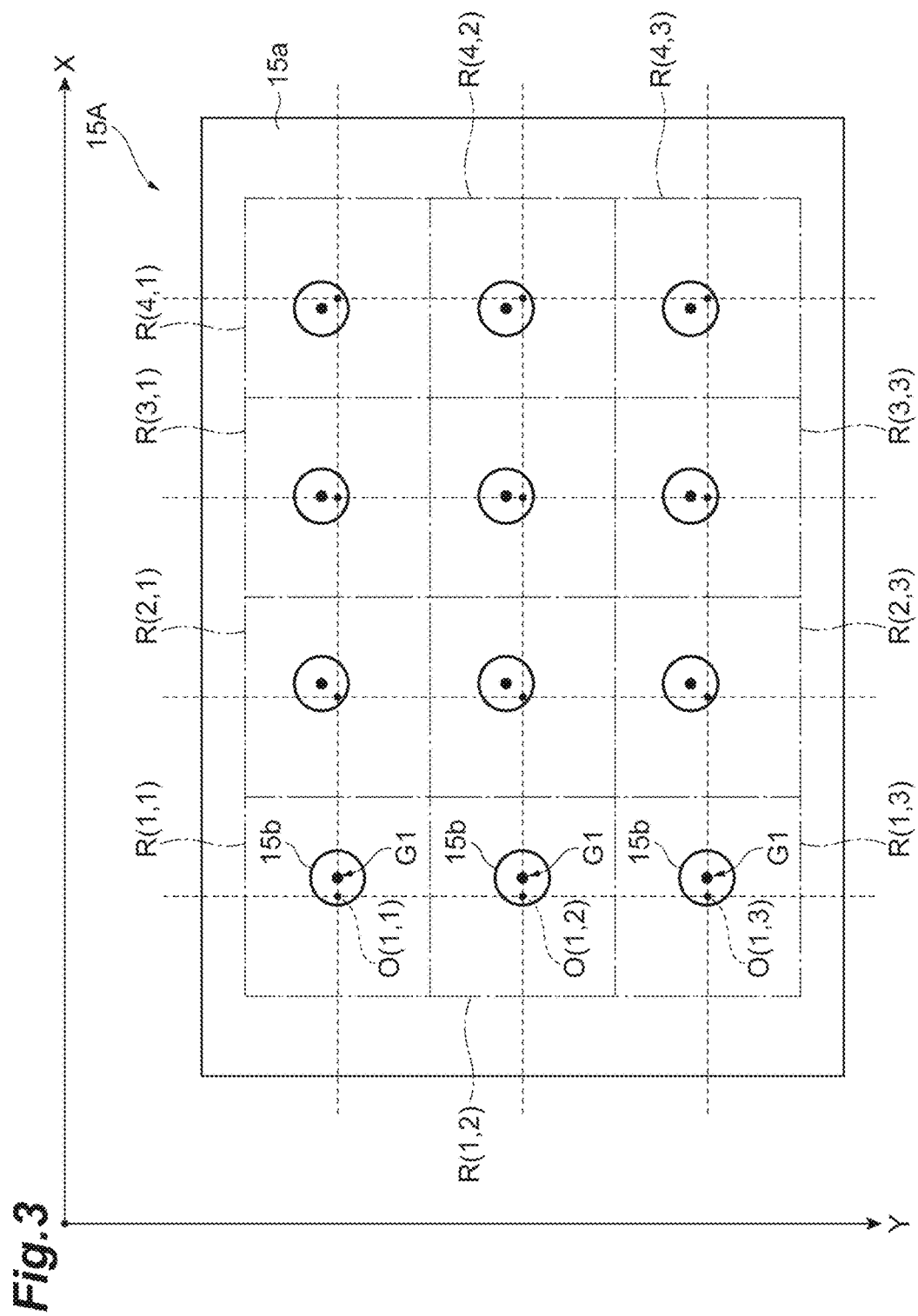
FIG. 3 is a plan view of the phase modulation layer.

FIG. 3 is a plan view of the phase modulation layer 15A. The phase modulation layer 15A includes the basic layer 15a formed with a first refractive index medium and includes the plurality of modified refractive index regions 15b formed with a second refractive index medium having a refractive index different from the refractive index of the first refractive index medium. A virtual square lattice within the X-Y plane is set in the phase modulation layer 15A. One side of the square lattice is parallel to the X-axis and the other side is parallel to the Y-axis. At this time, a square-shaped unit constituent region R centered on a lattice point O of the square lattice can be set two-dimensionally over a plurality of rows along the X-axis and a plurality of rows along the Y-axis. The plurality of modified refractive index regions 15b is provided, one for each of the unit constituent regions R. An exemplary plane shape of the modified refractive index region 15b is circular. In each of the unit constituent regions R, a gravity center G1 of the modified refractive index region 15b is arranged away from the closest lattice point O. Specifically, the X-Y plane is a plane orthogonal to the thickness direction (Z-axis) of the laser device 1A illustrated in FIGS. 1 and 2, and corresponds to one side of the phase modulation layer 15A including the modified refractive index region 15b. Each of the unit constituent regions R constituting the square lattice is specified by a coordinate component x (integer of one or more) in the X-axis direction and a coordinate component y (integer of one or more) in the Y-axis direction, so as to be represented as the unit constituent region R (x, y). At this time, the center of the unit constituent region R (x, y), that is, the lattice point is represented by O (x, y).

Figure 4:
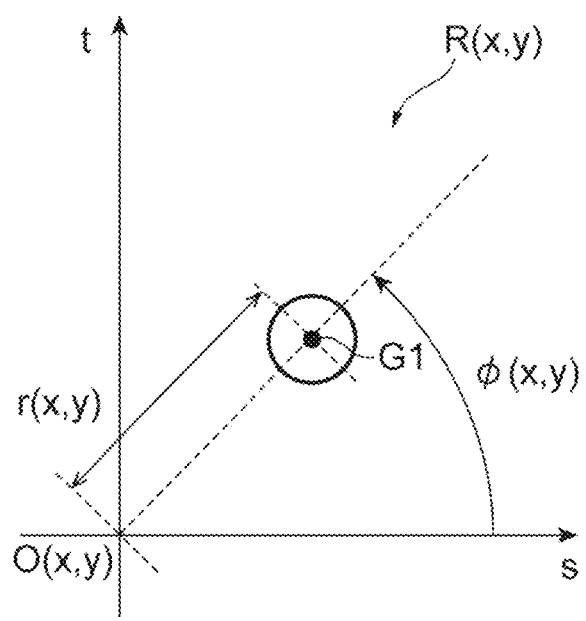
FIG. 4 is a diagram illustrating a positional relationship of a modified refractive index region in the phase modulation layer.

As illustrated in FIG. 4, the unit constituent region R (x, y) constituting the square lattice is defined by an s-axis and a t-axis orthogonal to each other at the lattice point O (x, y). Note that the s-axis is an axis parallel to the X-axis and the t-axis is an axis parallel to the Y-axis. On an s-t plane defining the unit constituent region R (x, y) in this manner, an angle formed by a direction from the lattice point O (x, y) to the gravity center G1 and the s-axis is given by φ (x, y). In a case where the rotation angle φ (x, y) is 0°, the direction of the vector connecting the lattice point O (x, y) with the gravity center G1 matches the positive direction of the s-axis. Moreover, the length of the vector connecting the lattice point O (x, y) with the gravity center G1 is given by r (x, y). As an example, r (x, y) is constant (over the entire phase modulation layer 15A) in the entire unit constituent region.

As illustrated in FIG. 3, in the phase modulation layer 15A, the rotation angle φ (x, y) of the gravity center G1 of the modified refractive index region 15b around the lattice point O (x, y) is set independently for each of the unit constituent regions R in accordance with a desired optical image. The rotation angle θ ($x, y$) has a specific value in the unit constituent region R (x, y), but it is not necessarily expressed by a specific function. That is, the rotation angle φ (x, y) is determined from a phase term of a complex amplitude obtained by transforming the desired optical image onto the wavenumber space and performing two-dimensional inverse Fourier transform on a fixed wavenumber range of the wavenumber space. When calculating complex amplitude distribution (complex amplitude of each of the unit constituent regions R) from the desired optical image, the reproducibility of the beam pattern is enhanced by applying an iterative algorithm such as the Gerchberg-Saxton (GS) method, which is generally used at hologram generation calculation.

FIG. 5 is a diagram for explaining the relationship between an optical image corresponding to the beam pattern outputted from the laser device 1A and distribution of the rotation angle φ (x, y) in the phase modulation layer 15A. A specific target to be examined is a Kx-Ky plane obtained by transforming a plane (an installation surface of a designed optical image expressed by coordinates (x, y, z) in the XYZ orthogonal coordinate system) on which an optical image is formed by a beam emitted from the laser device 1A, onto the wavenumber space. A Kx-axis and a Ky-axis defining the Kx-Ky plane are orthogonal to each other, and each of the Kx-axis and the Ky-axis is associated, by the above-described formulas (1) to (5), with angles with respect to a normal when the beam emission direction is varied from the normal direction of the main surface 10a of the semiconductor substrate 10 toward the main surface 10a. On this Kx-Ky plane, a specific region including the beam pattern corresponding to the optical image is to be constituted by square-shaped M2 (integer of one or more)×N2 (integer of one or more) image regions FR. Moreover, the virtual square lattice set on the X-Y plane on the phase modulation layer 15A is to be constituted with M1 (integer of one or more)× N1 (integer of one or more) unit constituent regions R. Note that the integer M2 does not need to match the integer M1. Similarly, the integer N2 does not need to match the integer N1. At this time, a complex amplitude F (x, y) on the unit constituent region R (x, y) is given by the following formula (30) with j being an imaginary unit. The complex amplitude F (x, y) is obtained by performing two-dimensional inverse Fourier transform on each of image regions FR ($k_x$, $k_y$) on the Kx-Ky plane, specified individually by a coordinate component $k_x$ (integer of one or more and M2 or less) in the Kx-axis direction and a coordinate component $k_y$ (integer of one or more and N2 or less) in the Ky-axis direction so as to be transformed onto a unit constituent region R (x, y) specified by a coordinate component x (integer of one or more and M1 or less) in the X-axis direction and a coordinate component y (integer of one or more and N1 or less) in the Y-axis direction.

$$F(x, y) = \sum_{k_x=1}^{M2} \sum_{k_y=1}^{N2} FR(k_x, k_y) \exp[j2\pi(k_x x + k_y y)] \quad (30)$$

When the amplitude term is A (x, y) and the phase term is P (x, y) in the unit constituent region R (x, y), the complex amplitude F (x, y) is defined by the following formula (31).

$$F(x,y)=A(x,y)\times\exp[jP(x,y)] \quad (31)$$

As illustrated in FIG. 5, in the range of the coordinate components x=1 to M1 and y=1 to N1, distribution of the amplitude term A (x, y) at the complex amplitude F (x, y) of the unit constituent region R (x, y) corresponds to intensity distribution on the X-Y plane. Moreover, in the range of x=1 to M1 and y=1 to N1, distribution of the phase term P (x, y) at the complex amplitude F (x, y) of the unit constituent region R (x, y) corresponds to the phase distribution on the X-Y plane. The rotation angle φ (x, y) in the unit constituent region R (x, y) is obtained from P (x, y) as described below, and in the range of the coordinate components x=1 to M1 and y=1 to N1, distribution of the rotation angle φ (x, y) of the unit constituent region R (x, y) corresponds to the rotation angle distribution on the X-Y plane.

Note that a center Q of the output beam pattern on the Kx-Ky plane is located on an axis perpendicular to the main surface 10a of the semiconductor substrate 10, and FIG. 5 illustrates four quadrants with the center Q as the origin. While FIG. 5 illustrates an exemplary case where optical images are obtained in the first quadrant and the third quadrant, it is also possible to obtain images in the second quadrant and the fourth quadrant, or in all the quadrants. In the present embodiment, an optical image point-symmetrical with respect to the origin is obtained as illustrated in FIG. 5. FIG. 5 illustrates an exemplary case of obtaining a character "A" is in the third quadrant and a pattern of the 180° rotated character "A" in the first quadrant. Note that in the case of a rotationally symmetric optical image (for example, a cross, a circle, a double circle), the image is observed as one optical image as a result of overlapping.

The beam pattern (optical image) outputted from the laser device 1A is an optical image corresponding to a designed optical image (original image) to be represented by at least one of a spot, a line, a cross, a line drawing, a lattice pattern, a photograph, a stripe pattern, computer graphics (CG), and a text. In order to obtain a desired optical image, the rotation angle φ (x, y) of the modified refractive index region 15b in the unit constituent region R (x, y) is determined by the following procedure.

As described above, the gravity center G1 of the modified refractive index region 15b is arranged to be away from the lattice point O (x, y) by r (x, y) in the unit constituent region R (x, y). At this time, the modified refractive index region 15b is arranged in the unit constituent region R (x, y) such that the rotation angle φ (x, y) satisfies the following relationship.

$$\varphi(x,y)=C\times P(x,y)+B$$

C: proportionality constant, for example 180°/π
B: arbitrary constant, for example, zero Note that each of the proportionality constant C and the arbitrary constant B is an identical value for all the unit constituent regions R.

That is, in a case where it is desired to obtain a desired optical image, it is sufficient to perform two-dimensional inverse Fourier transform on an optical image formed on the Kx-Ky plane projected on the wavenumber space so as to be transformed onto the unit constituent region R (x, y) on the X-Y plane on the phase modulation layer 15A, and to give the rotation angle φ (x, y) corresponding to the phase term P (x, y) of the complex amplitude F (x, y) to the modified refractive index region 15b arranged within the unit constituent region R (x, y). Note that a far field pattern after the two-dimensional inverse Fourier transformation of the laser beam may have various shapes such as a single or a plurality of spot shapes, annular shapes, linear shapes, character shapes, double circular ring shapes, and Lagerre Gaussian beam shapes. Since the beam pattern is represented by wavenumber information in the wavenumber space (on the Kx-Ky plane), in the case of a bitmap image, or the like, where the target beam pattern is represented by two-dimensional position information, it is sufficient to perform two-dimensional inverse Fourier transformation after the information is converted to wavenumber information.

As a method for obtaining the intensity distribution and the phase distribution from the complex amplitude distribution on the X-Y plane obtained by the two-dimensional inverse Fourier transform, for example, an abs function of MathWorks' numerical analysis software "MATLAB" is applicable for calculation of the intensity distribution (distribution of the amplitude term A (x, y) on the X-Y plane), and an angle function of "MATLAB" is applicable for calculation of the phase distribution (distribution of the phase terms P (x, y) on the X-Y plane).

In a case where the rotation angle distribution (distribution of the rotation angle φ (x, y) on the X-Y plane) is obtained from the result of two-dimensional inverse Fourier transformation on the optical image and where arrangement of the modified refractive index region 15b in each of the unit constituent regions R is determined, there are points to be noted in calculation using general discrete two-dimensional inverse Fourier transform or a fast two-dimensional inverse Fourier transform as described below. When an optical image before undergoing two-dimensional inverse Fourier transformation (designed optical image on a predetermined plane represented by coordinates (x, y, z) in the XYZ orthogonal coordinate system) is divided into four quadrants A1, A2, A3, and A4 as the original image illustrated in FIG. 6A, the beam pattern illustrated in FIG. 6B is obtained. Specifically, a pattern in which the pattern obtained by rotating the first quadrant in FIG. 6A by 1800 and the pattern in the third quadrant in FIG. 6A superposed on each other appear in the first quadrant of the beam pattern in FIG. 6B. A pattern in which the pattern obtained by rotating the second quadrant in FIG. 6A by 180° and the pattern in the fourth quadrant in FIG. 6A superposed on each other appear in the second quadrant of the beam pattern in FIG. 6B. A pattern in which the pattern obtained by rotating the third quadrant in FIG. 6A by 180° and the pattern in the first quadrant in FIG. 6A superposed on each other appear in the third quadrant of the beam pattern in FIG. 6B. A pattern in which the pattern obtained by rotating the fourth quadrant in FIG. 6A by 180° and the pattern in the second quadrant in FIG. 6A superposed on each other appear in the fourth quadrant of the beam pattern in FIG. 6B.

Accordingly, in a case where a pattern having a value solely in the first quadrant is used as the optical image (original optical image) before two-dimensional inverse Fourier transform, a first quadrant pattern of the original optical image appears in the third quadrant of the obtained beam pattern, while 180° rotated first quadrant pattern of the original optical image appears in the first quadrant of the obtained beam pattern.

Effects obtained by the laser device 1A according to the present embodiment described above will be described. As described above, there may be a case where noise light having a mesh-formed dark portion is superposed on a beam pattern emitted from a laser device having a phase modulation layer. The quality of the optical image is degraded by the noise light having the mesh-formed dark portion.

Figure 7:
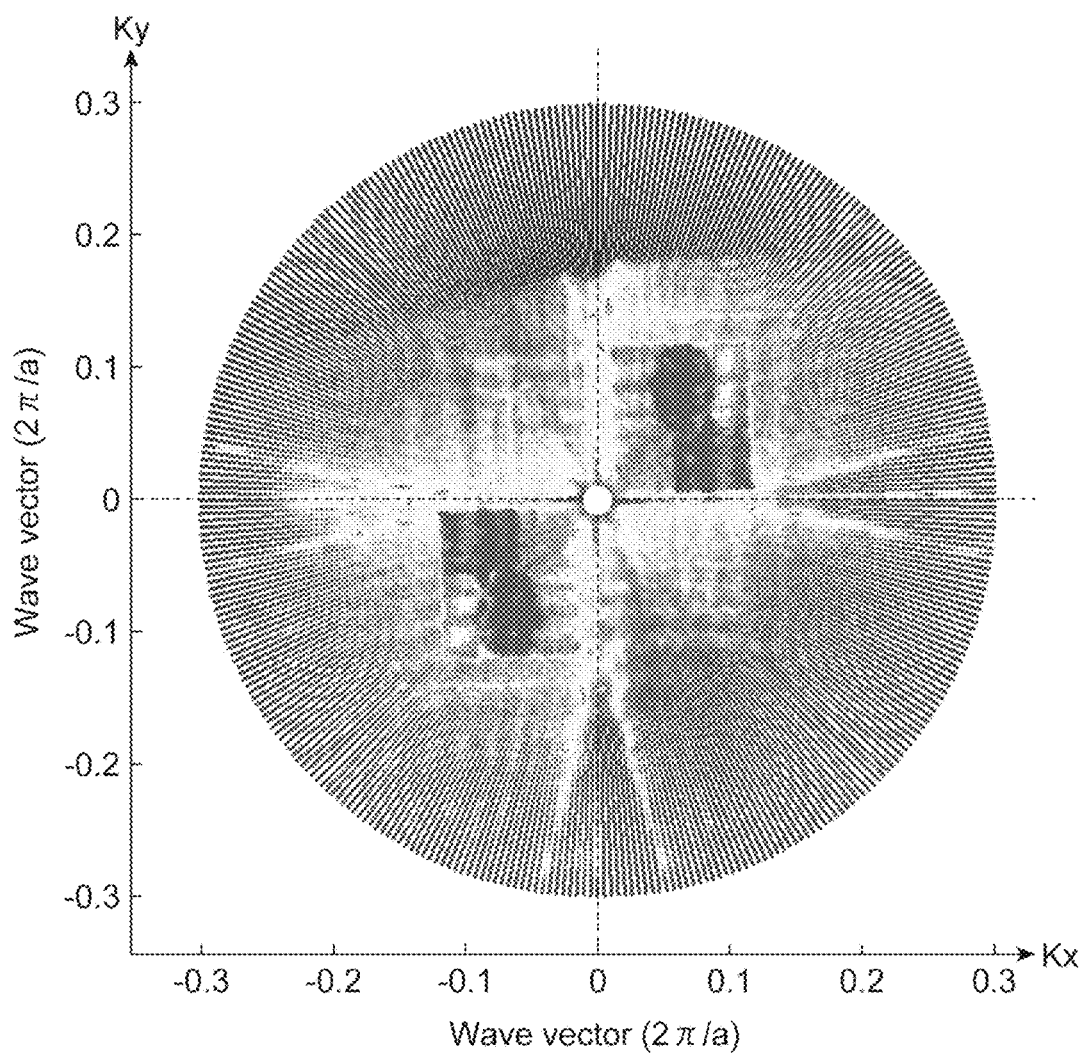
FIG. 7 is a plot of spatial intensity distribution at a wavelength in the vicinity of an oscillation wavelength.

In order to examine the cause of generation of the noise light having such a mesh-formed dark portion, the inventors examined spectral characteristics of the beam pattern by spectroscopic measurements in all circumferential directions after laser oscillation. As illustrated in FIG. 7, when the spatial intensity distribution at a wavelength in the vicinity of the oscillation wavelength is plotted by the shade of color, the intensity distribution corresponding to the actually measured beam pattern is obtained. Specifically, the intensity distribution corresponding to the actually measured beam pattern is distribution of the amplitude term A of the complex amplitude obtained by performing two-dimensional inverse Fourier transform on an image region on the Kx-Ky plane in the wavenumber space represented by the angle information to be transformed onto each of the unit constituent regions on the X-Y plane on the phase modulation layer. In FIG. 7, the horizontal axis is the X-axis coordinate and the vertical axis is the Y-axis coordinate. The center of the graph is located on an axis perpendicular to the substrate main surface of the laser device. Furthermore, as a result of comparison with the spatial intensity distribution of different wavelengths, it was found that the noise light having the mesh-formed dark portion originated from overlapping bands shifted to the shorter wavelength side.

Figure 8B:
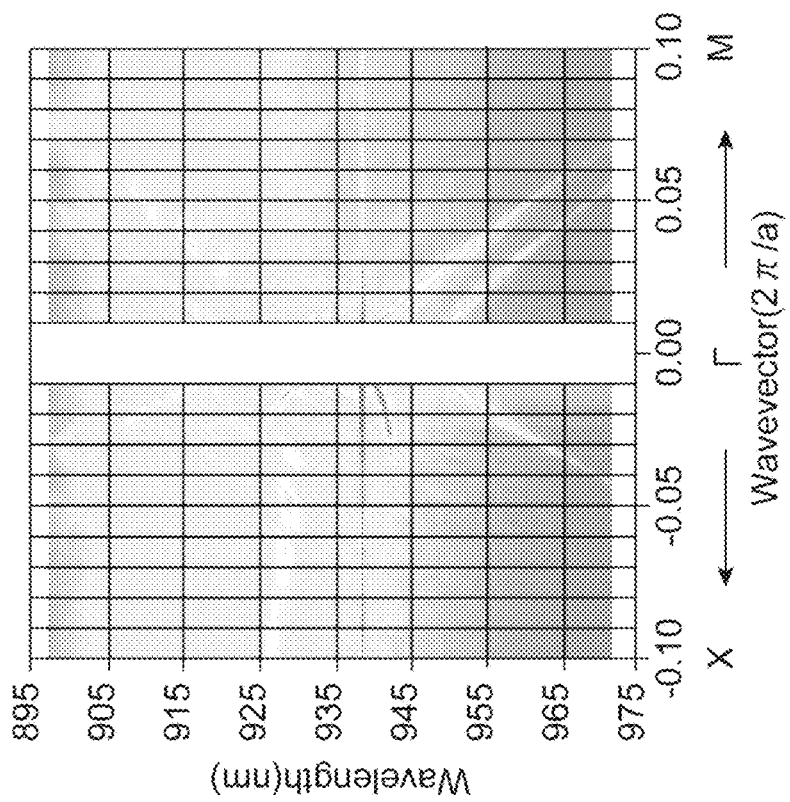
FIGS. 8A and 8B are plots (band diagram) of the spatial intensity distribution with the wavelength on the vertical axis.
Figure 8A:
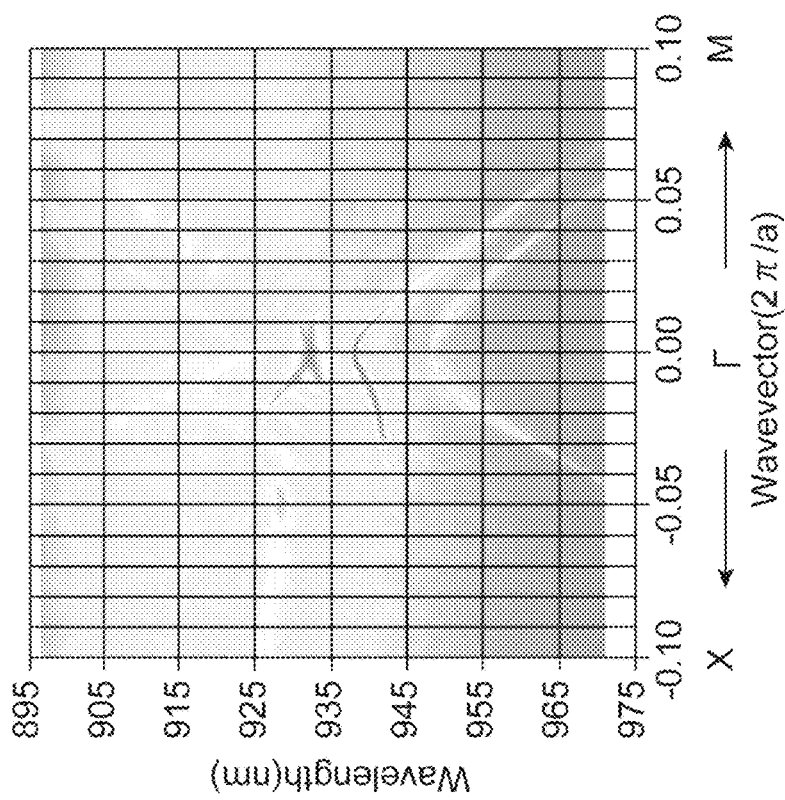

For ease of understanding, FIGS. 8A and 8B illustrate plots (band diagrams) representing spatial intensity distribution with the wavelength on the vertical axis indicated by color shading. A Γ-X direction on the horizontal axis corresponds to the X direction, and the Γ-M direction corresponds to the direction of the bisector between the positive direction of X and the positive direction of Y. FIG. 8A illustrates the band structure before laser oscillation, and FIG. 8B illustrates the band structure after laser oscillation. Note that, while zero-order light exists in a direction perpendicular to the substrate main surface (normal direction) after laser oscillation, the normal direction is excluded from the measurement range because of high intensity in the vicinity of the zero-order light.

With reference to FIGS. 8A and 8B, it can be seen that the band structures overlap with each other for a plurality of times on the short wavelength side both before and after laser oscillation. Moreover, due to the overlapping of band structures, the band extending in the horizontal direction has discontinuities at a plurality of positions. As a result of examination, it was found that the band overlapping on the short wavelength side is caused by the higher-order mode in the stacking direction. The inventors found that such a higher-order mode is generated noticeably in a case where the refractive index of the upper cladding layer between the active layer and the contact layer is larger than the refractive index of the lower cladding layer between the active layer and the semiconductor substrate.

FIG. 9 is a graph illustrating a state of mode generation in a case where the refractive index of the upper cladding layer is larger than the refractive index of the lower cladding layer. In this graph, the vertical axis represents the refractive index and the horizontal axis represents the position in the stacking direction (range of 5.0 μm). Section D1 in the stacking direction is the lower cladding layer. Section D2 is the optical waveguide layer including the active layer. Section D3 is the upper cladding layer. Section D4 is the contact layer. Section D5 is air. Curves G11 to G14 represent the higher-order modes, and a curve G15 represents the fundamental mode.

Normally, the refractive index of each of the active layer and the contact layer is significantly larger than the refractive index of each of the cladding layers. Accordingly, as illustrated in FIG. 9, in a case where the refractive index of the upper cladding layer is larger than the refractive index of the lower cladding layer, the higher-order modes (curves G11 to G14 in FIG. 9) resonate across an interface E1 between the contact layer and the outside (for example, air) and the interface E2 between the active layer and the lower cladding layer.

Figure 10:
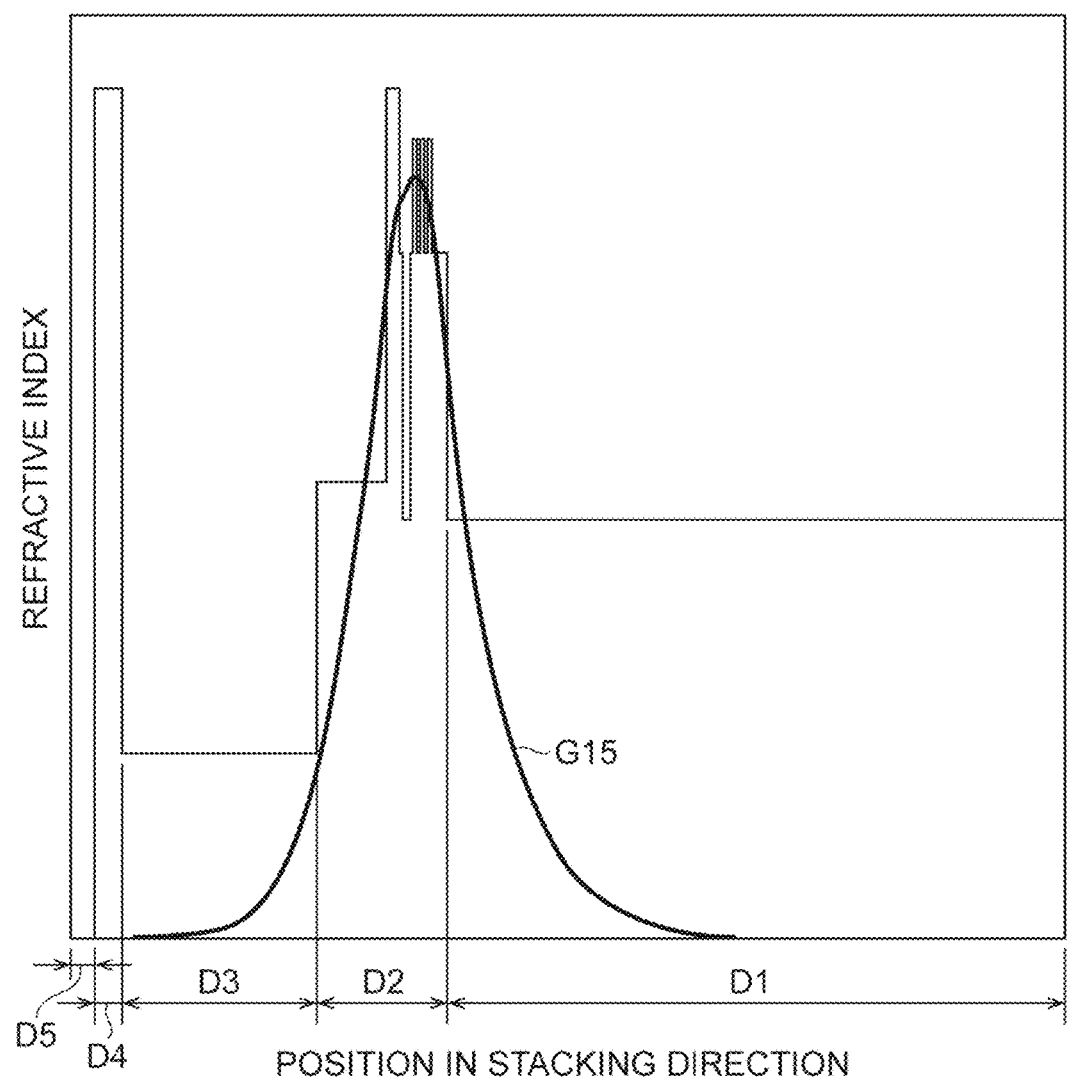
FIG. 10 is a graph illustrating a state of mode generation.

In contrast, in the laser device 1A according to the present embodiment, the refractive index of the upper cladding layer 13 is equal to or smaller than the refractive index of the lower cladding layer 11. FIG. 10 is a graph illustrating a state of mode generation in this case. The vertical axis represents the refractive index, and the horizontal axis represents the position in the stacking direction (range of 3.6 μm). As illustrated in FIG. 10, in this case, the higher-order modes of the curves G11 to G14 illustrated in FIG. 9 are not generated, and solely the fundamental mode of the curve G15 is generated noticeably. With this configuration, with the laser device 1A according to the present embodiment, it is possible to suppress the generation of the high-order mode described above, and to reduce the noise light having the mesh-formed dark portion superposed on the beam pattern.

Note that it was confirmed that the band structure overlapping on the shorter wavelength side also occurred in an ordinary photonic crystal surface-emitting semiconductor laser (PCSEL). In the ordinary PCSEL, however, noise light having a mesh-formed dark portion generated in a direction inclined from the axial direction would not be a problem because the laser uses solely light (zero-order light) in the axial direction perpendicular to the substrate main surface. That is, the technique of the present embodiment achieves a great effect in a laser device that uses light emitted to spread two-dimensionally onto the substrate main surface, such as S-iPM laser or beam deflection laser.

Figure 11A:
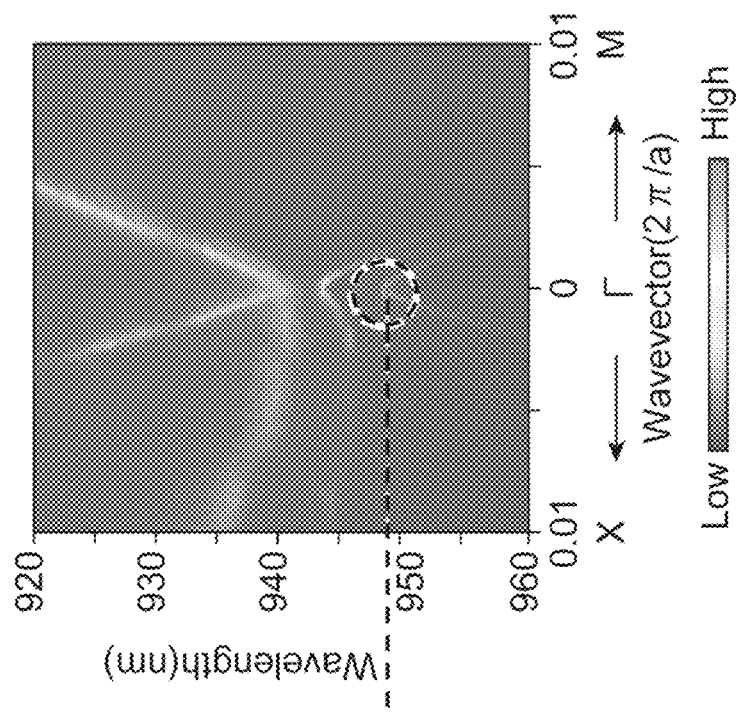
FIGS. 11A and 11B illustrate results of actual measurement of the band structure after fabrication of a laser device sample according to the present embodiment.
Figure 11B:
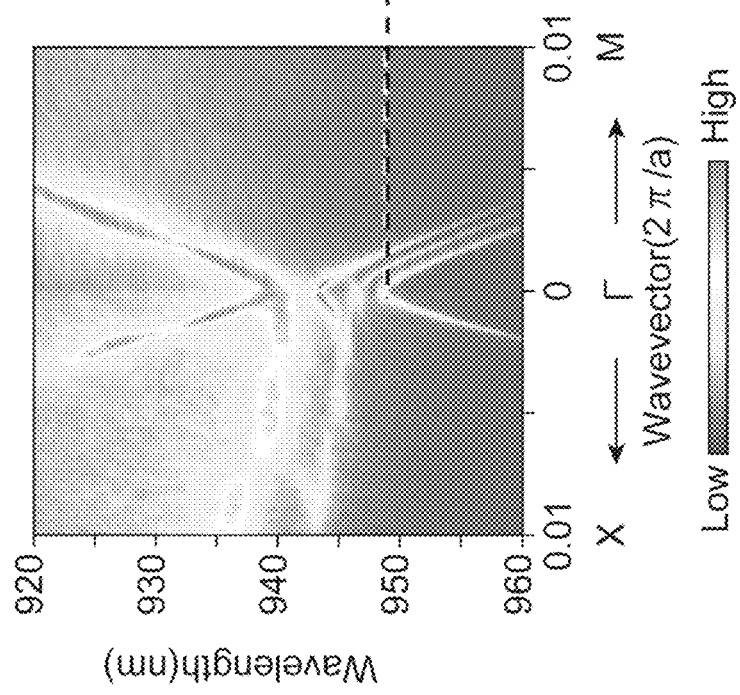
Figure 12A:
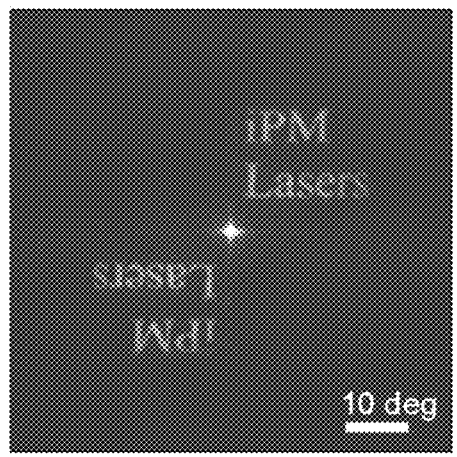
FIGS. 12A to 12D illustrate measurement results of beam patterns of the fabricated laser device sample (S-iPM laser)
Figure 12B:
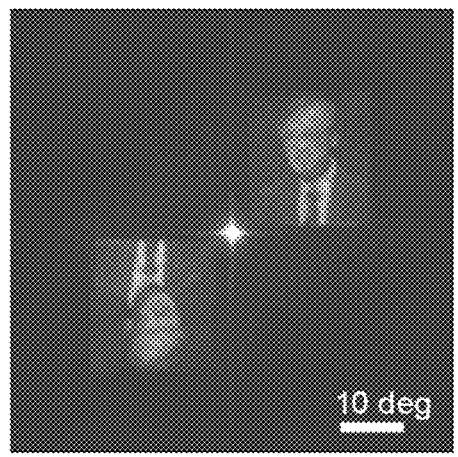
Figure 12C:
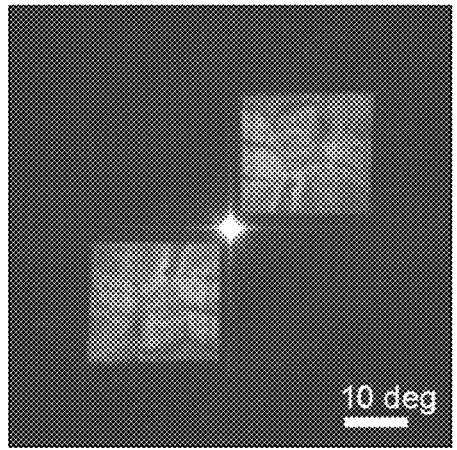
Figure 12D:
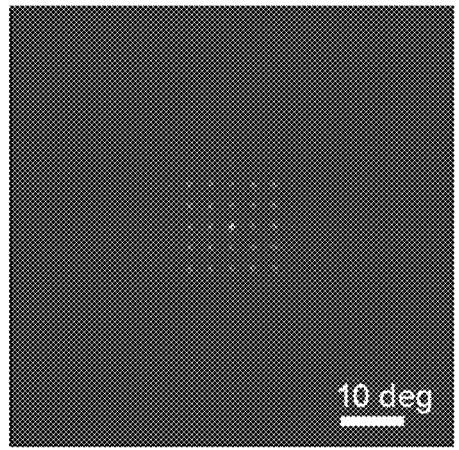

FIGS. 11A and 11B illustrate results of actual measurement of the band structure after fabrication of the laser device 1A according to the present embodiment. The Γ-X direction on the horizontal axis corresponds to the X direction, and the Γ-M direction corresponds to a direction of the bisector between the positive direction of X and the positive direction of Y. FIG. 11A illustrates the band structure before laser oscillation, and FIG. 11B illustrates the band structure after laser oscillation. As illustrated in FIGS. 11A and 11B, in the laser device 1A of the present embodiment, a band on the shorter wavelength side is not observed as compared with the results of FIGS. 8A and 8B. This indicates that the mode in the stacking direction is single (that is, the fundamental mode alone).

FIGS. 12A to 12D illustrate measurement results of beam patterns of the fabricated laser device 1A (S-iPM laser). The centers of FIGS. 12A to 12D correspond to the direction perpendicular to the main surface 10a of the semiconductor substrate 10. As illustrated in these figures, the mesh-formed dark line pattern is not present in the beam pattern from the laser device 1A, and a good beam pattern corresponding to the original design is observed. In this manner, with the laser device 1A according to the present embodiment, it is possible to suppress the generation of mesh-formed noise due to the higher-order mode in the stacking direction and to obtain a good beam pattern.

Moreover, in the present embodiment, when the normalized waveguide width $V_1$ of the optical waveguide layer is defined by the above-described formulas (16) and (17), the refractive index of each of the layers constituting the three-layer slab structure including the optical waveguide layer is set so as to be within a range having one solution to the normalized waveguide width $V_1$. According to the studies of the inventors, it was found that higher-order mode is also generated in the optical waveguide layer (high refractive index layer) including the active layer 12. It was also found by the inventors that higher-order modes can be suppressed by appropriately controlling the thickness and the refractive index of the optical waveguide layer. As will be described below in Example, within a range having one solution to the normalized waveguide width $V_1$ of the optical waveguide layer, the higher-order mode can be further suppressed, leading to further reduction of the noise light having a mesh-formed dark portion superposed on the beam pattern.

Moreover, in the present embodiment, when the normalized waveguide width $V_2$ of the contact layer 14 is defined by the above-described formulas (23) and (24), the refractive index of each of the layers constituting the three-layer slab structure including the contact layer 14 is set so as to be within a range having no solution to the normalized waveguide width $V_2$. In this manner, by appropriately controlling the thickness and the refractive index of the contact layer 14, it is possible to suppress the generation of the guided mode caused by the contact layer 14 and further suppress the generation of higher-order mode in the laser device 1A, as described in Example below.

As a result of examination by the inventors, it was found that, in a case where the size of the hole (that is, the size of each of the modified refractive index regions 15b within the X-Y plane) is mutually different in the case of forming the modified refractive index region 15b by a dry etching step, for example, there is a case where the depth of the hole (that is, the length of each of the modified refractive index regions 15b in the Z direction) is also mutually different. Variation in the lengths of the individual modified refractive index regions 15b in the Z direction causes an unintended phase shift, leading to a decrease in reproducibility of the output beam pattern. Therefore, it is desirable that the size of each of the modified refractive index regions 15b within the X-Y plane is a constant value over the entire phase modulation layer 15A. For the similar reason, it is desirable that the length of each of the modified refractive index regions 15b in the Z direction is a constant value over the entire phase modulation layer 15A.

In the phase modulation layer 15A, it is desirable that a distance r between each of the lattice points O of the virtual square lattice and the gravity center G1 of the corresponding modified refractive index region 15b is a constant value over the entire phase modulation layer 15A. With this configuration, in a case where the phase distribution in the entire phase modulation layer 15A is equally distributed from 0 to $2\pi$ (rad), the gravity center G1 of the modified refractive index region 15b matches the lattice point O of the square lattice on average. Accordingly, effects of the two-dimensionally distributed Bragg diffraction in the phase modulation layer 15A approaches the effects of the two-dimensionally distributed Bragg diffraction in a case where the modified refractive index region is arranged on each of the lattice points O of the square lattice. This makes it possible to facilitate formation of a standing wave and to expect reduction of threshold current for oscillation.

FIGS. 3 and 4 illustrate an example in which the shape of the modified refractive index region 15b within the X-Y plane is circular. Alternatively, the modified refractive index region 15b may have a shape other than a circular shape. For example, the shape of the modified refractive index region 15b within the X-Y plane may have mirror symmetry (line symmetry). The mirror symmetry (line symmetry) is a state of having a possibility of becoming mirror-symmetric (line-symmetric) between the plane shape of the modified refractive index region 15b located on one side of an arbitrary line along the X-Y plane and the plane shape of the modified refractive index region 15b located on the other side of the line. Examples of the shapes having mirror symmetry (line symmetry) include a perfect circle illustrated in FIG. 13A, a square illustrated in FIG. 13B, a regular hexagon illustrated in FIG. 13C, a regular octagon illustrated in FIG. 13D, a regular hexadecagon illustrated in FIG. 13E, a rectangle illustrated in FIG. 13F, and an ellipse illustrated in FIG. 13G. In this manner, the shape of the modified refractive index region 15b within the X-Y plane has mirror symmetry (line symmetry). In this case, in the phase modulation layer 15A (in each of the unit constituent regions of the virtual square lattice), it is possible to determine the angle (p formed by the direction from the lattice point O to the gravity center G1 of the corresponding modified refractive index region 15b and the s-axis with high accuracy, leading to achievement of patterning with high accuracy.

Moreover, the shape of the modified refractive index region 15b within the X-Y plane may be a shape other than a shape having rotational symmetry of 180°. Examples of such a shape include an equilateral triangle illustrated in FIG. 14A, a right-angled isosceles triangle illustrated in FIG. 14B, a shape including two circles or ellipses partially overlapping with each other illustrated in FIG. 14C, a shape obtained by deforming an ellipse such that the dimension in a short-axis direction near one end portion in the long axis becomes smaller than the dimension in the short-axis direction near the other end portion as illustrated in FIG. 14D (oval), a shape obtained by deforming an ellipse so as to make one end portion in the long axis into a pointed shape protruding in the long axis direction illustrated in FIG. 14E (teardrop shape), an isosceles triangle illustrated in FIG. 14F, a shape obtained by deforming a rectangle such that one side is recessed in a triangle shape and the opposite side is pointed in a triangle shape illustrated in FIG. 14G (arrow shape), a trapezoid illustrated in FIG. 14H, a pentagon illustrated in FIG. 14I, and a shape including two rectangular shapes partially overlapping with each other illustrated in FIG. 14J, and a shape including two rectangular shapes partially overlapping with each other and not having mirror symmetry illustrated in FIG. 14K. In this manner, since the shape of the modified refractive index region 15b within the X-Y plane does not have rotational symmetry of 180°, it is possible to obtain a higher light output.

Modification

Figure 15:
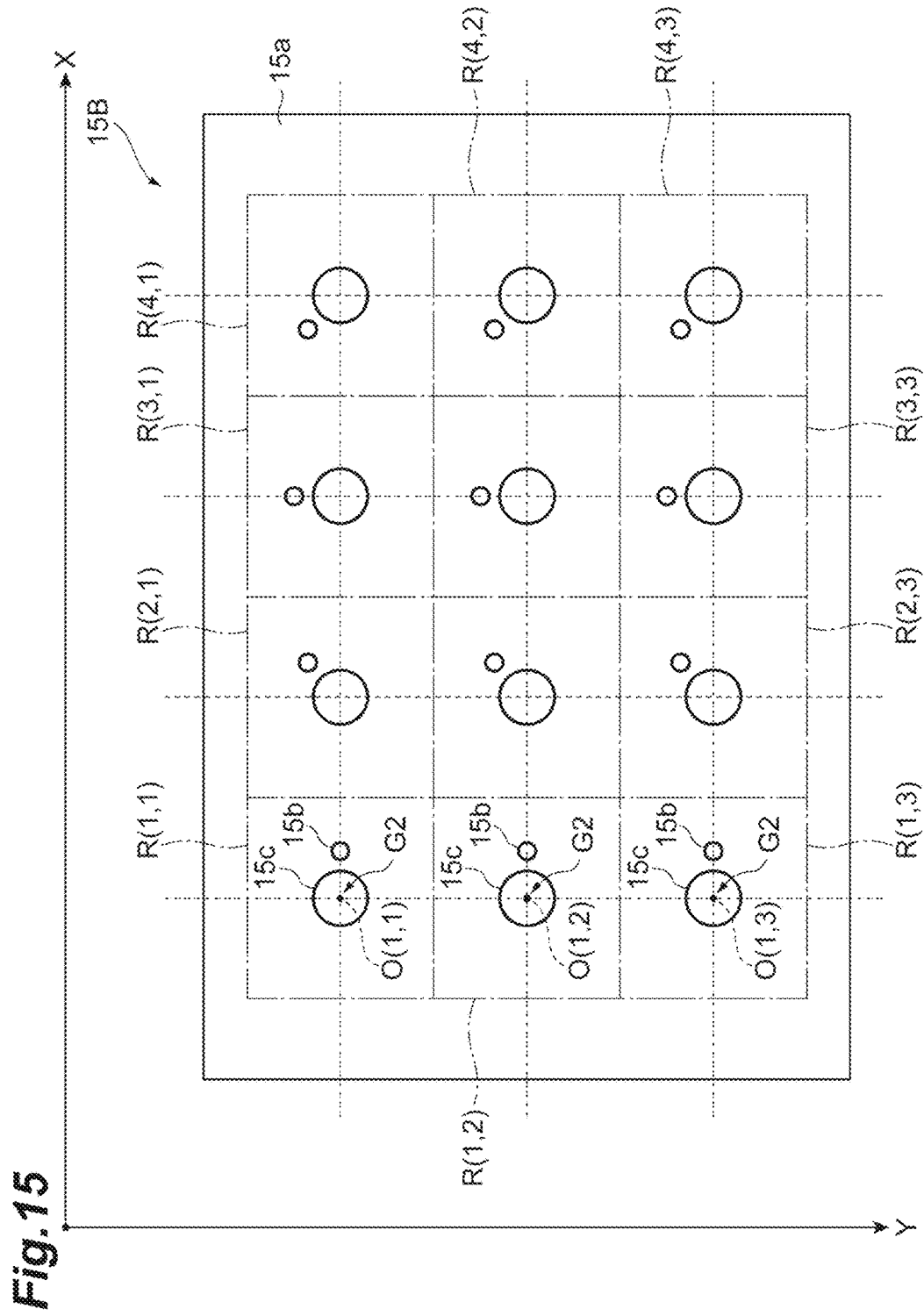
FIG. 15 is a plan view of a phase modulation layer according to a modification of the present embodiment.
Figure 16:
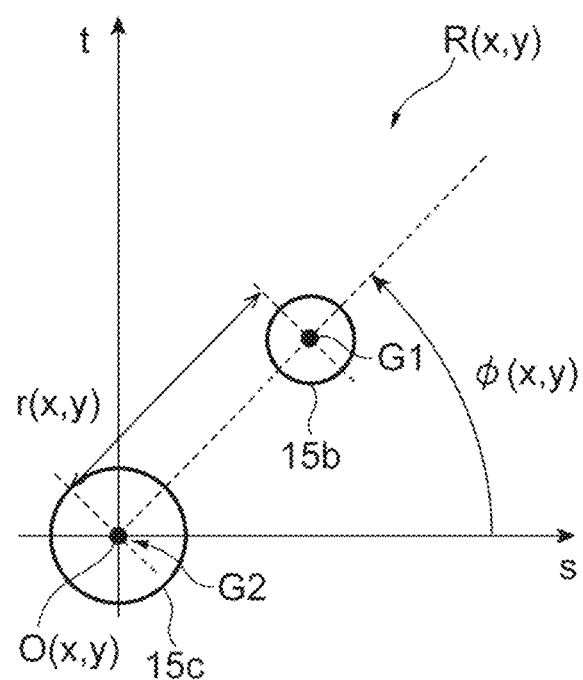
FIG. 16 is a diagram illustrating a positional relationship of a modified refractive index region in the phase modulation layer according to the modification of the present embodiment.

FIG. 15 is a plan view of a phase modulation layer 15B according to a modification of the above-described embodiment. In addition to the configuration (FIG. 3) of the phase modulation layer 15A of the above-described embodiment, the phase modulation layer 15B of the modification further includes a plurality of modified refractive index regions 15c (second modified refractive index regions) other than the plurality of modified refractive index regions 15b. Each of the modified refractive index regions 15c includes a periodic structure and is formed of the second refractive index medium having a refractive index different from the refractive index of the first refractive index medium of the basic layer 15a. Similarly to the modified refractive index region 15b, the modified refractive index region 15c may be a void space, and may be formed by embedding a compound semiconductor in the void space. As illustrated in FIG. 16, also in the modification, an angle formed by the direction from the lattice point O (x, y) toward the gravity center G1 and the s-axis (axis parallel to X-axis) is defined as φ (x, y) in the unit constituent region R (x, y). In a case where the rotation angle φ (x, y) is 0°, the direction of the vector connecting the lattice point O (x, y) with the gravity center G1 matches the positive direction of the s-axis. Moreover, the length of the vector connecting the lattice point O (x, y) with the gravity center G1 is defined as r (x, y). In one example, r (x, y) is constant over the entire phase modulation layer 15B.

The modified refractive index region 15c is provided in the modified refractive index region 15b in a one-to-one correspondence. Each of the modified refractive index regions 15c is located on the lattice point O of the unit constituent region R constituting the virtual square lattice. In one example (examples of FIGS. 15 and 16), a gravity center G2 of each of the modified refractive index regions 15c matches the lattice point O in the corresponding unit constituent region R. While an exemplary plane shape of the modified refractive index region 15c is circular, it may have various shapes similarly to the modified refractive index region 15b. FIGS. 17A to 17K illustrate examples of shapes and relative relationships within the X-Y plane of the modified refractive index regions 15b and 15c. FIGS. 17A and 17B illustrate a form in which the modified refractive index regions 15b and 15c have figures having the same shape and have gravity centers being separated from each other. FIGS. 17C and 17D illustrate a form in which the modified refractive index regions 15b and 15c have figures having the same shape and have gravity centers being separated from each other, and have portions partially overlapping with each other. FIG. 17E illustrates a form in which the modified refractive index regions 15b and 15c have figures having the same shape, having gravity centers being separated from each other, and the relative angle of the modified refractive index regions 15b and 15c being arbitrarily set for each of lattice points O (rotated by an arbitrary angle). FIG. 17F illustrates a form in which the modified refractive index regions 15b and 15c have figures having shapes different from each other and have the gravity centers being separated from each other. FIG. 17G illustrates a form where the modified refractive index regions 15b and 15c have figures having mutually different shapes, having gravity centers being separated from each other, the relative angle of the modified refractive index regions 15b and 15c being arbitrarily set for each of lattice points O (rotated by an arbitrary angle). Among them, in the examples of FIGS. 17E and 17G, the two modified refractive index regions 15b and 15c are rotated so as not to overlap with each other.

Moreover, as illustrated in FIGS. 17H to 17K, the modified refractive index region 15b may include two regions 15b1 and 15b2 separated from each other. The gravity center (corresponding to the gravity center of the single modified refractive index region 15b) of a combination of the regions 15b1 and 15b2 may be separated from the gravity center of the modified refractive index region 15c, and the angle of the line connecting the regions 15b1 and 15b2 with respect to the X-axis may be arbitrarily set for each of the lattice points O. In this case, as illustrated in FIG. 17H, the regions 15b1 and 15b2, and the modified refractive index region 15c may have figures having the same shape. Alternatively, as illustrated in FIG. 17I, two of the figures of the regions 15b1, 15b2 and modified refractive index region 15c may be different from the others. Moreover, as illustrated in FIG. 17J, in addition to the angle of the line connecting the regions 15b and 15b2 with respect to the X-axis, the angle of the modified refractive index region 15c with respect to the X-axis may be arbitrarily set for each of the lattice points O. Moreover, as illustrated in FIG. 17K, the angle of the line connecting the regions 15b1 and 15b2 with respect to the X-axis may be arbitrarily set for each of the lattice points O while the regions 15b1 and 15b2 and the modified refractive index region 15c maintain the same relative angle to each other. Note that, in the example of FIGS. 17J and 17K among these, the regions 15b and 15b2 may be rotated so as not to overlap with the modified refractive index region 15c.

The shape of the modified refractive index region within the X-Y plane may be identical between lattice points O. That is, the modified refractive index regions may have an identical figure at all the lattice points, and they may overlap with each other between the lattice points O by translational operation, or by translational operation and rotational operation. In that case, it is possible to suppress the generation of the zero-order light that becomes noise light and noise in the beam pattern. Alternatively, the shape of the modified refractive index region within the X-Y plane need not necessarily be identical between the lattice points. For example, as illustrated in FIG. 18, adjacent lattice points O may have different shapes from each other.

For example, even with the configuration of the phase modulation layer as in this modification, the effects of the above-described embodiment can be suitably achieved.

Specific Example of First Embodiment

The inventors examined conditions that would not cause a higher-order mode with respect to the thickness and refractive index of the optical waveguide layer including the active layer, and the thickness and refractive index of the contact layer. The examination step and results will be described below.

Figure 20:
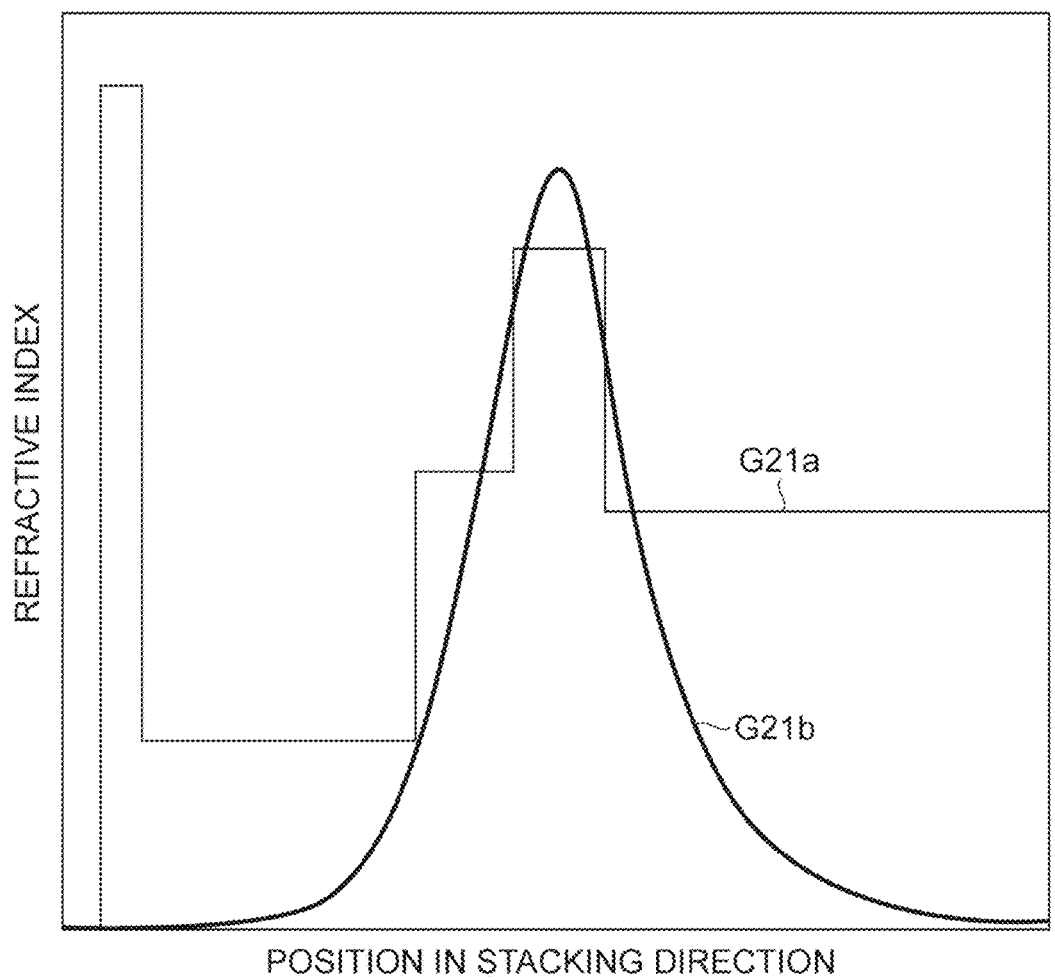
FIG. 20 illustrates refractive index distribution and mode distribution of a laser device having the layer structure illustrated in FIG. 19.

First, a specific structure of the laser device 1A determined as an examination target in this specific example will be described. FIG. 19 is a table illustrating a layer structure in a case where the laser device 1A is formed of a GaAs-based compound semiconductor (emission wavelength 940 nm band). The table in FIG. 19 illustrates the conductivity type, composition, layer thickness, and refractive index of each of the layers. Layer number 1 indicates the contact layer 14, layer number 2 indicates the upper cladding layer 13, layer number 3 indicates the phase modulation layer 15A, layer number 4 indicates the optical guide layer and the active layer 12, and layer number 5 indicates the lower cladding layer 11. FIG. 20 illustrates refractive index distribution G21a and mode distribution G21b of the laser device 1A having a layer structure illustrated in FIG. 19. The horizontal axis represents the position in the stacking direction (range is 2.5 μm). At this time, it can be seen that solely the fundamental mode is generated, and the higher-order mode is suppressed.

Figure 22:
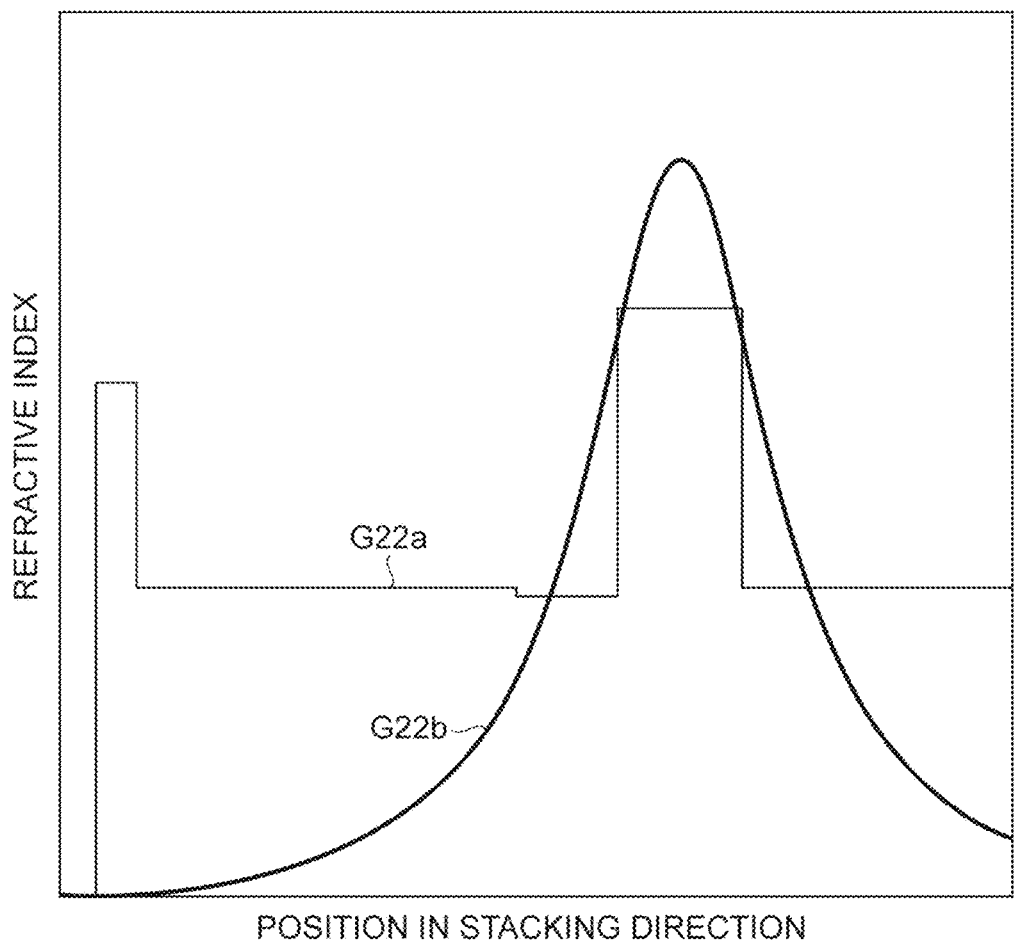
FIG. 22 illustrates the refractive index distribution and the mode distribution of the laser device having the layer structure illustrated in FIG. 21.

FIG. 21 is a table illustrating a layer structure in a case where the laser device 1A is formed of an InP-based compound semiconductor (emission wavelength 1300 nm band). Layer number 1 indicates the contact layer 14, layer number 2 indicates the upper cladding layer 13, layer number 3 indicates the phase modulation layer 15A, layer number 4 indicates the optical guide layer and the active layer 12, and layer number 5 indicates the lower cladding layer 11. FIG. 22 illustrates refractive index distribution G22a and mode distribution G22b of the laser device 1A having a layer structure illustrated in FIG. 21. The horizontal axis represents the position in the stacking direction (range is 2.5 μm). At this time, it can be seen that solely the fundamental mode is generated, and the higher-order mode is suppressed.

Figure 24:
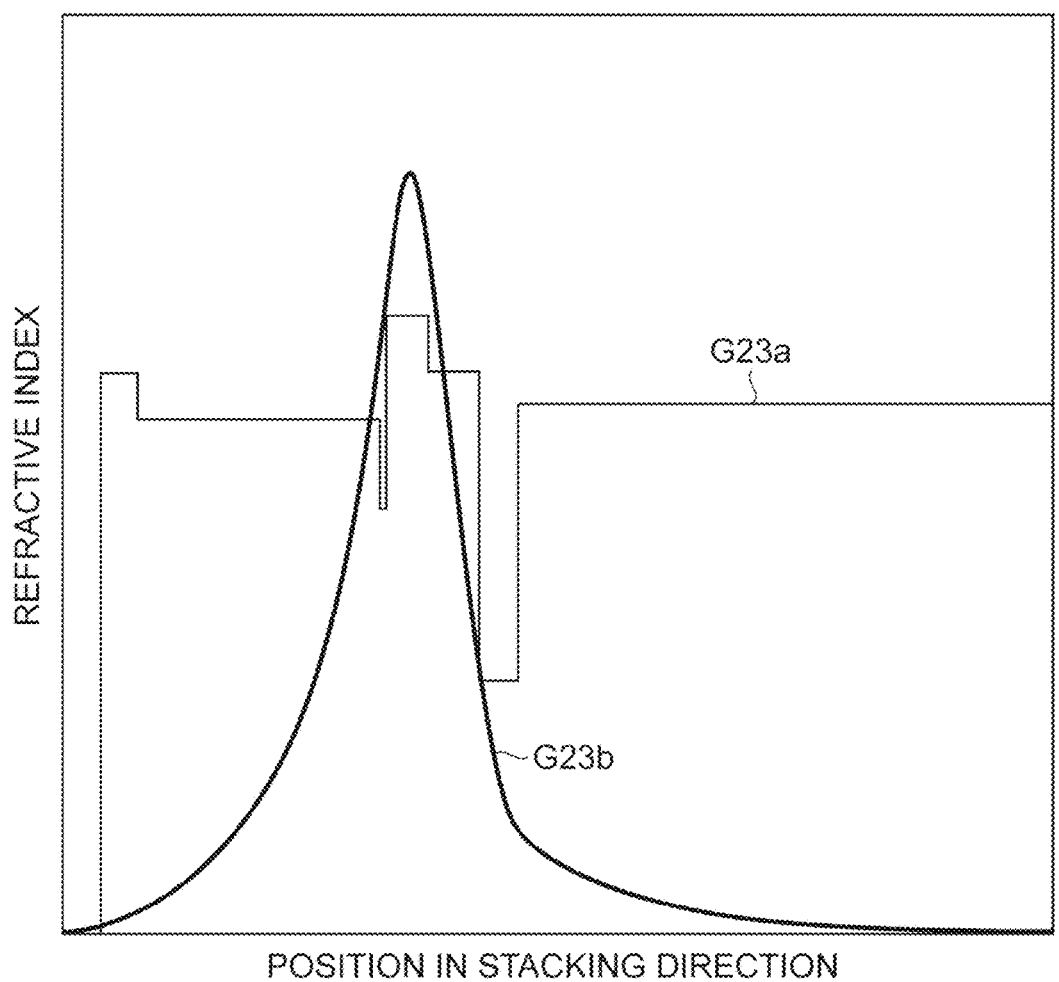
FIG. 24 illustrates the refractive index distribution and the mode distribution of the laser device having the layer structure illustrated in FIG. 23.

FIG. 23 is a table illustrating a layer structure in a case where the laser device 1A is formed of a nitride-based compound semiconductor (emission wavelength 405 nm band). Layer number 1 indicates the contact layer 14, layer number 2 indicates the upper cladding layer 13, layer number 3 indicates the carrier barrier layer, layer number 4 indicates the active layer 12, layer number 5 indicates the optical guide layer, layer number 6 indicates the phase modulation layer 15A, and layer number 7 indicates the lower cladding layer 11. FIG. 24 illustrates refractive index distribution G23a and mode distribution G23b of the laser device 1A having a layer structure illustrated in FIG. 23. The horizontal axis represents the position in the stacking direction (range is 2.5 μm). At this time, it can be seen that solely the fundamental mode is generated, and the higher-order mode is suppressed.

In each of the above-described structures, the filling factor (FF) of the phase modulation layer 15A is 15%. The filling factor is the ratio of the area of the modified refractive index region 15b to one unit constituent region R.

Next, the preconditions for examination will be described. In the following examination, the TE mode is assumed. That is, the leakage mode and the TM mode are not considered. Moreover, the lower cladding layer 11 is sufficiently thick, and the influence of the semiconductor substrate 10 is negligible. The refractive index of the upper cladding layer 13 is equal to or less than the refractive index of the lower cladding layer 11. The active layer 12 (MQW layer) and the optical guide layer are regarded as one optical waveguide layer (core layer) having an average dielectric constant and a total film thickness, unless otherwise specified. Furthermore, the dielectric constant of the phase modulation layer 15A is an average dielectric constant based on a filling factor.

The calculation formula of the average refractive index and the film thickness of the optical waveguide layer formed with the active layer 12 and the optical guide layer is as follows. That is $\in_{core}$ is the average dielectric constant of the optical waveguide layer and is defined by the following formula (32). $\in_i$ is the dielectric constant of each of the layers, $d_i$ is the thickness of each of the layers, and $n_1$ is the refractive index of each of the layers. $n_{core}$ is the average refractive index of the optical waveguide layer and is defined by the following formula (33). $d_{core}$ is the film thickness of the optical waveguide layer and is defined by the following formula (34).

$$\varepsilon_{core} = \frac{\sum_{i=1}^{N} \varepsilon_i \cdot d_i}{\sum_{i=1}^{N} d_i} = \frac{\sum_{i=1}^{N} n_i^2 \cdot d_i}{\sum_{i=1}^{N} d_i} \tag{32}$$

$$n_{core} = \sqrt{\varepsilon_{core}} = \sqrt{\frac{\sum_{i=1}^{N} n_i^2 \cdot d_i}{\sum_{i=1}^{N} d_i}} \tag{33}$$

$$d_{core} = \sum_{i=1}^{N} d_i \tag{34}$$

The calculation formula of the average refractive index of the phase modulation layer 15A is as follows. That is, $n_{PM}$ is the average refractive index of the phase modulation layer 15A and is defined by the following formula (35). $\in_{PM}$ is the dielectric constant of the phase modulation layer 15A, $n_1$ is the refractive index of the first refractive index medium, $n_2$ is the refractive index of the second refractive index medium, and FF is the filling factor.

$$n_{PM}=\sqrt{\epsilon_{PM}}=\sqrt{n_1^2 \cdot FF + n_2^2 \cdot (1-FF)} \quad (35)$$

Figure 25A:
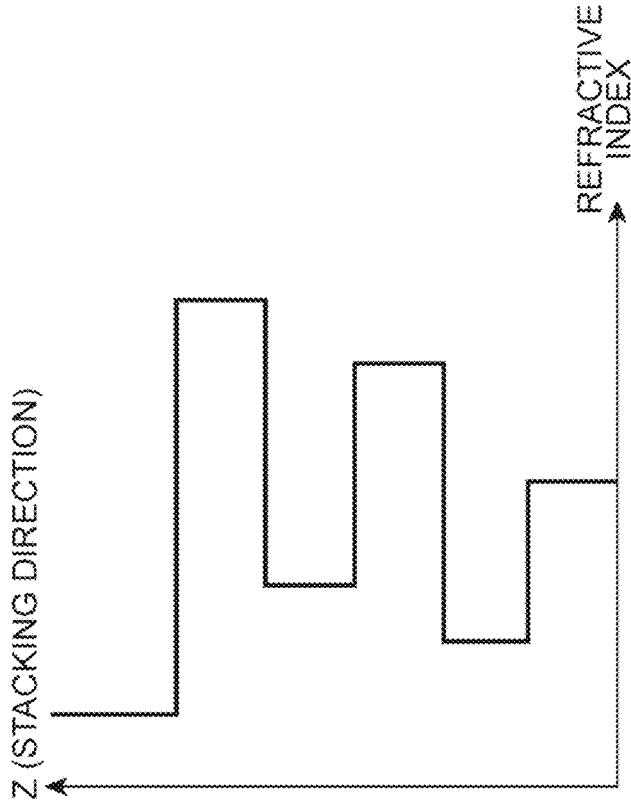
FIGS. 25A and 25B illustrate a cross-sectional view and refractive index distribution for explaining a case where the waveguide structure is approximated by six-layer slab waveguides.
Figure 25B:
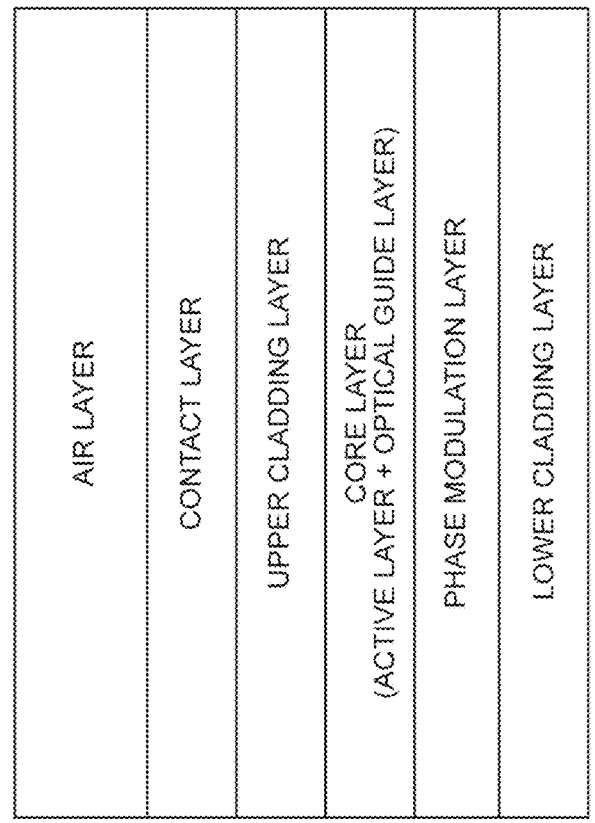

In the following examination, approximation of the waveguide structure was performed with one of the five-layer and six-layer slab waveguide. FIGS. 25A and 25B are a cross-sectional view and refractive index distribution, respectively, for explaining a case of approximating the waveguide structure by the six-layer slab waveguide. FIGS. 26A and 26B are a cross-sectional view and refractive index distribution, respectively, for explaining a case of approximating the waveguide structure by the five-layer slab waveguide. As illustrated in FIGS. 25A and 25B, the phase modulation layer 15A has no waveguide function in a case where the refractive index of the phase modulation layer 15A is smaller than the refractive index of the lower cladding layer 11, and thus, approximation was performed on the six-layer slab waveguide. That is, the optical waveguide layer has a structure that includes the active layer 12 and the optical guide layer, and does not include any of the lower cladding layer 11, the upper cladding layer 13, and the phase modulation layer 15A. Such approximation can be applied to, for example, a structure illustrated in FIGS. 21 and 23 (InP-based compound semiconductor or nitride-based compound semiconductor in this specific example).

As illustrated in FIGS. 26A and 26B, the phase modulation layer 15A has a waveguide function in a case where the refractive index of the phase modulation layer 15A is the refractive index of the lower cladding layer 11 or more, and thus, approximation was performed on the five-layer slab waveguide. In other words, the optical waveguide layer has a structure that includes the phase modulation layer 15A and the active layer 12, and does not include any of the lower cladding layer 11 and the upper cladding layer 13. Such approximation can be applied to, for example, the structure illustrated in FIG. 19 (GaAs-based compound semiconductor in Example).

Furthermore, in order to further simplify calculation, the calculation range is limited to a peripheral portion of each of the optical waveguide layer and the contact layer each having a refractive index higher than the equivalent refractive index of the laser device 1A. That is, the three-layer slab structure related to the optical waveguide layer is defined by the optical waveguide layer and upper and lower layers adjacent to the optical waveguide layer, and the three-layer slab structure related to the contact layer 14 is defined by the contact layer 14 and the adjacent upper and lower layers.

Figure 27A:
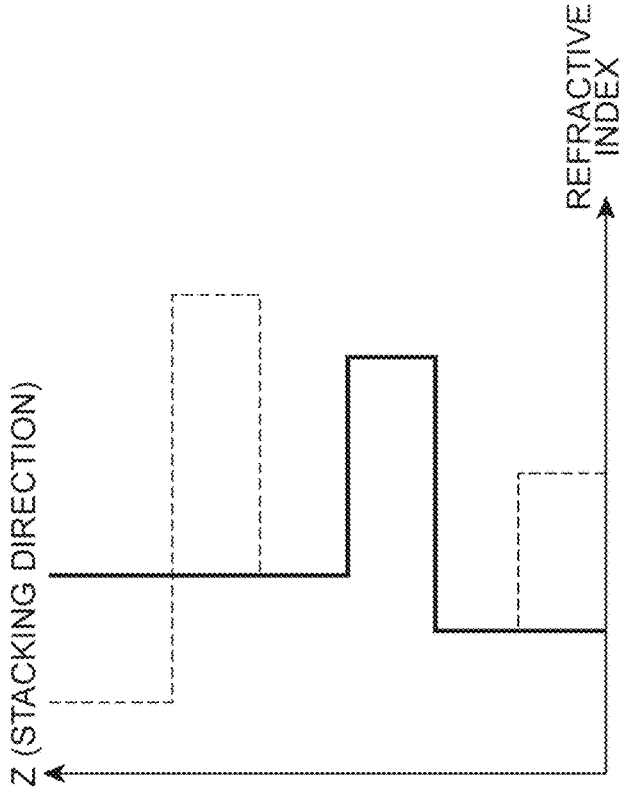
FIGS. 27A and 27B illustrate a cross-sectional view and refractive index distribution illustrating a three-layer slab structure related to an optical waveguide layer in the six-layer slab waveguide.
Figure 27B:
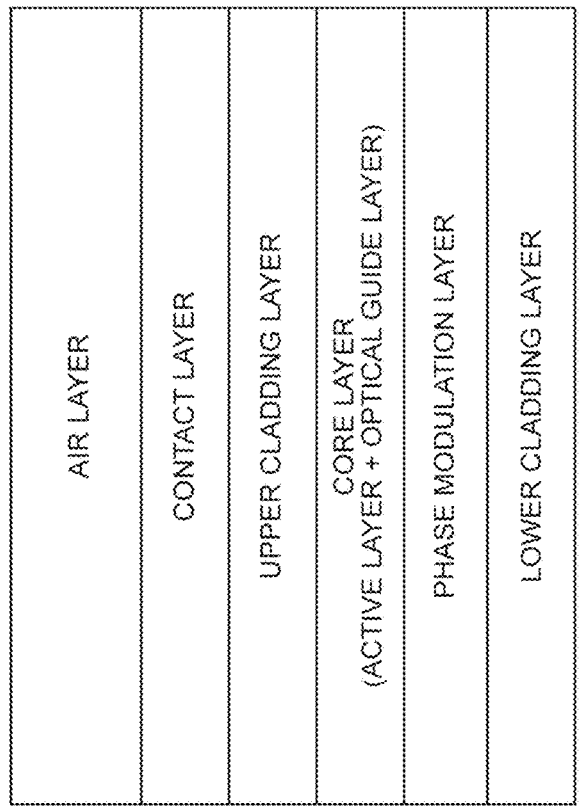
Figure 28A:
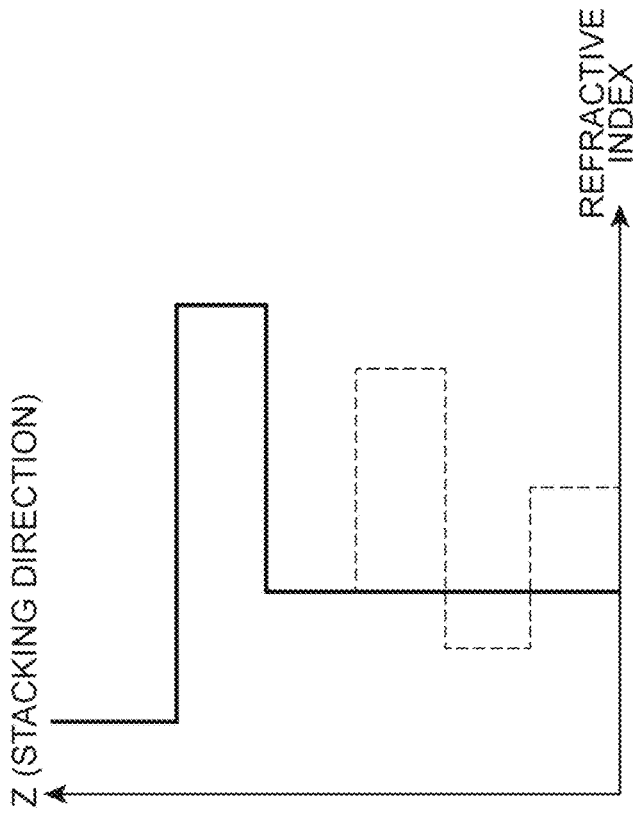
FIGS. 28A and 28B illustrate a cross-sectional view and refractive index distribution illustrating a three-layer slab structure with respect to a contact layer in a six-layer slab waveguide.
Figure 28B:
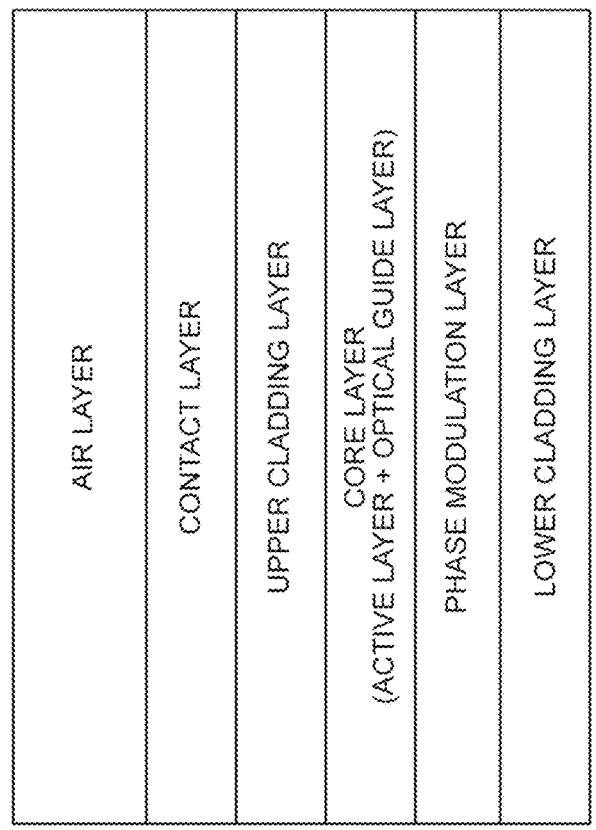

FIGS. 27A and 27B are a cross-sectional view and refractive index distribution, respectively, for explaining a three-layer slab structure related to the optical waveguide layer in the six-layer slab waveguide (refer to FIGS. 25A and 25B). In this case, the guided mode of the optical waveguide layer is calculated on the basis of the refractive index distribution indicated by the solid line in the refractive index distribution in FIG. 27B. FIGS. 28A and 28B are a cross-sectional view and refractive index distribution, respectively, for explaining the three-layer slab structure of the contact layer 14 in the six-layer slab waveguide (refer to FIGS. 25A and 25B). In this case, the guided mode of the contact layer 14 is calculated on the basis of the refractive index distribution indicated by the solid line in FIG. 28B.

FIGS. 29A and 29B are a cross-sectional view and refractive index distribution, respectively, for explaining a three-layer slab structure related to an optical waveguide layer in a five-layer slab waveguide (refer to FIGS. 26A and 26B). In this case, the guided mode of the optical waveguide layer is calculated on the basis of the refractive index distribution indicated by the solid line in FIG. 29B. FIGS. 30A and 30B are a cross-sectional view and refractive index distribution, respectively, for explaining the three-layer slab structure of the contact layer 14 in the five-layer slab waveguide (refer to FIGS. 26A and 26B). In this case, the guided mode of the contact layer 14 is calculated on the basis of the refractive index distribution indicated by the solid line in FIG. 30B.

Note that, in order to prevent the guided mode from leaking to the semiconductor substrate 10 through the lower cladding layer 11 in approximation by the three-layer slab structure described above, the refractive index of the lower cladding layer 11 needs to be set to the equivalent refractive index of the laser device 1A or less.

Figures 31A, 31B:
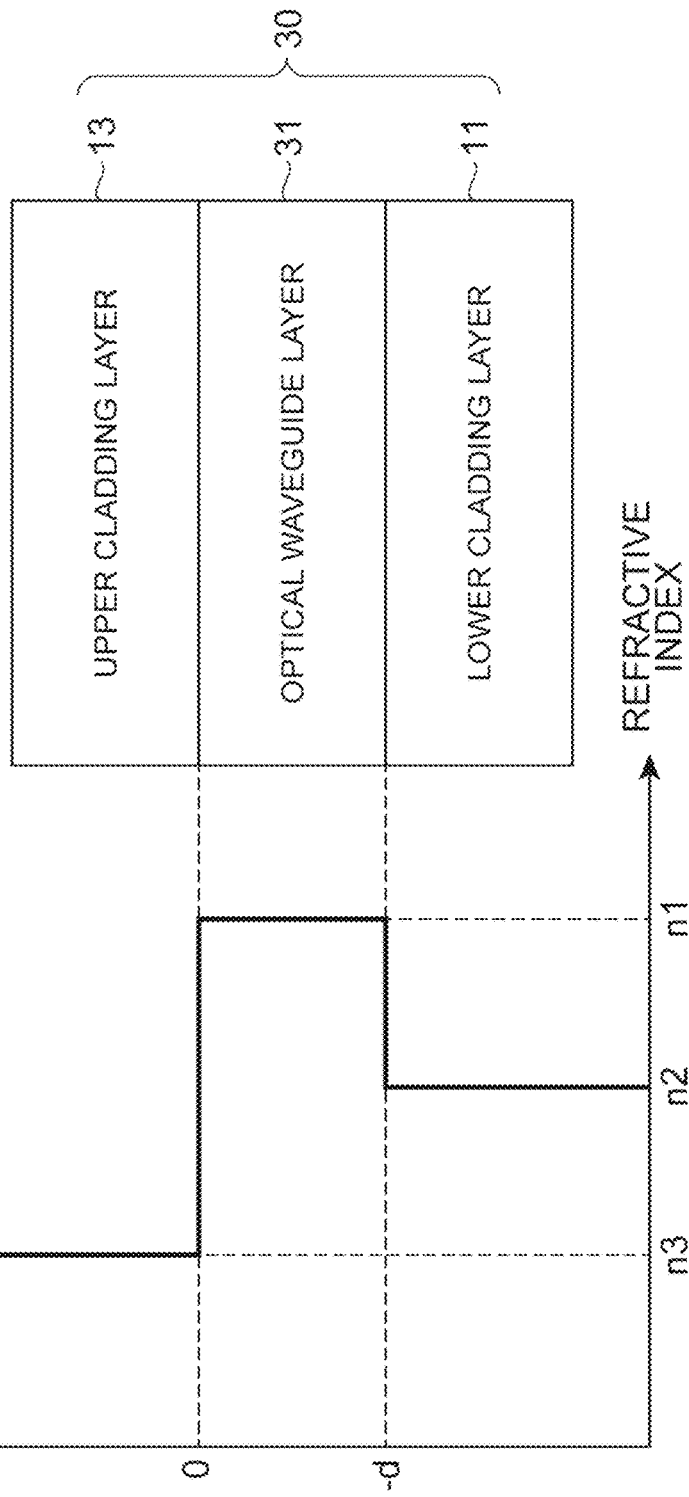
FIGS. 31A and 31B illustrate refractive index distribution and a cross-sectional view of a three-layer slab structure including a lower cladding layer, an optical waveguide layer, and an upper cladding layer.

Now, the analytical expression of the three-layer slab structure will be described. FIGS. 31A and 31B illustrate a three-layer slab structure 30 including the lower cladding layer 11, the optical waveguide layer 31, and the upper cladding layer 13, and illustrate the refractive index distribution of the three-layer slab structure 30. Herein, the refractive index of the lower cladding layer 11 is $n_2$, the refractive index of the optical waveguide layer 31 is $n_1$, and the refractive index of the upper cladding layer 13 is $n_3$. When the normalized waveguide width $V_1$ of the optical waveguide layer 31 is defined by the above-described formula (16), the guided mode is set to the fundamental mode alone when the setting is within a range having solely one solution to the normalized waveguide width $V_1$. However, when investigating the guided mode of the above-described five-layer slab structure and six-layer slab structure by the analytical expression of the three-layer slab structure, there is a need to suppress leakage of the guided mode to the lower cladding layer 11, and thus, conditions in the above-described formula (17) need be satisfied at the same time.

For the contact layer 14, the lower cladding layer 11 can be replaced with the upper cladding layer 13, the optical waveguide layer 31 can be replaced with the contact layer 14, and the upper cladding layer 13 can be replaced with the air layer in FIGS. 31A and 31B. Then, when the refractive index of the contact layer 14 is $n_4$ and the refractive index of the air layer is $n_5$, the above-described formula (23) related to the normalized waveguide width $V_2$ of the contact layer 14 is obtained. In a case where the setting is within a range having no solution to the normalized waveguide width $V_2$, there is no guided mode in the contact layer 14. However, when investigating the guided mode of the above-described five-layer slab structure and six-layer slab structure by the analytical expression of the three-layer slab structure, there is a need to suppress leakage of the guided mode to the lower cladding layer 11, and thus, conditions in the above-described formula (24) need be satisfied at the same time.

By analyzing the guided mode generated with the film thickness of the upper cladding layer 13 varied, it was confirmed that the film thickness of the upper cladding layer 13 does not affect the guided mode.

(Case where the Laser Device 1A is Formed of a GaAs-Based Compound Semiconductor)

FIG. 32 is a table illustrating an example of a five-layer slab structure in a case where the laser device 1A is formed of a GaAs-based compound semiconductor. The range of film thickness of the optical waveguide layer (layer number 4) and the contact layer (layer number 2) in this five-layer slab structure can be obtained by the following calculation.

Figure 34:
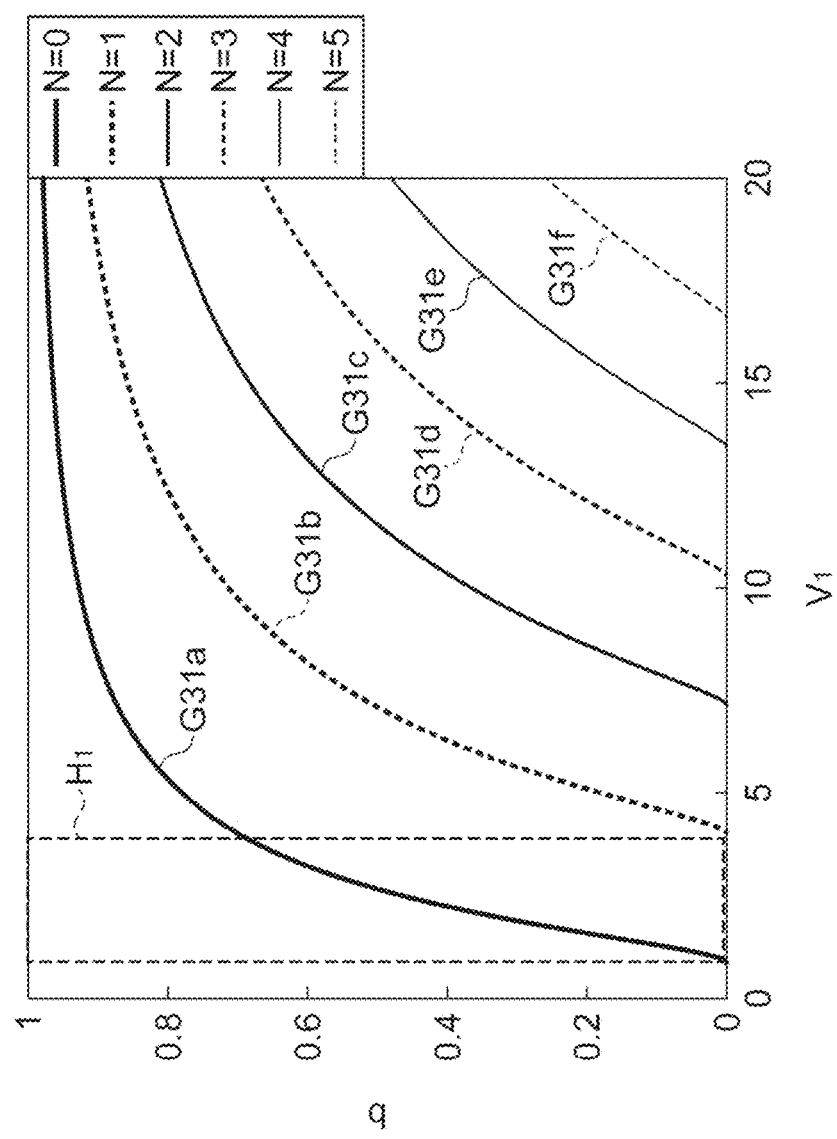
FIG. 34 is a graph illustrating a relationship between a normalized waveguide width $V_1$ of the optical waveguide layer and a normalized propagation coefficient b, expressed by formulas (16) and (17)

FIG. 33A is a table illustrating the refractive indices $n_1$, $n_2$, and $n_3$, the asymmetric parameter a', and the refractive index $n_{clad}$ of the lower cladding layer 11 used for calculation. In this case, FIG. 34 illustrates the relationship between the normalized waveguide width $V_1$ of the optical waveguide layer and the normalized propagation coefficient b expressed by the above-described formulas (16) and (17). In FIG. 34, graphs G31a to G31f illustrate cases of the mode order N=0 to 5, respectively. In this graph, the range in which the guided mode is the fundamental mode (that is, N=0) alone corresponds to the range having one solution to the normalized waveguide width $V_1$, being inside the range $H_1$. The range $H_1$ corresponds to the range having a lower limit value of normalized waveguide width $V_1$ corresponding to N=0 when the normalized propagation coefficient b is zero and having an upper limit value of normalized waveguide width $V_1$ corresponding to N=1 when the normalized propagation coefficient b is zero. FIG. 33B is a table illustrating a calculation result of the lower limit value and the upper limit value.

Figure 36:
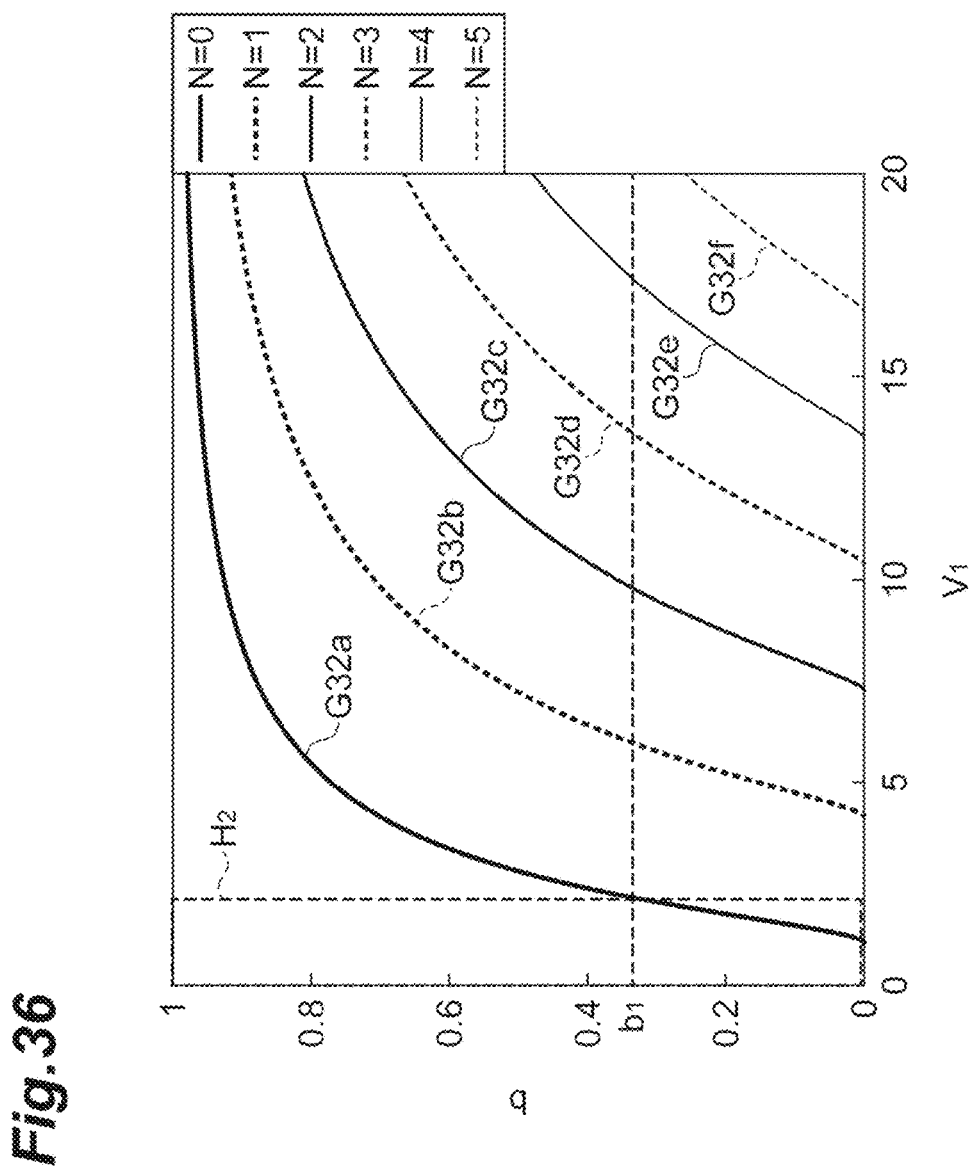
FIG. 36 is a graph illustrating a relationship between a normalized waveguide width $V_2$ of the contact layer and the normalized propagation coefficient b, expressed by formulas (23) and (24)

FIG. 35A is a table illustrating the refractive indices $n_4$, $n_5$, and $n_6$, the asymmetric parameter a' and the refractive index $n_{clad}$ of the lower cladding layer 11 used for calculation. In this case, FIG. 36 illustrates the relationship between the normalized waveguide width $V_2$ of the contact layer 14 and the normalized propagation coefficient b expressed by the above-described formulas (23) and (24). In FIG. 36, graphs G32a to G32f illustrate cases of the mode order N=0 to 5, respectively. In this graph, the range in which there is no generation of the guided mode due to the contact layer 14 and the guided mode of the laser device 1A is the fundamental mode of the optical waveguide layer alone corresponds to a range having no solution to the normalized waveguide width $V_2$, being inside the range $H_2$. The range $H_2$ corresponds to the range having a lower limit value of zero and having an upper limit value of the normalized waveguide width $V_2$ corresponding to N=0 when the normalized propagation coefficient b is $b_1$ corresponding to the refractive index of the lower cladding layer 11. FIG. 35B is a table illustrating a calculation result of the upper limit value.

Figure 37:
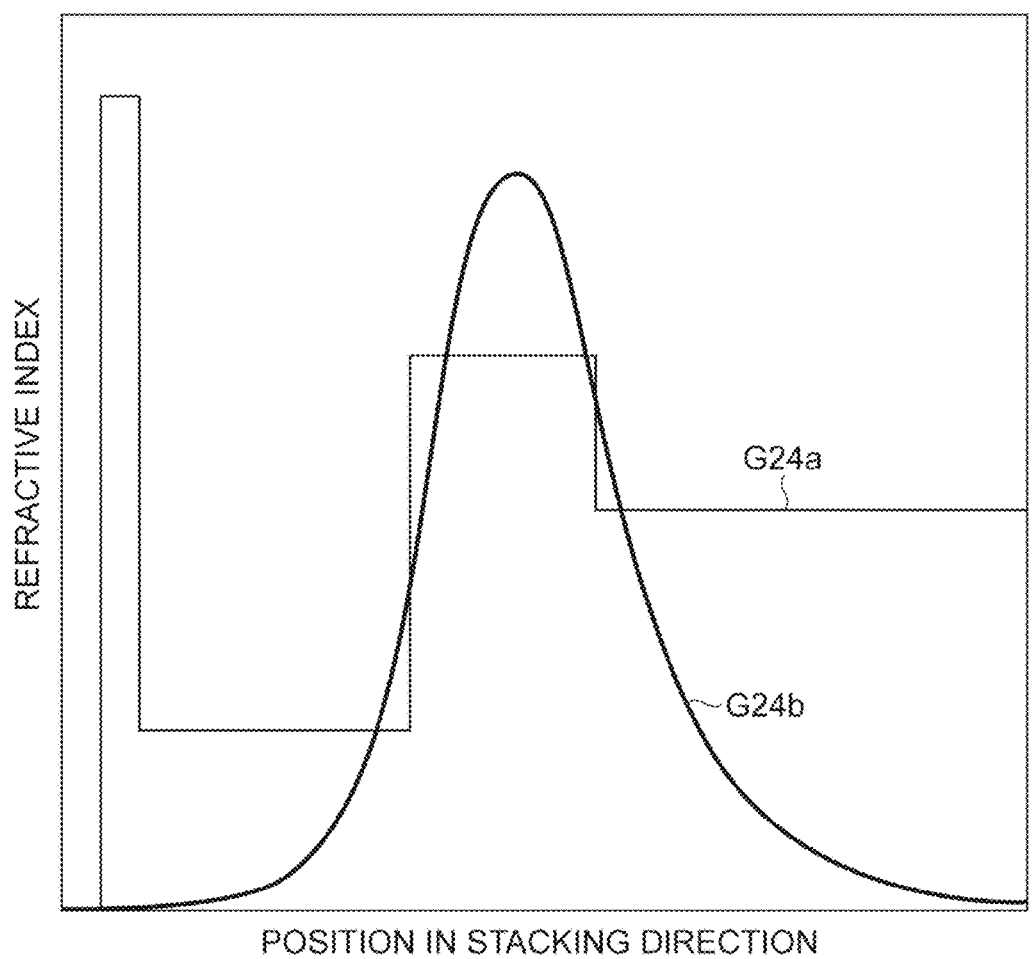
FIG. 37 illustrates refractive index distribution and mode distribution of the laser device having the layer structure illustrated in FIG. 32.

FIG. 37 illustrates the refractive index distribution G24a and mode distribution G24b of the laser device 1A having a layer structure illustrated in FIG. 32. It can be seen that solely the fundamental mode is generated noticeably and the higher-order mode is suppressed.

(Case where the Laser Device 1A is Formed of InP-Based Compound Semiconductor)

FIG. 38 is a table illustrating an example of a six-layer slab structure in a case where the laser device 1A is formed of an InP-based compound semiconductor. The range of film thickness of the optical waveguide layer (layer number 5) and the contact layer (layer number 2) in this six-layer slab structure can be obtained by the following calculation.

Figure 40:
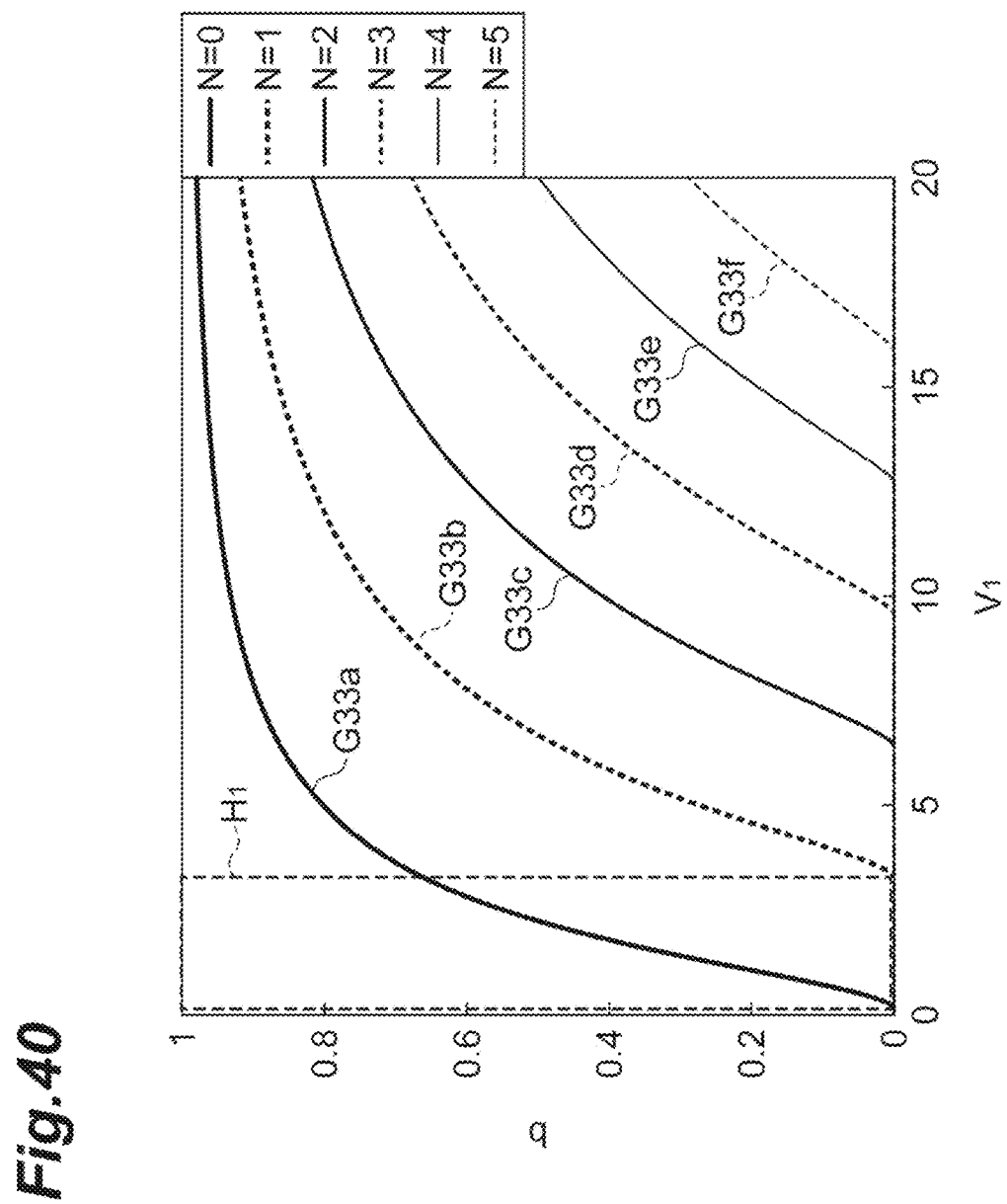
FIG. 40 is a graph illustrating a relationship between the normalized waveguide width $V_1$ of the optical waveguide layer and the normalized propagation coefficient b, expressed by formulas (16) and (17)

FIG. 39A is a table illustrating the refractive indices $n_1$, $n_2$, and $n_3$, the asymmetric parameter a' and the refractive index $n_{clad}$ of the lower cladding layer 11 used for calculation. In this case, FIG. 40 illustrates the relationship between the normalized waveguide width $V_1$ of the optical waveguide layer and the normalized propagation coefficient b, expressed by the above-described formulas (16) and (17). In FIG. 40, graphs G33a to G33f illustrate cases of mode order N=0 to 5, respectively. In this graph, the range in which the guided mode is the fundamental mode (that is, N=0) alone corresponds to the range having one solution to the normalized waveguide width $V_1$, being inside the range $H_1$. The definition of the range $H_1$ is similar to that of the GaAs-based compound semiconductor described above. FIG. 39B is a table illustrating a calculation result of the lower limit value and the upper limit value.

Figure 42:
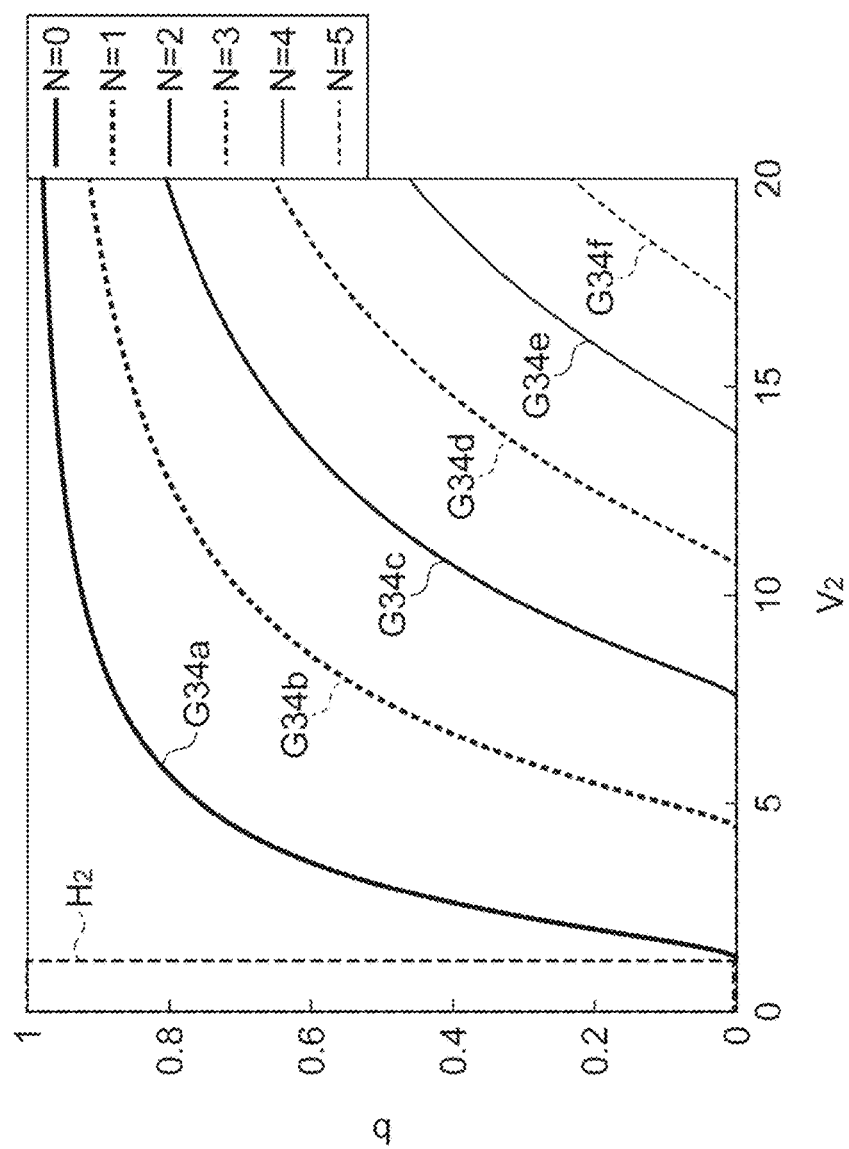
FIG. 42 is a graph illustrating a relationship between the normalized waveguide width $V_2$ of the contact layer and the normalized propagation coefficient b, expressed by formulas (23) and (24)

FIG. 41A is a table illustrating the refractive indices $n_4$, $n_5$, and $n_6$, the asymmetric parameter a' and the refractive index $n_{clad}$ of the lower cladding layer 11 used for calculation. In this case, the relationship between the normalized waveguide width $V_2$ of the contact layer 14 and the normalized propagation coefficient b expressed by the above-described formulas (23) and (24) is as illustrated in the graph in FIG. 42. In FIG. 42, graphs G34a to G34f illustrate cases of mode order N=0 to 5, respectively. In this graph, the range in which there is no generation of the guided mode due to the contact layer 14 and the guided mode of the laser device 1A is the fundamental mode of the optical waveguide layer alone corresponds to a range having no solution to the normalized waveguide width $V_2$, being inside the range $H_2$. The definition of the range $H_2$ is similar to that of the GaAs-based compound semiconductor described above. FIG. 41B is a table illustrating the calculation result of the upper limit value.

Figure 43:
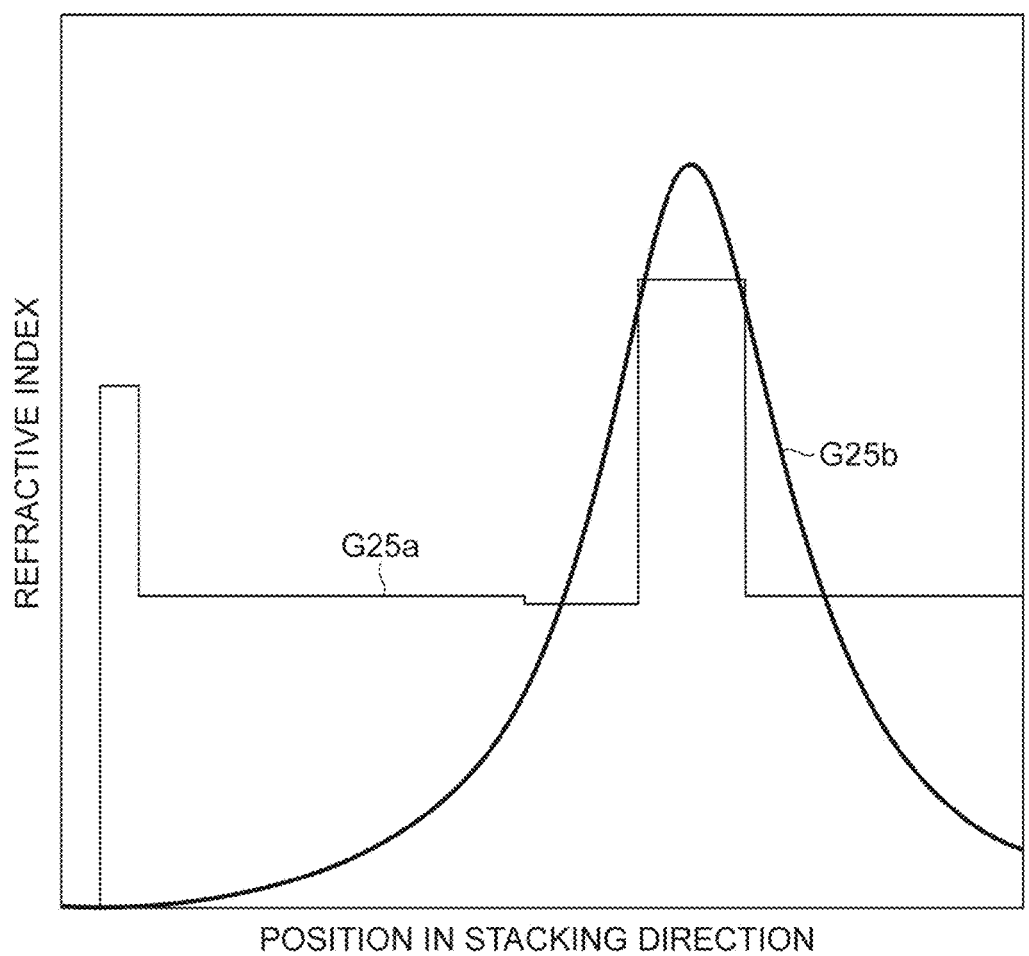
FIG. 43 illustrates the refractive index distribution and the mode distribution of the laser device having the layer structure illustrated in FIG. 38.

FIG. 43 illustrates refractive index distribution G25a and a mode distribution G25b of the laser device 1A having a layer structure illustrated in FIG. 38. It can be seen that solely the fundamental mode is generated noticeably and the higher-order mode is suppressed.

(Case where the Laser Device 1A is Formed of a Nitride-Based Compound Semiconductor)

FIG. 44 is a table illustrating an example of a six-layer slab structure in a case where the laser device 1A is formed of a nitride-based compound semiconductor. The film thickness range of the optical waveguide layer (layer number 4) and the contact layer (layer number 2) in the six-layer slab structure can be obtained by the following calculation.

Figure 46:
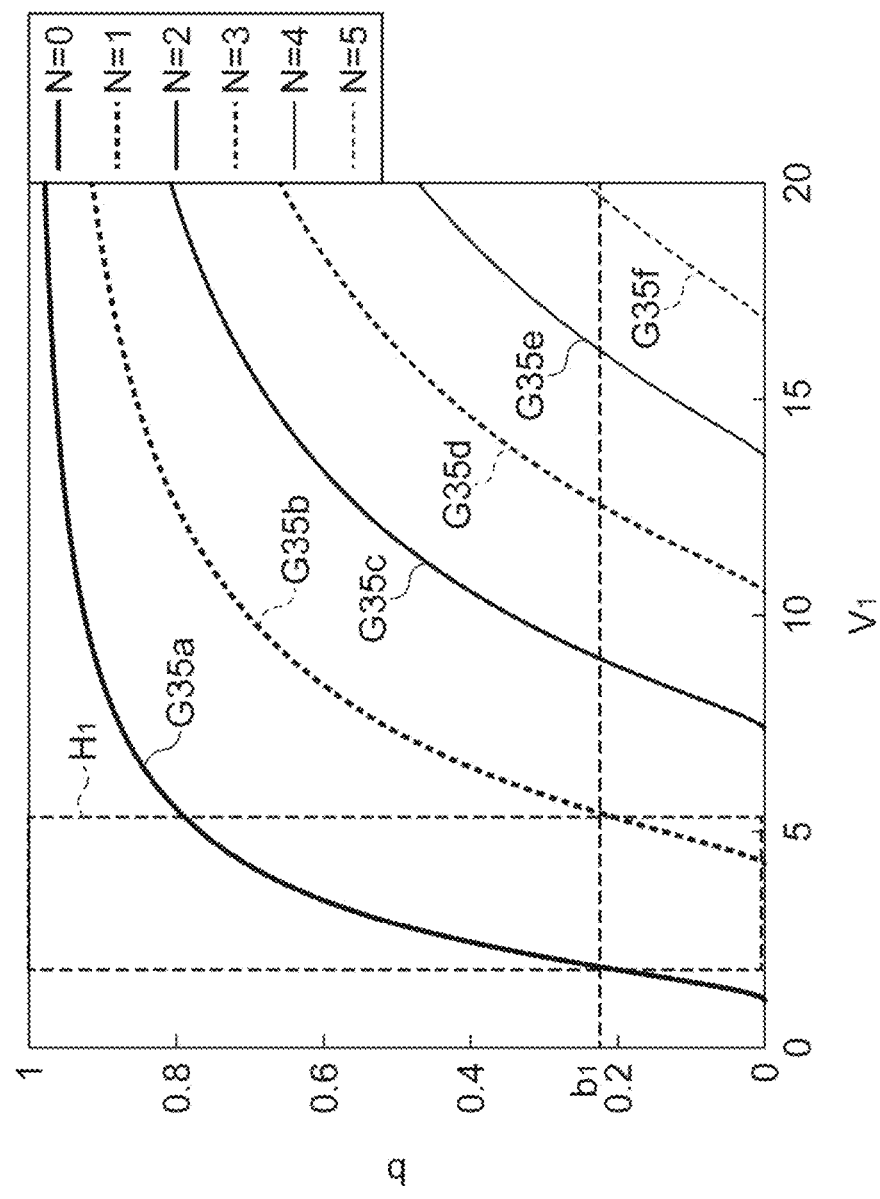
FIG. 46 is a graph illustrating a relationship between the normalized waveguide width $V_1$ of the optical waveguide layer and the normalized propagation coefficient b, expressed by formulas (16) and (17)

FIG. 45A is a table illustrating the refractive indices $n_1$, $n_2$, and $n_3$, the asymmetric parameter a' and the refractive index $n_{clad}$ of the lower cladding layer 11 used for calculation. In this case, FIG. 46 illustrates the relationship between the normalized waveguide width $V_1$ of the optical waveguide layer and the normalized propagation coefficient b expressed by the above-described formulas (16) and (17). In FIG. 46, graphs G35a to G35f illustrate cases of mode order N=0 to 5, respectively. In this graph, the range in which the guided mode is the fundamental mode (that is, N=0) alone corresponds to the range having one solution to the normalized waveguide width $V_1$, being inside the range $H_1$. The range $H_1$ corresponds to the range having a lower limit value of normalized waveguide width $V_{clad}$ corresponding to N=0 when the normalized propagation coefficient b is a value $b_1$ and having an upper limit value of normalized waveguide width $V_1$ corresponding to N=1 when the normalized propagation coefficient b is the value $b_1$. FIG. 45B is a table illustrating a calculation result of the lower limit value and the upper limit value.

Figure 48:
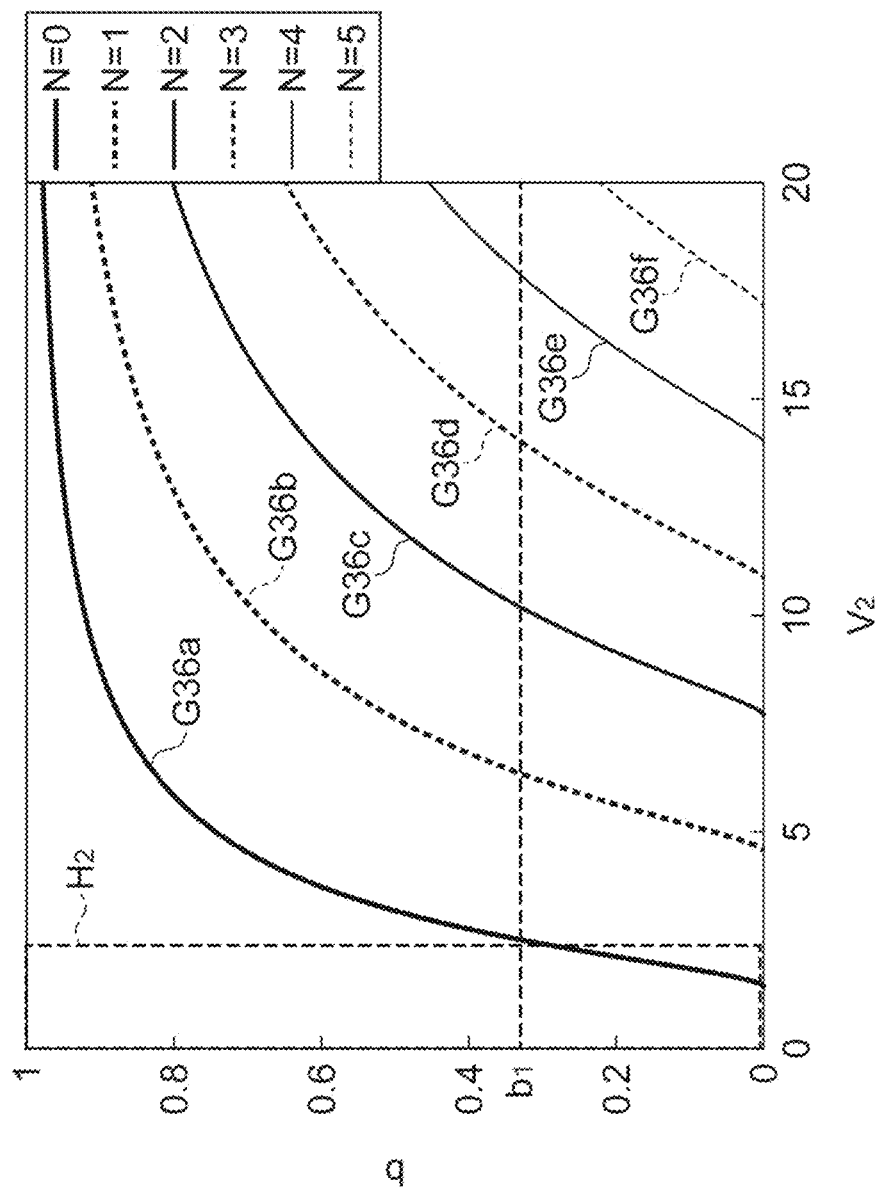
FIG. 48 is a graph illustrating a relationship between the normalized waveguide width $V_2$ of the contact layer and the normalized propagation coefficient b, expressed by formulas (23) and (24)

FIG. 47A is a table illustrating the refractive indices $n_4$, $n_5$, and $n_6$, the asymmetric parameter a', and the refractive index $n_{clad}$ of the lower cladding layer 11 used for calculation. In this case, FIG. 48 illustrates the relationship between the normalized waveguide width $V_2$ of the contact layer 14 and the normalized propagation coefficient b expressed by the above-described formulas (23) and (24). In FIG. 48, graphs G36a to G36f illustrate cases of mode order N=0 to 5, respectively. In this graph, the range in which there is no generation of the guided mode due to the contact layer 14 and the guided mode of the laser device 1A is the fundamental mode of the optical waveguide layer alone corresponds to a range having no solution to the normalized waveguide width V₂, being inside the range H₂. The definition of the range H₂ is similar to that of the GaAs-based compound semiconductor described above. FIG. 47B is a table illustrating a calculation result of the upper limit value.

Figure 49:
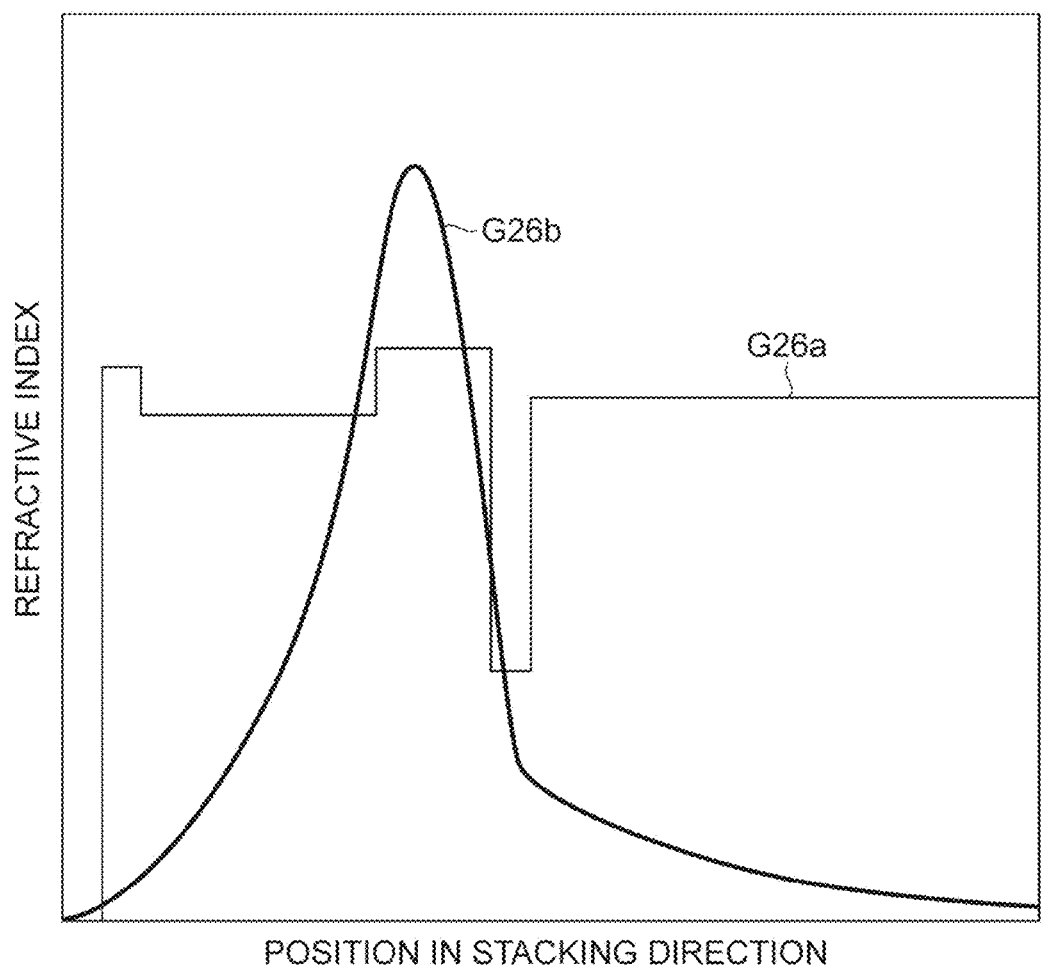
FIG. 49 illustrates the refractive index distribution and the mode distribution of the laser device having the layer structure illustrated in FIG. 44.

FIG. 49 illustrates refractive index distribution G26a and mode distribution G26b of the laser device 1A having a layer structure illustrated in FIG. 44. It can be seen that solely the fundamental mode is generated noticeably and the higher-order mode is suppressed.

Second Embodiment

Figure 50:
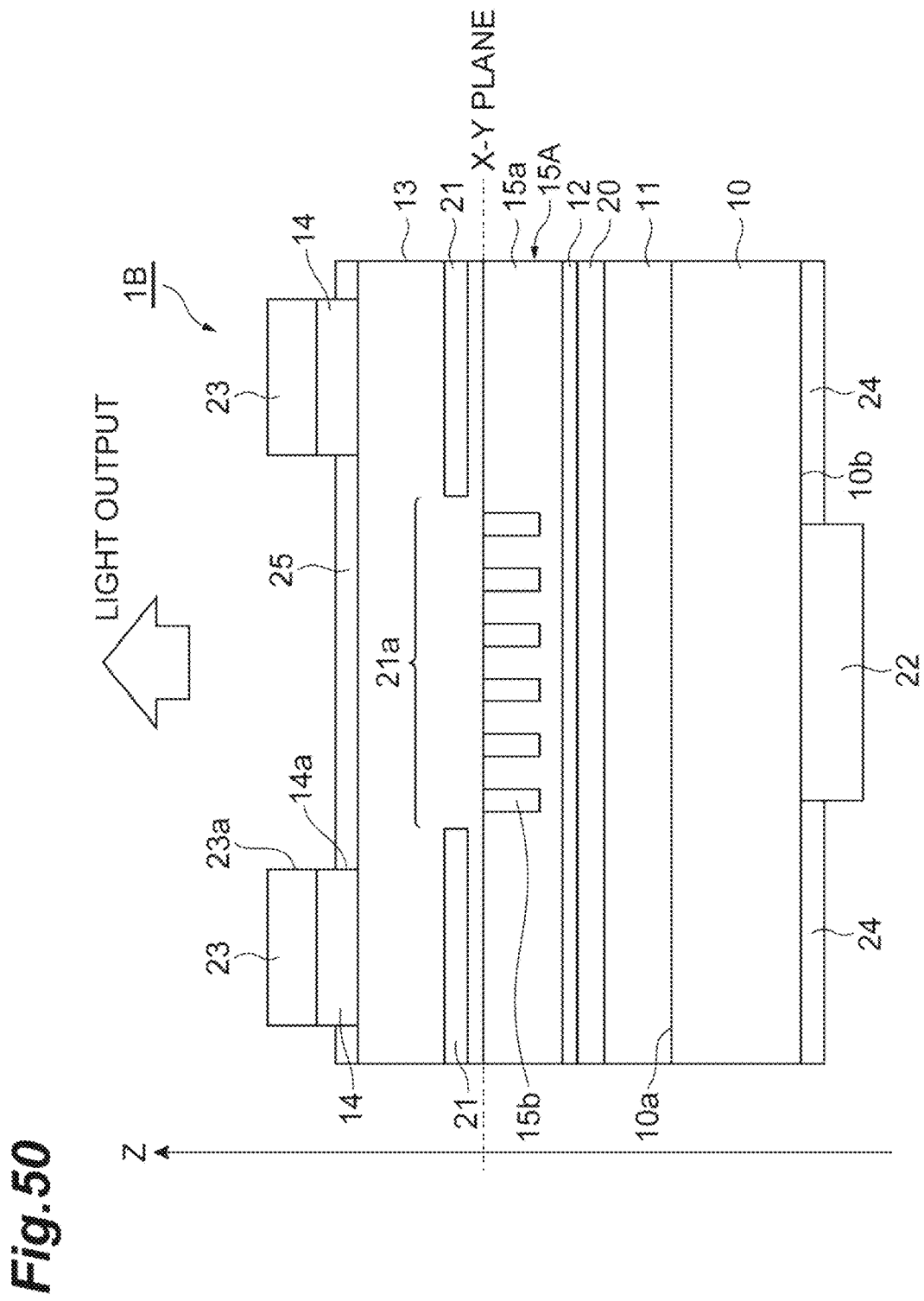
FIG. 50 is a diagram illustrating a configuration of a laser device as an example of a semiconductor light-emitting device according to a second embodiment.
Figure 51:
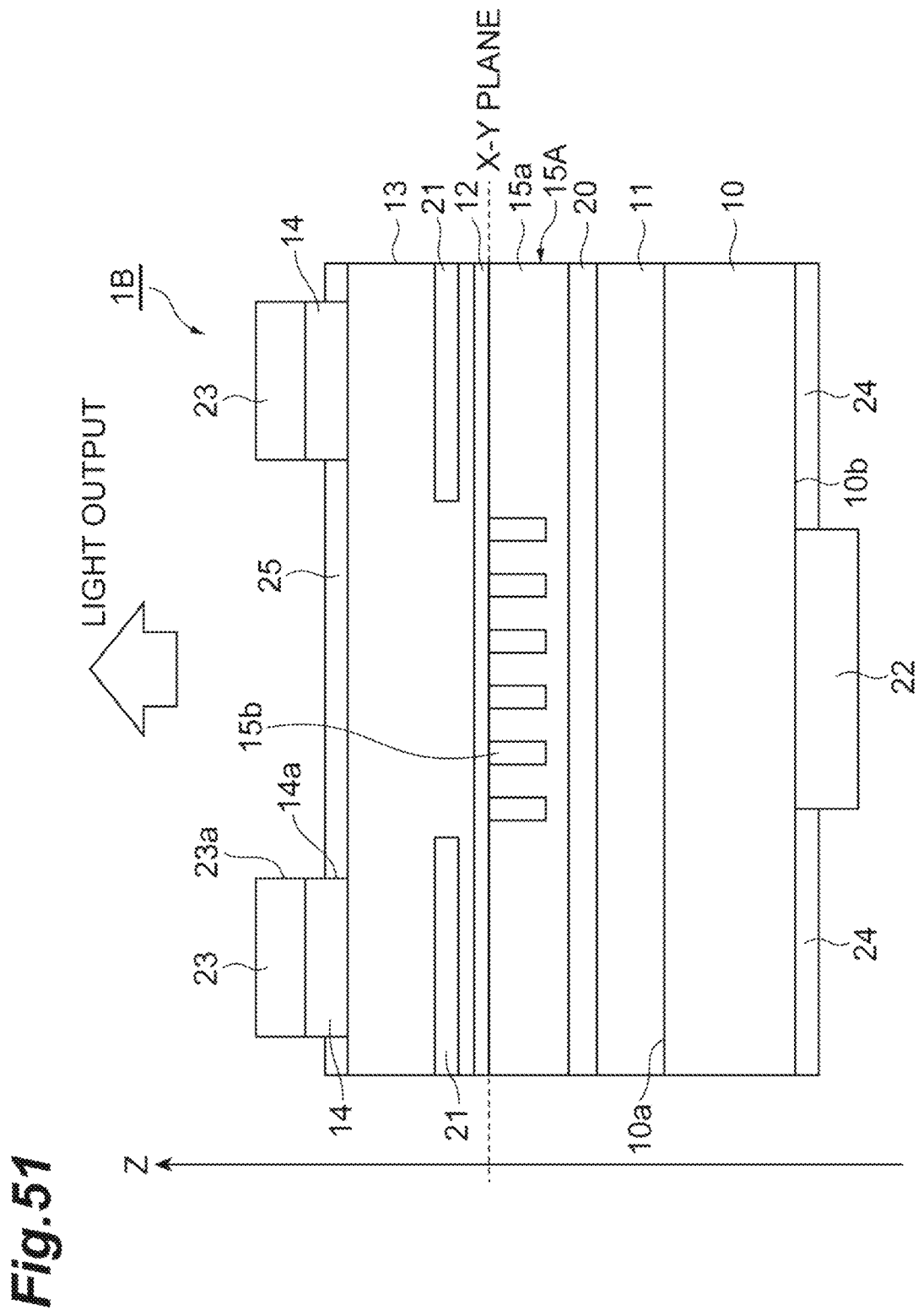
FIG. 51 is a diagram illustrating a case where a phase modulation layer is provided between a lower cladding layer and an active layer as another example of the semiconductor light-emitting device according to the second embodiment.

FIG. 50 is a diagram illustrating a configuration of a laser device 1B as an example of the semiconductor light-emitting device according to a second embodiment. FIG. 51 is a diagram illustrating another example of the semiconductor light-emitting device according to the second embodiment. The laser device 1B is a laser light source that forms a standing wave within the X-Y plane direction and outputs a phase-controlled plane wave in the Z direction. Similarly to the first embodiment, the laser device 1B outputs an optical image of a two-dimensional arbitrary shape including a direction perpendicular to the main surface 10a of the semiconductor substrate 10 and including a direction inclined with respect to this direction. Note that while the laser device 1A according to the first embodiment outputs the optical image transmitted through the semiconductor substrate 10 from the back surface of the device, the laser device 1B according to the present embodiment outputs the optical image from the upper cladding layer 13 side toward the active layer 12.

The laser device 1B includes the lower cladding layer 11, the active layer 12, the upper cladding layer 13, the contact layer 14, the phase modulation layer 15A, a light reflection layer 20, and a current confinement layer 21. The lower cladding layer 11 is provided on the semiconductor substrate 10. The active layer 12 is provided on the lower cladding layer 11. The upper cladding layer 13 is provided on the active layer 12. The contact layer 14 is provided on the upper cladding layer 13. The phase modulation layer 15A is provided between the active layer 12 and the upper cladding layer 13. The light reflection layer 20 is provided between the active layer 12 and the lower cladding layer 11. The current confinement layer 21 is provided inside the upper cladding layer 13. The configurations (suitable materials, band gap, refractive index, or the like) of the individual layers 11 to 14 and 15A are similar to those in the first embodiment. Note that the light reflection layer 20 may be omitted in a case where light absorption in the semiconductor substrate 10 does not cause a problem.

The structure of the phase modulation layer 15A is similar to the structure of the phase modulation layer 15A described in the first embodiment (refer to FIG. 3). Alternatively, the phase modulation layer 15A may be replaced with the phase modulation layer 15B (refer to FIG. 15) illustrated in the modification. An optical guide layer may be provided at least one of between the active layer 12 and the upper cladding layer 13 and between the active layer 12 and the lower cladding layer 11, as necessary. As illustrated in FIG. 51, the phase modulation layer 15A may be provided between the lower cladding layer 11 and the active layer 12.

Figure 52:
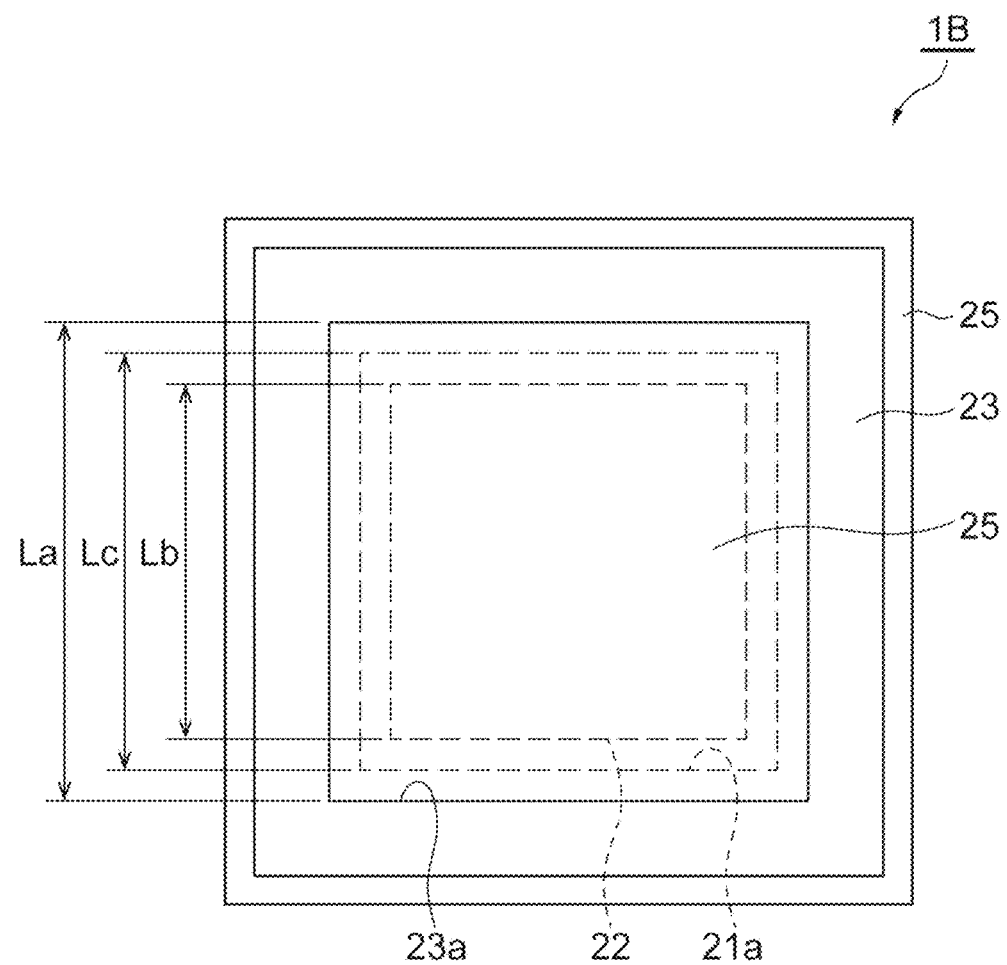
FIG. 52 is a plan view of a laser device as seen from the electrode side (front surface side)

The laser device 1B further includes an electrode 23 provided on the contact layer 14 and an electrode 22 provided on the back surface 10b of the semiconductor substrate 10. The electrode 23 forms ohmic contact with the contact layer 14, while the electrode 22 forms ohmic contact with the semiconductor substrate 10. FIG. 52 is a plan view of the laser device 1B as viewed from the electrode 23 side (front surface side). As illustrated in FIG. 52, the electrode 23 has a plane shape such as a frame-like shape (framework shape), and includes an opening 23a. While FIG. 52 illustrates an exemplary case where the electrode 23 has a square frame-like shape, the electrode 23 may have various plane shapes such as an annular shape. Moreover, the shape of the electrode 22 indicated by the hidden line in FIG. 52 is similar to the shape of the opening 23a of the electrode 23, and is, for example, square or circular. An inner diameter La (length of one side in a case where the shape of the opening 23a is square) of the opening 23a of the electrode 23 is, for example, 20 μm to 50 μm.

Referring again to FIG. 50. The contact layer 14 according to the present embodiment has a plane shape similar to the electrode 23. That is, the central portion of the contact layer 14 is removed by etching to form an opening 14a, leading to the plane shape such as the frame-like shape (framework shape) of the contact layer 14. Light emitted from the laser device 1B passes through the opening 14a of the contact layer 14 and the opening 23a of the electrode 23. By allowing the light to pass through the opening 14a of the contact layer 14, it is possible to avoid light absorption in the contact layer 14 and enhance light emission efficiency. In a case, however, where the light absorption in the contact layer 14 is acceptable, the contact layer 14 may be formed to cover the entire surface of the upper cladding layer 13 without having the opening 14a. By allowing the light to pass through the opening 23a of the electrode 23, it is possible to suitably emit light from the front surface side of the laser device 1B without being blocked by the electrode 23.

The front surface of the upper cladding layer 13 (or the front surface of the contact layer 14 in a case where the opening 14a is not provided) exposed from the opening 14a of the contact layer 14 is covered with an antireflection film 25. An antireflection film 25 may also be provided outside the contact layer 14. Portions other than the electrode 22 on the back surface 10b of the semiconductor substrate 10 are covered with a protective film 24. The protective film 24 is formed of a material similar to the material of the protective film 18 according to the first embodiment. The antireflection film 25 is formed of a material similar to the material of the antireflection film 19 according to the first embodiment.

The light reflection layer 20 reflects the light generated in the active layer 12 toward the front surface side of the laser device LB (the upper cladding layer 13 side with respect to the active layer 12). The light reflection layer 20 is formed with a distributed Bragg reflector (DBR) layer in which a plurality of layers having different refractive indices is alternately stacked, for example. While the light reflection layer 20 of the present embodiment is provided between the active layer 12 and the lower cladding layer 11, the light reflection layer 20 may be provided between the lower cladding layer 11 and the semiconductor substrate 10.

In one example, the semiconductor substrate 10 is a GaAs substrate, while each of the lower cladding layer 11, the active layer 12, the phase modulation layer 15A, the upper cladding layer 13, the contact layer 14, and the light reflection layer 20 is a compound semiconductor layer formed with elements included in a group constituted with group III elements Ga, Al, and In and Group V element As. Specifically, the lower cladding layer 11 is an AlGaAs layer, the active layer 12 has a multiple quantum well structure (barrier layer: AlGaAs/well layer: InGaAs), the basic layer 15a of the phase modulation layer 15A is GaAs, the modified refractive index region 15b is a void space, the upper cladding layer 13 is an AlGaAs layer, the contact layer 14 is a GaAs layer, and the light reflection layer 20 is an AlGaAs layer.

In another example, the semiconductor substrate 10 is a GaAs substrate, while each of the lower cladding layer 11, the active layer 12, the phase modulation layer 15A, the upper cladding layer 13, the contact layer 14, and the light reflection layer 20 is a compound semiconductor layer that is not formed solely with the elements included in a group constituted with group III elements Ga, Al, and In and Group V element As. Specifically, the lower cladding layer 11 is an AlGaInP layer, the active layer 12 has a multiple quantum well structure (barrier layer: AlGaInP or GaInP/well layer: GaInP), the basic layer 15a of the phase modulation layer 15A is AlGaInP or GaInP, the modified refractive index region 15b is a void space, the upper cladding layer 13 is an AlGaInP layer, the contact layer 14 is a GaAs layer, and the light reflection layer 20 is an AlGaInP layer or an AlGaAs layer.

In still another example, the semiconductor substrate 10 is an InP substrate, while each of the lower cladding layer 11, the active layer 12, the phase modulation layer 15A, the upper cladding layer 13, the contact layer 14, and the light reflection layer 20 may be formed with a compound semiconductor that is not formed solely with elements included in a group constituted with Group II elements Ga, Al, and In and a group V element As, that is, may be formed with, for example, an InP-based compound semiconductor. Alternatively, the semiconductor substrate 10 may be an GaN substrate, while each of the lower cladding layer 11, active layer 12, the phase modulation layer 15A, the upper cladding layer 13, the contact layer 14, and the light reflection layer 20 may be formed with a compound semiconductor layer that is not formed solely with elements included in a group constituted with Group III elements Ga, Al, and In and a group V element As, that is, may be formed with, for example, a nitride-based compound semiconductor.

The lower cladding layer 11 and the light reflection layer 20 are provided with the same conductivity type as that of the semiconductor substrate 10, and the upper cladding layer 13 and the contact layer 14 are provided with a conductivity type opposite to that of the semiconductor substrate 10. In one example, the semiconductor substrate 10, the lower cladding layer 11 and the light reflection layer 20 are n-type and the upper cladding layer 13 and the contact layer 14 are p-type. In a case of being provided between the active layer 12 and the lower cladding layer 11, the phase modulation layer 15A has the same conductivity type as that of the semiconductor substrate 10, and in a case of being provided between the active layer 12 and the upper cladding layer 13, the phase modulation layer 15A has a conductivity type opposite to that of the semiconductor substrate 10. The impurity concentration is, for example, $1 \times 10^{17}/cm^3$ to $1 \times 10^{21}/cm^3$.

The current confinement layer 21 has a structure that makes it difficult for an electric current to pass (or prohibits passing), and has an opening 21a in the central portion. As illustrated in FIG. 52, the plane shape of the opening 21a is similar to the shape of the opening 23a of the electrode 23, and is, for example, square or circular. The current confinement layer 21 is an Al oxide layer formed by oxidizing a layer containing Al at a high concentration, for example. Alternatively, the current confinement layer 21 may be a layer formed by injecting protons (H$^+$) into the upper cladding layer 13. Alternatively, the current confinement layer 21 may have an inverse pn junction structure in which a semiconductor layer having a conductivity type opposite to that of the semiconductor substrate 10 and a semiconductor layer having the same conductivity type as the semiconductor substrate 10 are stacked in order.

An inner diameter Lc (length of one side in a case where the shape of the opening 21a is square) of the opening 21a of the current confinement layer 21 is smaller than the inner diameter La (length of one side in a case where the shape of the opening 23a is square) of the opening 23a of the electrode 23. When viewed in the normal direction (Z direction) of the main surface 10a, the opening 21a of the current confinement layer 21 is accommodated in the opening 23a of the electrode 23.

Exemplary dimensions of the laser device 1B of the present embodiment will be described. The inner diameter La (length of one side in a case where the shape of the opening 23a is square) of the opening 23a of the electrode 23 is in a range of 5 μm to 100 μm, for example, 50 μm. A thickness ta of the phase modulation layer 15A is, for example, in a range of 100 nm to 400 nm, for example, 200 nm. A distance tb between the current confinement layer 21 and the contact layer 14 is in a range of 2 μm to 50 μm. In other words, the distance tb is within a range of 0.02 La to 10 La (for example, 0.1 La), and is within a range of 5.0 ta to 500 ta (for example, 25 ta). A thickness tc of the upper cladding layer 13 is larger than the distance tb and is in a range of 2 μm to 50 pin. In other words, the thickness tc is within a range of 0.02 La to 10 La (for example, 0.1 La), and is within a range of 5.0 ta to 500 ta (for example, 25 ta). A thickness td of the lower cladding layer 11 is in a range of 1.0 μm to 3.0 μm (for example, 2.0 μm).

When a driving current is supplied between the electrode 22 and the electrode 23, the driving current reaches the active layer 12. At this time, the current flowing between the electrode 23 and the active layer 12 sufficiently diffuses in the thick upper cladding layer 13 and passes through the opening 21a of the current confinement layer 21, whereby the current diffuses in the vicinity of the central portion of the active layer 12 uniformly. Then, recombination of electrons and holes occurs in the active layer 12, and the active layer 12 emits light. The electrons and holes contributing to the light emission and the generated light are efficiently confined between the lower cladding layer 11 and the upper cladding layer 13. The laser light emitted from the active layer 12 enters the inside of the phase modulation layer 15A and forms a predetermined mode corresponding to the lattice structure inside the phase modulation layer 15A. The laser light emitted from the inside of the phase modulation layer 15A is reflected by the light reflection layer 20 and is emitted from the upper cladding layer 13 through the opening 14a and the opening 23a to the outside. At this time, the zero-order light of the laser light is emitted in a direction perpendicular to the main surface 10a. In contrast, the signal light of the laser light is emitted in a two-dimensional arbitrary direction including a direction perpendicular to the main surface 10a and a direction inclined with respect to this direction. The light that forms a desired optical image is the signal light, and the zero-order light is not used in the present embodiment.

With the laser device 1B according to the present embodiment described above, it is possible to suppress generation of higher-order modes and reduce the noise light having a mesh-formed dark portion superposed on the beam pattern similarly to the laser device 1A of the first embodiment. Moreover, by outputting an optical image from the front surface of the active layer 12 on the side of the upper cladding layer 13 as illustrated in the present embodiment, it is possible to avoid light absorption in the semiconductor substrate 10 and enhance light emission efficiency of the laser device 1B. This configuration is effective particularly in the case of outputting an optical image in an infrared region (for example, wavelength 690 nm).

Figure 53A:
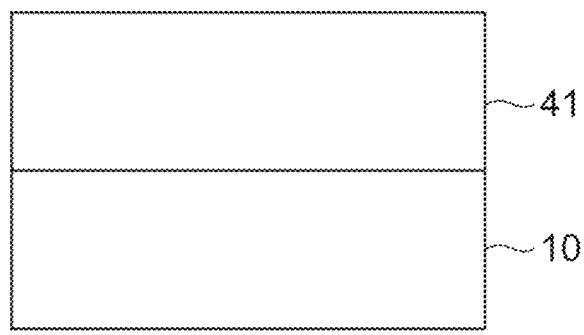
FIGS. 53A to 53C are diagrams for explaining a manufacturing method for the laser device according to the second embodiment (case where a current confinement layer is formed by oxidation)
Figure 53B:
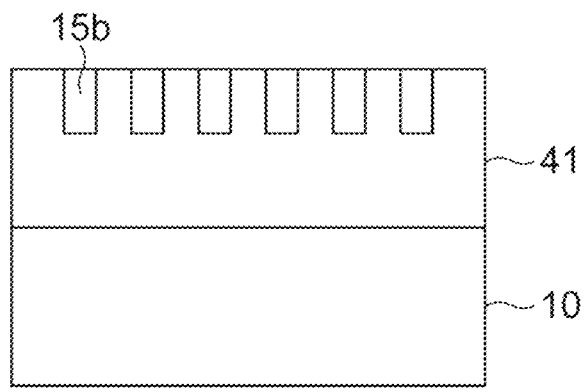
Figure 53C:
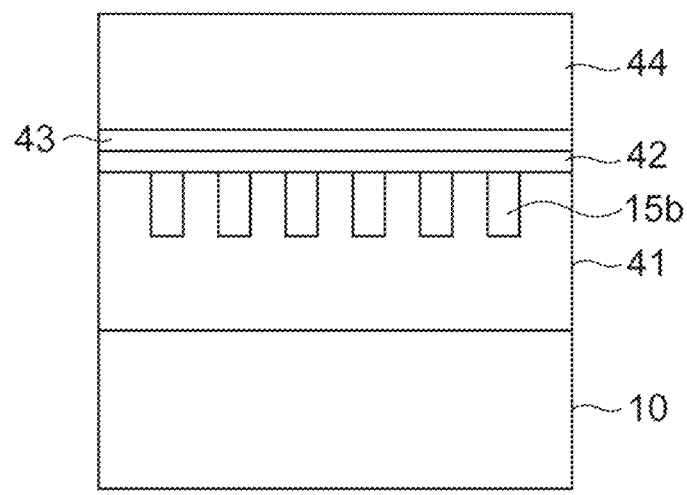
Figure 54A:
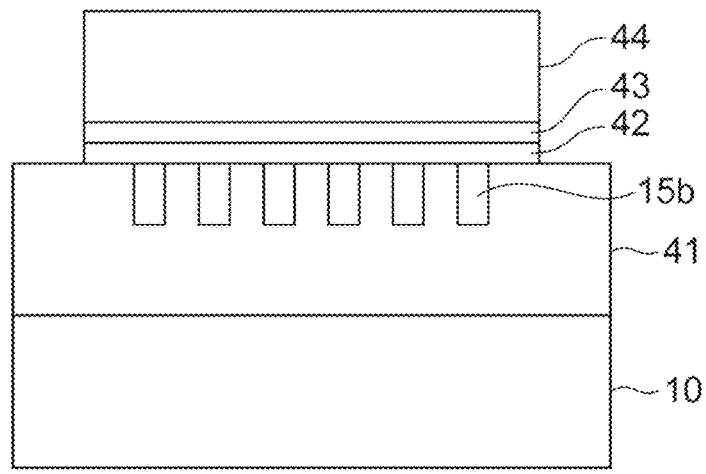
FIGS. 54A and 54B are diagrams for explaining a manufacturing method for the laser device according to the second embodiment (case where the current confinement layer is formed by oxidation)
Figure 54B:
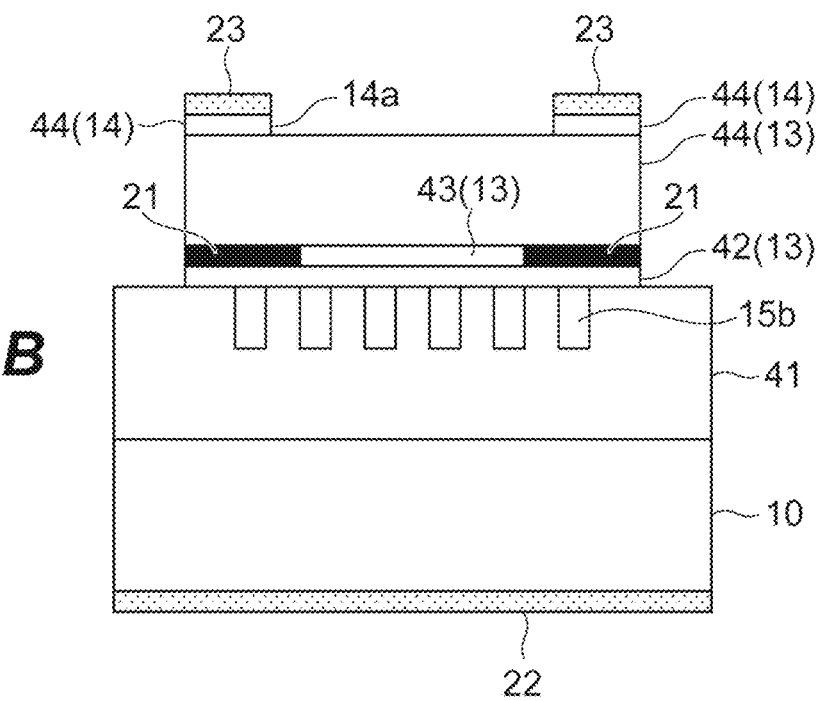
Figure 55A:
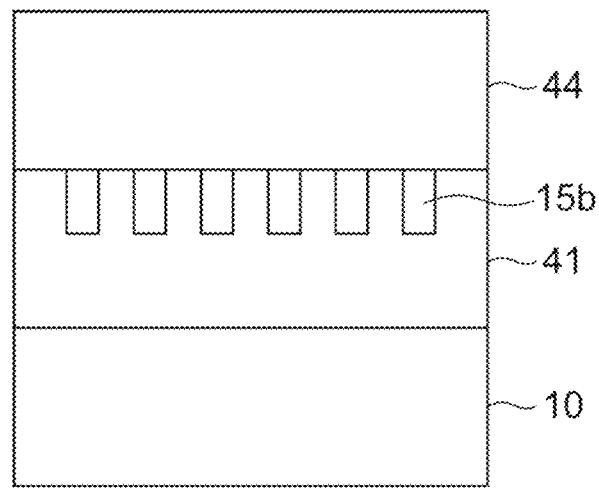
FIGS. 55A and 55B are diagrams for explaining a manufacturing method for the laser device according to the second embodiment (case where the current confinement layer is formed by proton injection)
Figure 55B:
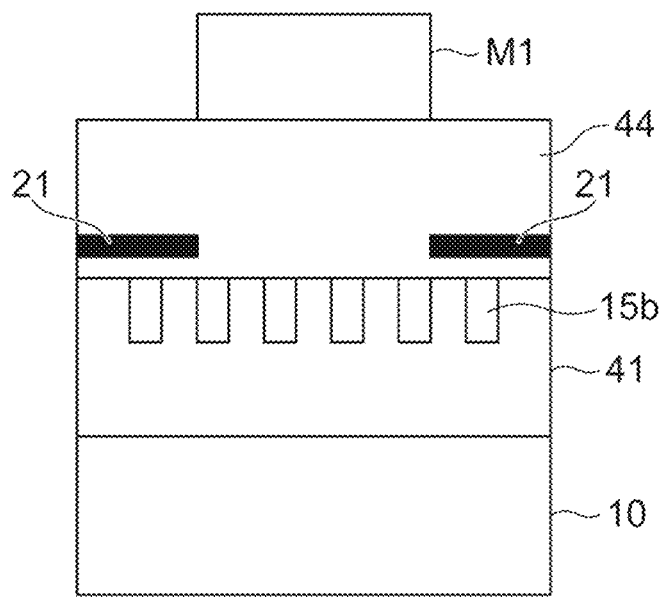
Figure 56:
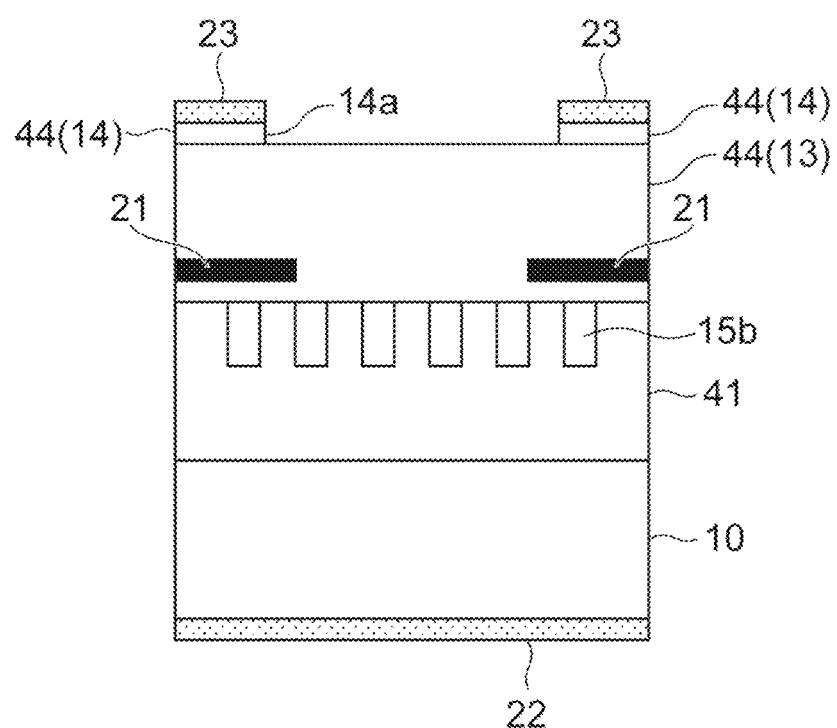
FIG. 56 is a diagram for explaining a manufacturing method for the laser device according to the second embodiment (case where the current confinement layer is formed by proton injection)

FIGS. 53A to 55B, 56, and 57A to 60B are diagrams illustrating a manufacturing method for the laser device 1B according to the present embodiment. FIGS. 53A to 53C and 54A to 54B illustrate a manufacturing method in a case where the current confinement layer 21 is formed by oxidation. FIGS. 55A to 55B and 56 illustrate a manufacturing method in a case where the current confinement layer 21 is formed by proton injection. FIGS. 57A to 57C and 58A to 58B illustrate a first manufacturing method in a case where the current confinement layer 21 is formed by an inverse pn junction structure. FIGS. 59A to 59C and 60A to 60B illustrate a second manufacturing method in a case where the current confinement layer 21 is formed by an inverse pn junction structure.

(Case where the Current Confinement Layer is Formed by Oxidation)

First, as illustrated in FIG. 53A, a first stacked portion 41 is epitaxially grown on the semiconductor substrate 10 (first growth step). The first stacked portion 41 includes the lower cladding layer 11, the light reflection layer 20, the active layer 12, and the basic layer 15a of the phase modulation layer 15A. That is, this step includes a first step, a second step, and a first half of a fifth step of the present embodiment, and successively grows the lower cladding layer 11, the light reflection layer 20, the active layer 12, and the basic layer 15a of the phase modulation layer 15A. Methods for growing the first stacked portion 41 include metal organic chemical vapor deposition (MOCVD). It is allowable to form a thin antioxidation layer (for example, an undoped GaInP layer in a case where the semiconductor substrate 10 is a GaAs substrate) on the basic layer 15a. Next, using an ordinary photolithography technique, an etching mask is formed on the basic layer 15a of the phase modulation layer 15A, which is the uppermost layer of the first stacked portion 41. By etching the basic layer 15a through the opening of the etching mask, a plurality of modified refractive index regions 15b illustrated in FIG. 53B is formed (modified refractive index region forming step). The modified refractive index region forming step corresponds to a latter half of the fifth step of the present embodiment. These steps results in formation of the phase modulation layer 15A including the plurality of modified refractive index regions 15b inside the basic layer 15a.

Subsequently, as illustrated in FIG. 53C, semiconductor layers 42 and 43 and a second stacked portion 44 are successively epitaxially grown on the phase modulation layer 15A (second growth step). The second growth step includes a third step and a fourth step of the present embodiment. Exemplary methods of growing the semiconductor layers 42 and 43 and the second stacked portion 44 include MOCVD. The semiconductor layer 42 is a layer to be a portion of the upper cladding layer 13 and includes the same composition as that of the upper cladding layer 13 (first half of the third step). The semiconductor layer 43 is a layer for forming the current confinement layer 21, and is an Al-containing layer having a high Al composition, for example. In a case where the semiconductor substrate 10 is a GaAs substrate, the semiconductor layer 43 is an AlGaAs layer or AlAs layer having an Al composition ratio of 95% or more. The thickness of the semiconductor layer 43 is, for example, 5 nm to 50 nm (typically about 20 nm or less). The second stacked portion 44 includes a remaining portion of the upper cladding layer 13 (latter half of the third step) and the contact layer 14 (fourth step).

Subsequently, as illustrated in FIG. 54A, the semiconductor layers 42 and 43 and the second stacked portion 44 are processed in a mesa shape by etching the semiconductor layers 42 and 43 and the second stacked portion 44. Subsequently, as illustrated in FIG. 54B, by performing steam oxidation from the periphery of the semiconductor layer 43, peripheral portions excluding the central portion of the semiconductor layer 43 is oxidized. This operation results in formation of the current confinement layer 21 mainly containing insulating AlO. The non-oxidized central portion of the semiconductor layer 43 becomes the opening portion of the current confinement layer 21 and constitutes a portion of the upper cladding layer 13. Thereafter, by etching a portion of the contact layer 14 of the second stacked portion 44, an opening 14a of the contact layer 14 is formed, an electrode 23 is formed on the contact layer 14, and an electrode 22 is formed on the back surface of the semiconductor substrate 10. The laser device 1B is fabricated through the above steps.

In a case where the current confinement layer 21 is formed by oxidation as described above, as compared with the case where the current confinement layer 21 is formed by proton injection, it is possible to control the position of the current confinement layer 21 in the thickness direction of the laser device 1B (in the Z direction) with higher accuracy even in a case where the upper cladding layer 13 is thick. Furthermore, it is possible to form the current confinement layer 21 without damaging the upper cladding layer 13 and the contact layer 14. Moreover, compared with the case where the current confinement layer 21 is formed by an inverse pn junction structure, it is possible to suppress an increase in loss of the dopant due to diffusion into the upper cladding layer 13 and suppress a change in doping concentration.

(Case where the Current Confinement Layer is Formed by Proton Injection)

Similarly to the case of "Case where the current confinement layer is formed by oxidation", the first stacked portion 41 including the plurality of modified refractive index regions 15b is formed on the semiconductor substrate 10 (first growth step and modified refractive index region forming step) as illustrated in FIG. 55A. That is, the first growth step and the modified refractive index region forming step include the first step, the second step, and the fifth step of the present embodiment. Thereafter, the second stacked portion 44 is epitaxially grown on the first stacked portion 41 (second growth step). The second growth step includes the third step and the fourth step of the present embodiment. Subsequently, as illustrated in FIG. 55B, a resist mask M1 is formed on the second stacked portion 44. The resist mask M1 has an outer edge along the contour of the opening 21a of the current confinement layer 21. Proton (H$^+$) is injected into the portion of the second stacked portion 44 exposed from the resist mask M1. This procedure forms the current confinement layer 21, which is a region of high resistance including high concentration protons. After removal of the resist mask M1, as illustrated in FIG. 56, by etching a portion of the contact layer 14 of the second stacked portion 44, the opening 14a of the contact layer 14 is formed, electrode 23 is formed on the contact layer 14, and furthermore, an electrode 22 is formed on the back surface of the semiconductor substrate 10. The laser device 1B is fabricated through the above steps.

As described above, in a case where the current confinement layer 21 is formed by proton injection, it is possible to control the inner diameter of the opening 21a with higher accuracy as compared with the case of formation by oxidation. Moreover, compared to the case where the current confinement layer 21 is formed by an inverse pn junction structure, it is possible to suppress an increase in loss due to diffusion of the dopant into the upper cladding layer 13 and suppress a change in doping concentration.

(Case where Current Confinement Layer is Formed by Inverse Pn Junction Structure: First Manufacturing Method)

Figure 57A:
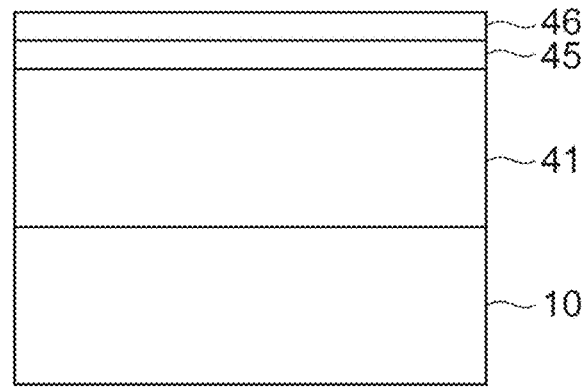
FIGS. 57A to 57C are diagrams for explaining a manufacturing method for the laser device according to the second embodiment (case where the current confinement layer is formed by inverse pn junction structure (first manufacturing method)

First, as illustrated in FIG. 57A, the first stacked portion 41, a semiconductor layer 45, and a semiconductor layer 46 are successively epitaxially grown on the semiconductor substrate 10 (first growth step). The first growth step includes the first step, the second step, and a first half of the fifth step of the present embodiment. The semiconductor layer 45 is a layer of a conductivity type (for example, p-type) opposite to that of the semiconductor substrate 10, for example, and it is a p-type AlGaInP layer in a case where the semiconductor substrate 10 is a GaAs substrate. The semiconductor layer 46 is a layer of a conductivity type (for example, n-type) same as that of the semiconductor substrate 10, for example, and it is an n-type AlGaInP layer in a case where the semiconductor substrate 10 is a GaAs substrate. The thickness of each of the semiconductor layers 45 and 46 is 100 nm, for example.

Figure 57B:
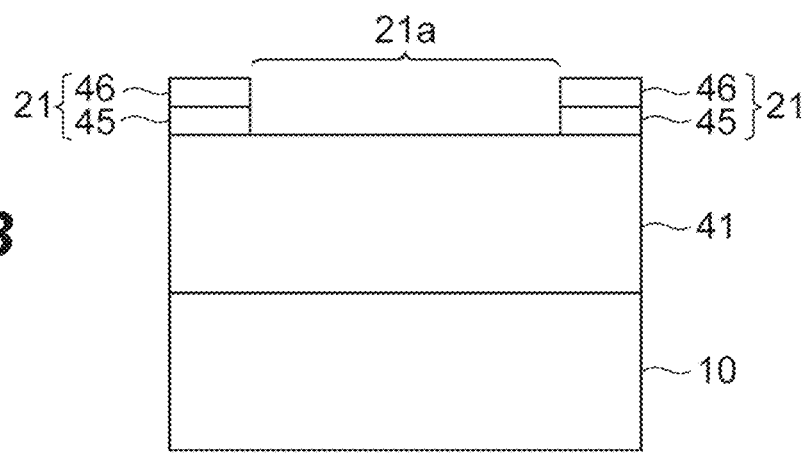
Figure 57C:
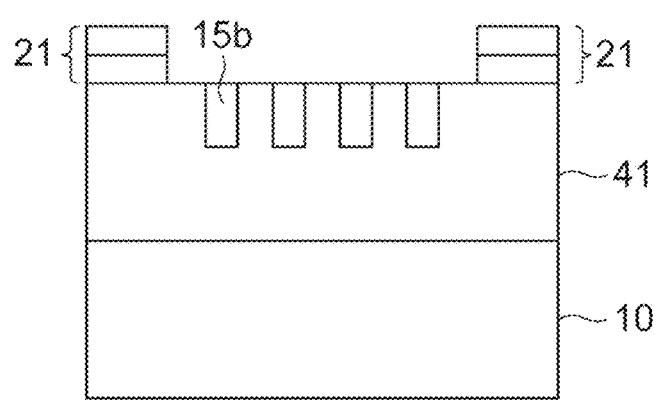

Next, as illustrated in FIG. 57B, an etching mask is formed on the semiconductor layer 46 by an ordinary photolithography technique, and the semiconductor layers 45 and 46 are etched through the opening in the etching mask until the first stacked portion 41 is exposed. This procedure forms the current confinement layer 21 having the inverse pn junction structure and the opening 21a. Subsequently, an etching mask is formed on the basic layer 15a of the first stacked portion 41 exposed from the opening 21a by using a microfabrication technique such as electron beam lithography, and by etching the basic layer 15a through the opening of the etching mask, the plurality of modified refractive index regions 15b illustrated in FIG. 57C is formed (latter half of the fifth step of the present embodiment).

Figure 58A:
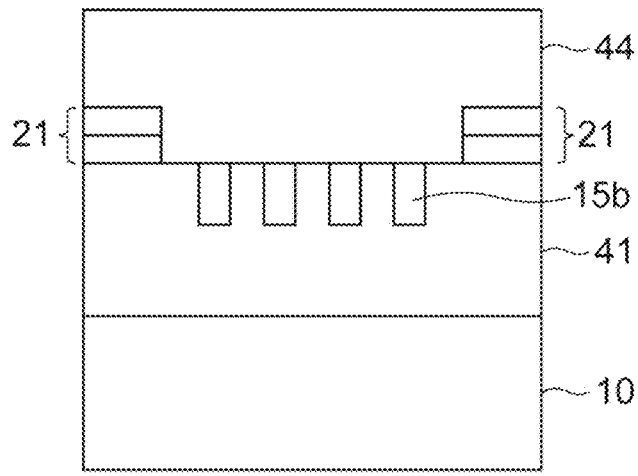
FIGS. 58A and 58B are diagrams for explaining the method for manufacturing the laser device according to the second embodiment (case where the current confinement layer is formed by an inverse pn junction structure (first manufacturing method))
Figure 58B:
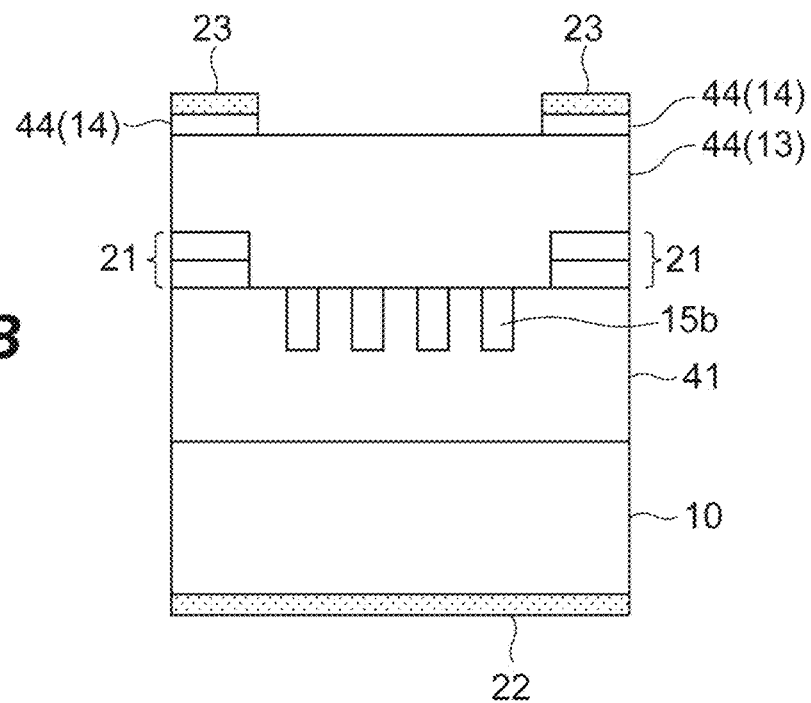

Subsequently, as illustrated in FIG. 58A, the second stacked portion 44 is epitaxially grown on the current confinement layer 21 and on the first stacked portion 41 exposed from the opening 21a of the current confinement layer 21 (second growth step). The second growth step includes a third step and a fourth step of the present embodiment. Thereafter, as illustrated in FIG. 58B, by etching a portion of the contact layer 14 of the second stacked portion 44, the opening 14a of the contact layer 14 is formed, the electrode 23 is formed on the contact layer 14, and the electrode 22 is formed on the back surface of the semiconductor substrate 10. The laser device 1B is fabricated through the above steps.

In a case where the current confinement layer 21 is formed by inverse pn junction structure as described above, it is possible to control the inner diameter of the opening 21a with higher accuracy as compared with the case of formation by oxidation. Moreover, in a case where the current confinement layer 21 is formed by proton injection, it is possible to control the position of the current confinement layer 21 in the thickness direction of the laser device 1B (in the Z direction) with higher accuracy even in a case where the upper cladding layer 13 is thick. Moreover, it is possible to form the current confinement layer 21 without damaging the upper cladding layer 13 and the contact layer 14. Furthermore, since the current confinement layer 21 can be formed solely by an ordinary semiconductor step such as semiconductor growth and etching, the current confinement layer 21 can be more easily formed as compared with the case where the current confinement layer 21 is formed by oxidation or proton injection.

(Case where Current Confinement Layer is Formed by Inverse Pn Junction Structure: Second Manufacturing Method)

Figure 59A:
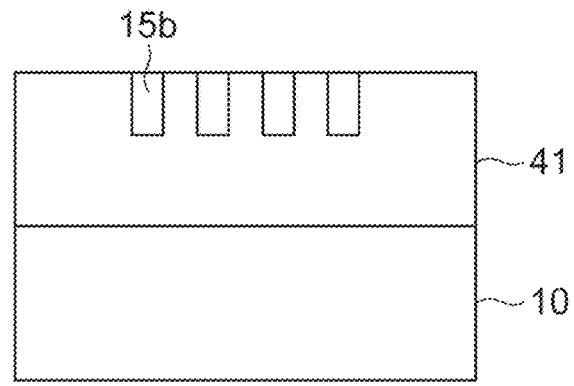
FIGS. 59A to 59C are diagrams for explaining the method for manufacturing the laser device according to the second embodiment (case where the current confinement layer is formed by an inverse pn junction structure (second manufacturing method))
Figure 59B:
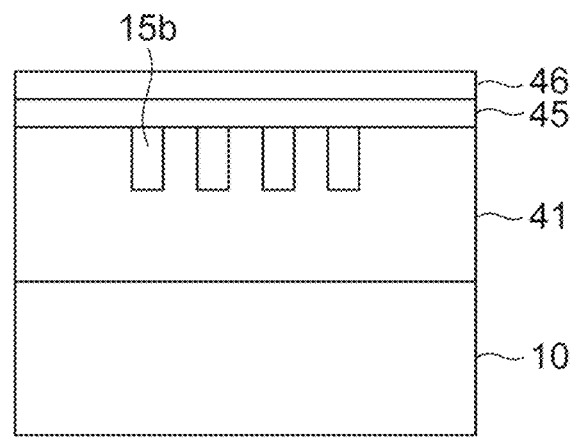
Figure 59C:
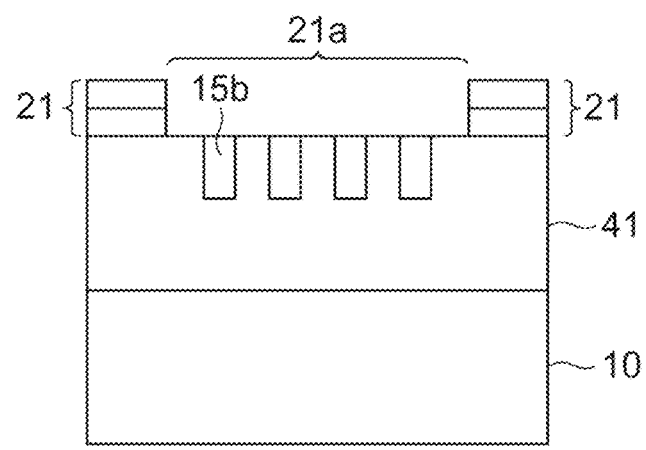

Similarly to the case of "Case where the current confinement layer is formed by oxidation", the first stacked portion 41 including the plurality of modified refractive index regions 15b is formed on the semiconductor substrate 10 (first growth step and modified refractive index region forming step) as illustrated in FIG. 59A. The first growth step and the modified refractive index region forming step include the first step, the second step, and the fifth step of the present embodiment. Next, as illustrated in FIG. 59B, the semiconductor layers 45 and 46 are successively epitaxially grown on the first stacked portion 41 (second growth step). The second growth step includes a third step and a fourth step of the present embodiment. The configuration (material and thickness) of each of the semiconductor layers 45 and 46 is similar to that in the above-described first manufacturing method. Subsequently, an etching mask is formed on the semiconductor layer 46 by an ordinary photolithography technique, and the semiconductor layers 45 and 46 are etched through the opening in the etching mask until the first stacked portion 41 is exposed. This procedure forms the current confinement layer 21 having the inverse pn junction structure and the opening 21a, as illustrated in FIG. 59C.

Figure 60A:
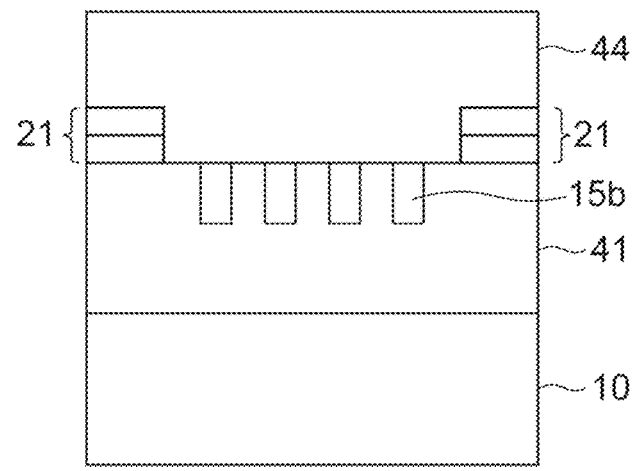
FIGS. 60A and 60B are diagrams for explaining the method for manufacturing the laser device according to the second embodiment (case where the current confinement layer is formed by an inverse pn junction structure (second manufacturing method))
Figure 60B:
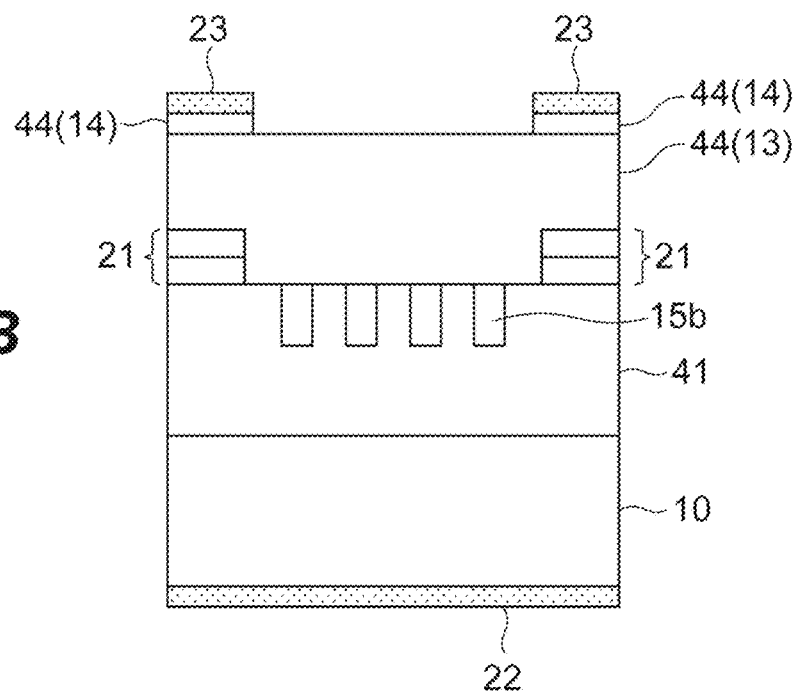

Subsequently, as illustrated in FIG. 60A, the second stacked portion 44 is epitaxially grown on the current confinement layer 21 and on the first stacked portion 41 exposed from the opening 21a of the current confinement layer 21 (third growth step). Thereafter, as illustrated in FIG. 60B, by etching a portion of the contact layer 14 of the second stacked portion 44, the opening 14a of the contact layer 14 is formed, the electrode 23 is formed on the contact layer 14, and the electrode 22 is formed on the back surface of the semiconductor substrate 10. The laser device 1B is fabricated through the above steps. Advantages of the second manufacturing method are similar to those of the first manufacturing method described above.

Specific Example of Second Embodiment

Now, a specific example of the laser device 1B according to the second embodiment will be described. FIG. 61 is a table illustrating a specific layer structure of the laser device 1B according to Example. As illustrated in FIG. 61, in Example, n-type GaAs is used as the semiconductor substrate 10, and an n-type GaAs buffer layer and the lower cladding layer 11 formed of n-type $(Al_{0.6}Ga_{0.4})_{0.5}In_{0.5}P$ are provided on the semiconductor substrate 10. On the lower cladding layer 11, provided is the active layer 12 having a multiple quantum well structure in which a barrier layer formed of undoped AlGaInP and a well layer formed of undoped GaInP are alternately stacked. The number of layers of the well layer is three, and the number of layers of the barrier layer is four. With the active layer 12, it is possible to generate light having a wavelength of 675 nm. On top of the active layer 12, provided are a carrier blocking layer formed of undoped $(Al_{0.7}Ga_{0.3})_{0.5}In_{0.5}P$, a lower layer portion of the phase modulation layer 15A constituted solely with the basic layer 15a formed of undoped AlGaInP, and an upper layer portion of the phase modulation layer 15A constituted by the basic layer 15a formed of undoped AlGaInP and the modified refractive index region 15b formed with a gap. On top of this, provided are the upper cladding layer 13 formed of p-type $(Al_{0.7}Ga_{0.3})_{0.5}In_{0.5}P$ and the contact layer 14 formed of p-type GaAs. The refractive indices, thicknesses, dopants and doping concentrations of these layers and the values of the optical confinement factor Γ are as illustrated in FIG. 61. The filling factor of the phase modulation layer 15A is 15%. Moreover, x in the table represents the composition ratio of Al.

Figure 62:
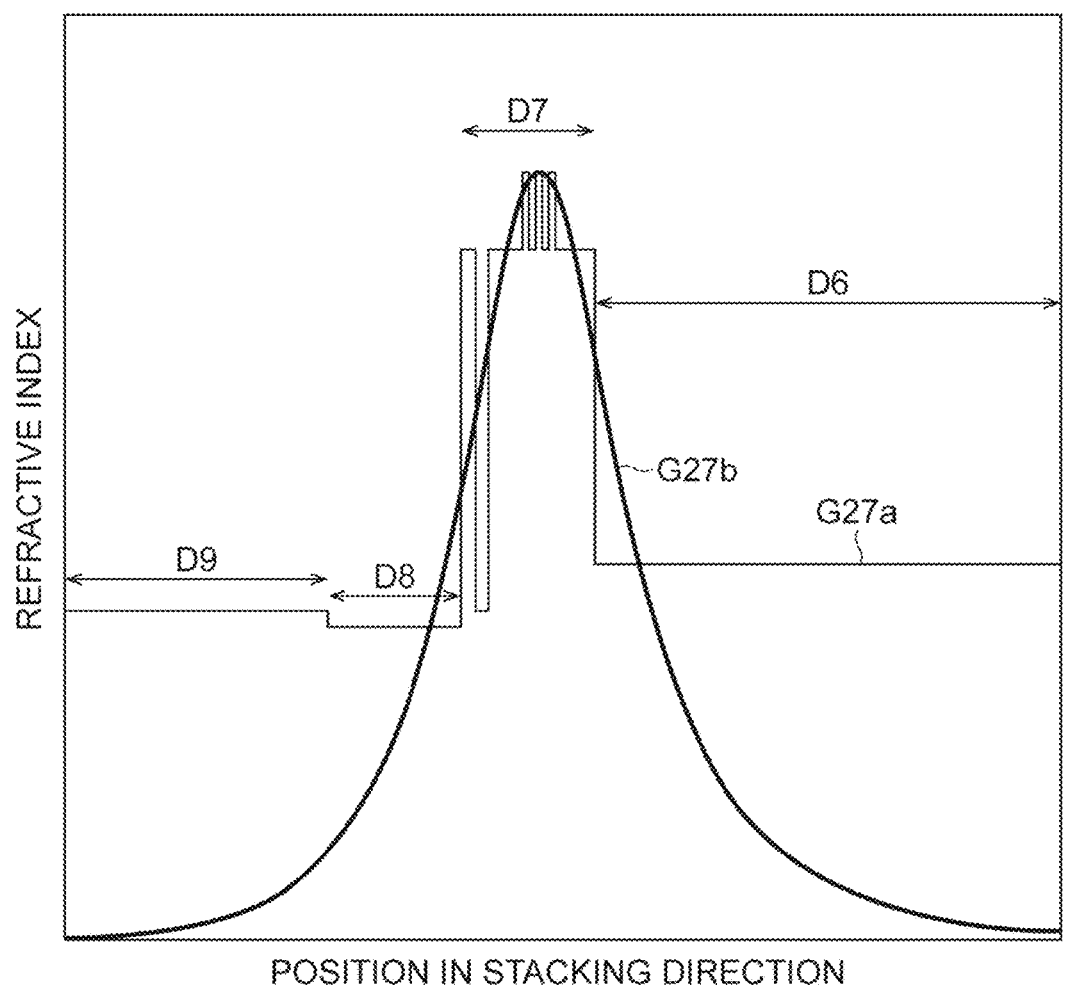
FIG. 62 is a graph illustrating refractive index distribution and mode distribution of the laser device including the layer structure illustrated in FIG. 61.

FIG. 62 illustrates refractive index distribution G27a and mode distribution G27b of the laser device 1B having a layer structure illustrated in FIG. 61. The vertical axis represents the refractive index, and the horizontal axis represents the position in the stacking direction. Section D6 in the stacking direction is the lower cladding layer 11, section D7 is the optical waveguide layer including the active layer 12, section D8 is the phase modulation layer 15A, and section D9 is the upper cladding layer 13. It can be seen that solely the fundamental mode is generated, and the higher-order mode is suppressed. Consequently, according to Example, it is possible to suppress the generation of high-order mode and reduce noise light having a mesh-formed dark portion superposed on the beam pattern.

The semiconductor light-emitting device according to the present invention is not limited to the above-described embodiment, and various other modifications are possible. For example, while the above-described embodiments and Example illustrate a laser device formed of a compound semiconductor of GaAs type, InP type, and nitride type (particularly GaN type), the present invention is also applicable to a laser device formed of various semiconductor materials other than these.

Moreover, the semiconductor light-emitting device of the present invention has flexibility in the material system, film thickness, and layer structure. Here, the scaling law holds for a square lattice photonic crystal laser in which the perturbation of the modified refractive index region from the virtual square lattice is zero. That is, in a case where the wavelength becomes a constant α times, the similar standing wave state can be obtained by multiplying the entire square lattice structure by α. Similarly, in the present invention, it is also possible to determine the structure of the phase modulation layer by the scaling law even at wavelengths other than those disclosed in Example. Accordingly, it is also possible to realize a semiconductor light-emitting device that outputs visible light by using an active layer that emits light such as blue, green, red and applying a scaling law according to the wavelength.

Figure 63:
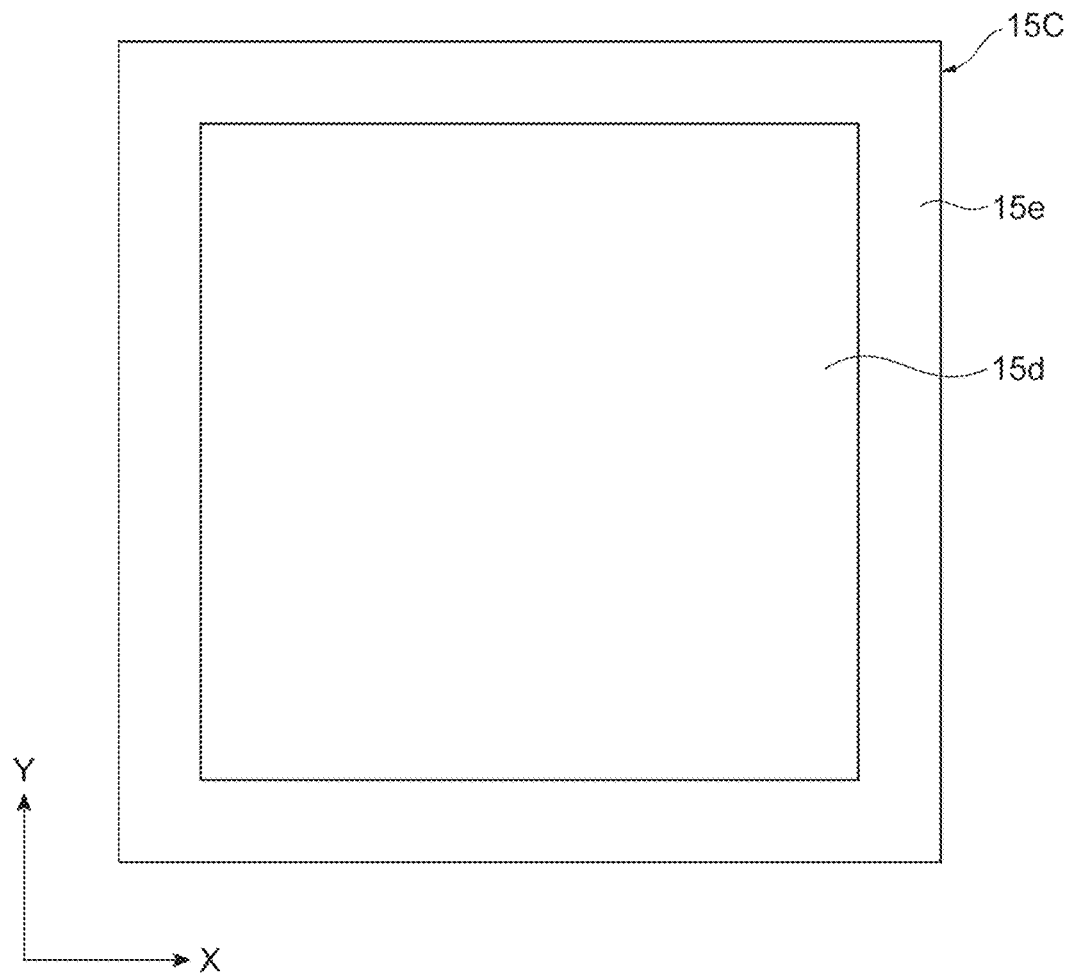
FIG. 63 is a diagram illustrating a modification of the phase modulation layer.
Figure 64B:
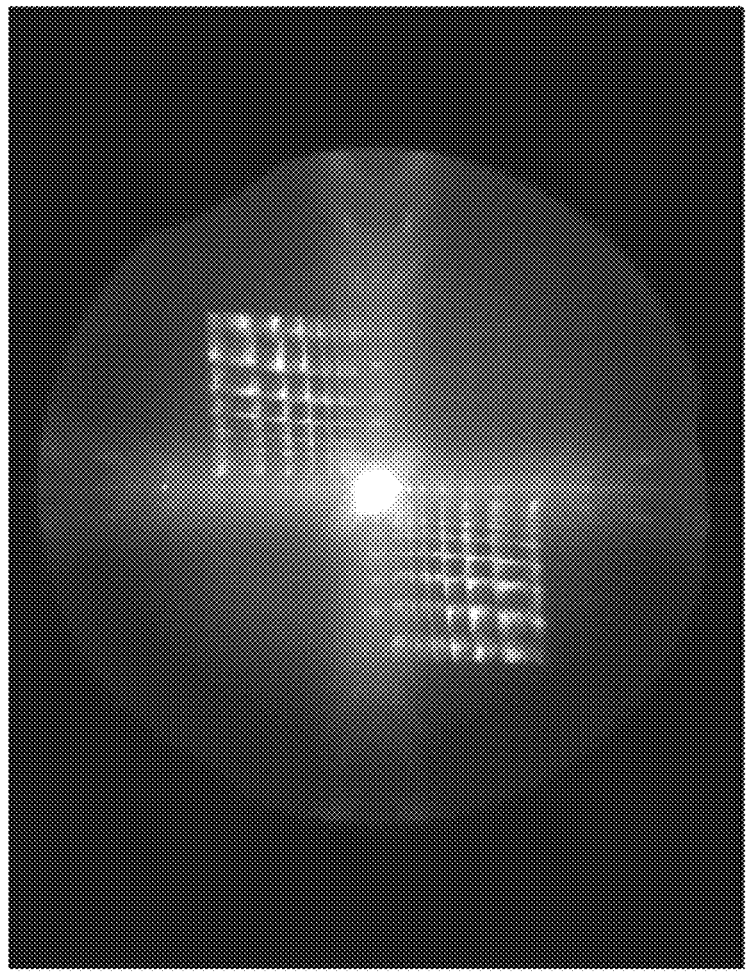
FIG. 64B illustrates an actually measured beam pattern corresponding to FIG. 64A.
Figure 64A:
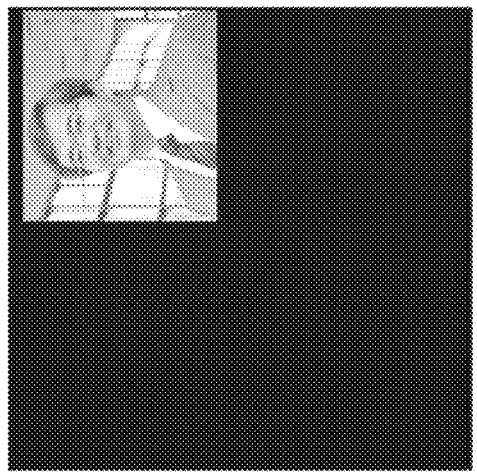
FIG. 64A illustrates a designed optical image (original image)
Figure 65B:
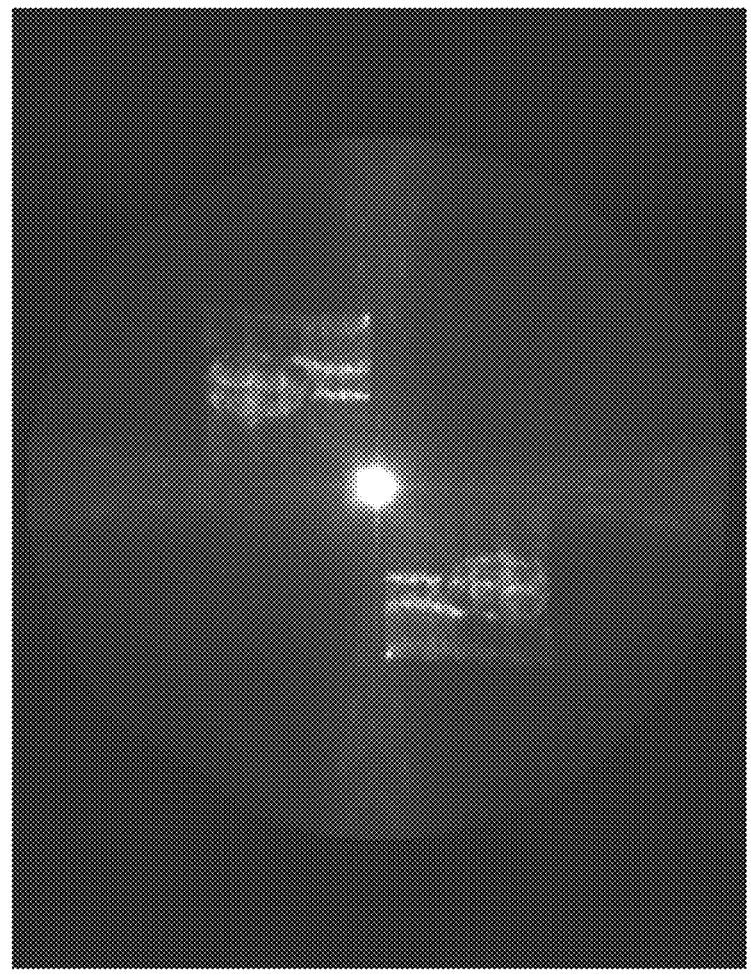
FIG. 65B illustrates an actually measured beam pattern corresponding to FIG. 65A.
Figure 65A:
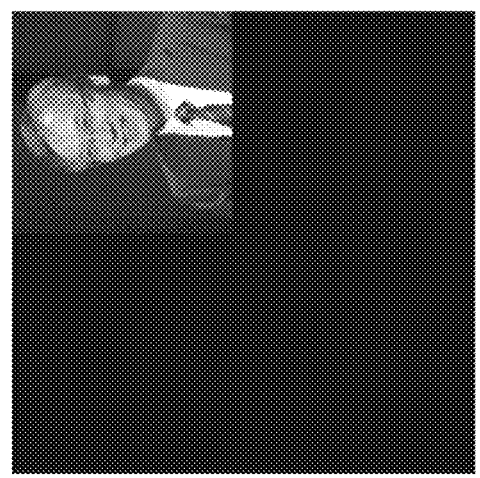
FIG. 65A illustrates a designed optical image (original image)

FIG. 63 is a view illustrating a modification of the phase modulation layer, illustrating a form viewed from the layer thickness direction. A phase modulation layer 15C according to this modification includes a region 15e in which a modified refractive index region is provided on each of lattice points O of a square lattice, located on an outer peripheral portion of a region 15d having a structure similar to that of the phase modulation layer 15A illustrated in FIG. 3 (that is, a region including an array of modified refractive index regions 15b designed to obtain a desired beam pattern). The shape and size of the modified refractive index region of the region 15e are identical to those of the modified refractive index region 15b of the phase modulation layer 15A. The lattice constant of the square lattice of the region 15e is equal to the lattice constant of the square lattice of the phase modulation layer 15A. By surrounding the region 15d by the region 15e in which the modified refractive index region is provided on each of lattice points O of the square lattice in this manner, it is possible to suppress light leakage toward the plane direction and to expect reduction of the threshold current.

As described above, with the semiconductor light-emitting device and the manufacturing method for the same according to the present embodiment, it is possible to reduce the noise light having the mesh-formed dark portion superposed on the beam pattern corresponding to the optical image outputted from the semiconductor light-emitting device.

REFERENCE SIGNS LIST

1A . . . Laser device; 10 . . . Semiconductor substrate; 10a . . . Main surface; 10b . . . Back surface; 11 . . . Lower cladding layer (first cladding layer); 12 . . . Active layer; 13 . . . Upper cladding layer (second cladding layer); 14 . . . Contact layer, 15A, 15B . . . Phase modulation layer, 15a . . . Basic layer; 15b, 15c . . . Modified refractive index region; 16, 17 . . . Electrode; 17a . . . Opening; 18 . . . Protective film; 19 . . . Antireflection film; 30 . . . Three-layer slab structure; 31 . . . Optical waveguide layer; a . . . Lattice spacing; a' . . . Asymmetric parameter; b . . . Normalized propagation coefficient; G1, G2 . . . Gravity center, O . . . Lattice point; and R . . . . Unit constituent region.

What is claimed is:

1. A semiconductor light-emitting device configured to output an optical image of an arbitrary shape in one of a normal direction of a main surface of a semiconductor substrate, an inclined direction having a predetermined inclination and having a divergence angle with respect to the normal direction, and both the normal direction and the inclined direction, the semiconductor light-emitting device comprising:

the semiconductor substrate;
a first cladding layer provided on the semiconductor substrate;
an active layer provided on the first cladding layer;
a second cladding layer provided on the active layer and having a refractive index equal to or less than a refractive index of the first cladding layer;
a contact layer provided on the second cladding layer; and
a phase modulation layer constituted with a basic layer provided at one of a portion between the first cladding layer and the active layer and a portion between the active layer and the second cladding layer and having a predetermined refractive index, and with a plurality of first modified refractive index regions each having a refractive index different from that of the basic layer,
wherein in a state of satisfying the following first to seventh conditions:
the first condition defined that a virtual square lattice formed with square-shaped M1 (integer of one or more)×N1 (integer of one or more) unit constituent regions R is set on an X-Y plane including an X-axis and a Y-axis orthogonal to each other and matching one surface of the phase modulation layer including the plurality of first modified refractive index regions, in an XYZ orthogonal coordinate system defined by a Z-axis matching the normal direction and by the X-Y plane;
the second condition defined that coordinates (x, y, z) in the XYZ orthogonal coordinate system satisfy a relationship expressed by the following formulas (1) to (3) with respect to spherical coordinates (r, $\theta_{tilt}$, $\theta_{rot}$) defined by a radius vector length r, an inclination angle $\theta_{tilt}$ from the Z-axis, and a rotation angle $\theta_{rot}$ from the X-axis specified on the X-Y plane, $$x = r \sin\theta_{tilt} \cos\theta_{rot} \qquad (1)$$

$$y = r \sin\theta_{tilt} \sin\theta_{rot} \qquad (2)$$

$$z = r \cos\theta_{tilt} \qquad (3);$$

the third condition defined that letting a beam pattern corresponding to the optical image outputted from the semiconductor light-emitting device be a set of bright spots directed in a direction defined by the angles $\theta_{tilt}$ and $\theta_{rot}$, the angles $\theta_{tilt}$ and $\theta_{rot}$ are converted into a coordinate value $k_x$ on a Kx-axis corresponding to the X-axis, that is, a normalized wavenumber defined by the following formula (4) and into a coordinate value $k_y$ on a Ky-axis corresponding to the Y-axis and orthogonal to the Kx-axis, that is, a normalized wavenumber defined by the following formula (5), $$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: lattice constant of the virtual square lattice
λ: oscillation wavelength of the semiconductor light-emitting device;
the fourth condition defined that a specific wavenumber range including the beam pattern is constituted with square-shaped M2 (integer of one or more)×N2 (integer of one or more) image regions FR in a wavenumber space defined by the Kx-axis and the Ky-axis;
the fifth condition defined that a complex amplitude F (x, y) is given by the following formula (6) with j being an imaginary unit, the complex amplitude F (x, y) being obtained, in the wavenumber space, by performing two-dimensional inverse Fourier transform on an image region FR ($k_x$, $k_y$) specified individually by a coordinate component $k_x$ (integer of one or more and M2 or less) in the Kx-axis direction and a coordinate component $k_y$ (integer of one or more and N2 or less) in the Ky-axis direction so as to be transformed onto a unit constituent region R (x, y) on the X-Y plane, specified by a coordinate component x (integer of one or more and M1 or less) in the X-axis direction and a coordinate component y (integer of one or more and N1 or less) in the Y-axis direction, $$F(x, y) = \sum_{k_x=1}^{M2} \sum_{k_y=1}^{N2} FR(k_x, k_y)\exp[j2\pi(k_x x + k_y y)]; \quad (6)$$

the sixth condition defined that letting an amplitude term be A (x, y) and a phase term be P (x, y) in the unit constituent region R (x, y), the complex amplitude F (x, y) is defined by the following formula (7), $$F(x,y)=A(x,y)\times\exp[jP(x,y)] \quad (7); \text{ and}$$

the seventh condition defined that the unit constituent region R (x, y) is defined by an s-axis and a t-axis each being parallel to the X-axis and the Y-axis, respectively, and orthogonal to each other on a lattice point O (x, y) as a center of the unit constituent region R (x, y),
the phase modulation layer is configured such that:
corresponding any of the plurality of first modified refractive index regions is arranged with a gravity center G1 of the first modified refractive index region being away from the lattice point O (x, y) within the unit constituent region R (x, y); and,
in a state where a length r (x, y) of a line segment from the lattice point O (x, y) to the gravity center G1 of the corresponding first modified refractive index region is set to a common value in each of the M1×N1 unit constituent regions R, the corresponding first modified refractive index region is arranged in the unit constituent region R (x, y) such that an angle φ (x, y) formed by the line segment connecting the lattice point O (x, y) with the gravity center G1 of the corresponding first modified refractive index region and the s-axis satisfies the following relationship, $$\varphi(x,y)=C\times P(x,y)+B$$

C: proportionality constant
B: arbitrary constant.

2. The semiconductor light-emitting device according to claim 1,
wherein each of the first cladding layer, the active layer, and the second cladding layer is a compound semiconductor layer formed by elements included in a group constituted with group III elements Ga, Al, and In and Group V element As, and
the refractive index of the second cladding layer is smaller than the refractive index of the first cladding layer.

3. The semiconductor light-emitting device according to claim 1,
wherein, in a three-layer slab waveguide structure including an optical waveguide layer and two layers adjacent to the optical waveguide layer, in which the optical waveguide layer is formed with the active layer in a case where the refractive index of the phase modulation layer is smaller than the refractive index of the first cladding layer, while the optical waveguide layer is formed with the phase modulation layer and the active layer in a case where the refractive index of the phase modulation layer is the refractive index of the first cladding layer or more,
where a propagation mode in a layer thickness direction is a TE mode, $n_1$ is a refractive index of the optical waveguide layer including the active layer, $n_2$ is a refractive index of the layer having a higher refractive index among the layers adjacent to the optical waveguide layer, $N_1$ is a mode order, $n_{clad}$ is a refractive index of the first cladding layer, $n_3$ is a refractive index of a layer having a lower refractive index among the layers adjacent to the optical waveguide layer, and $n_{eff}$ is an equivalent refractive index of the TE mode in the three-layer slab waveguide structure, in addition to this, when the normalized waveguide width $V_1$ in the TE mode is defined by the following formulas (8) and (9), and when an asymmetric parameter a' and a normalized propagation coefficient b are real numbers satisfying the following formulas (10) and (11), respectively, $$V_1 = \frac{1}{\sqrt{1-b}}\left[\tan^{-1}\sqrt{\frac{b}{1-b}} + \tan^{-1}\sqrt{\frac{b+a'}{1-b}} + N_1\pi\right] \quad (8)$$

$$b \geq \frac{n_{clad}^2 - n_2^2}{n_1^2 - n_2^2} \quad (9)$$

$$a' = \frac{n_2^2 - n_3^2}{n_1^2 - n_2^2} \quad (10)$$

$$b = \frac{n_{eff}^2 - n_2^2}{n_1^2 - n_2^2}, \quad (11)$$

the normalized waveguide width $V_1$ and the normalized propagation coefficient b are set so as to be within a range having solely one solution to the normalized waveguide width $V_1$.

4. The semiconductor light-emitting device according to claim 3,
wherein, in another three-layer slab waveguide structure including the contact layer and two layers adjacent to the contact layer,
where $n_4$ is a refractive index of the contact layer, $n_5$ is a refractive index of a layer having a higher refractive index among the layers adjacent to the contact layer, $n_6$ is a refractive index of a layer having a lower refractive index among the layers adjacent to the contact layer, $n_{\it{eff}}$ is an equivalent refractive index of the TE mode in the other three-layer slab waveguide structure, and $N_2$ is the mode order, and in addition, when a normalized waveguide width $V_2$ of the contact layer is defined by the following formulas (12) and (13) and when the asymmetric parameter a' and the normalized propagation coefficient b are real numbers satisfying the following formulas (14) and (15), respectively, $$V_2 = \frac{1}{\sqrt{1-b}}\left[ tan^{-1}\sqrt{\frac{b}{1-b}} + tan^{-1}\sqrt{\frac{b+a'}{1-b}} + N_2\pi \right] \quad (12)$$

$$b \geq \frac{n_{clad}^2 - n_5^2}{n_4^2 - n_5^2} \quad (13)$$

$$a' = \frac{n_5^2 - n_6^2}{n_4^2 - n_5^2} \quad (14)$$

$$b = \frac{n_{\it{eff}}^2 - n_5^2}{n_4^2 - n_5^2}, \quad (15)$$

the normalized waveguide width $V_2$ and the normalized propagation coefficient b are set to be within a range having no solution to the normalized waveguide width $V_2$.

5. The semiconductor light-emitting device according to claim 1,
wherein sizes of the plurality of first modified refractive index regions are equal to each other within the X-Y plane.

6. The semiconductor light-emitting device according to claim 1,
wherein the shape of each of the plurality of first modified refractive index regions has mirror symmetry in the X-Y plane.

7. The semiconductor light-emitting device according to claim 1,
wherein the shape of each of the plurality of first modified refractive index regions has no rotational symmetry of 180° in the X-Y plane.

8. The semiconductor light-emitting device according to claim 1,
wherein lengths of the plurality of first modified refractive index regions in a Z direction orthogonal to the X-Y plane and matching the thickness direction of the phase modulation layer, are equal to each other.

9. The semiconductor light-emitting device according to claim 1,
wherein the plurality of first modified refractive index regions has an identical shape in the X-Y plane.

10. The semiconductor light-emitting device according to claim 1,
wherein the phase modulation layer further includes a plurality of second modified refractive index regions provided corresponding to each of the M1×N1 unit constituent regions R, and the second modified refractive index region provided within the unit constituent region R (x, y) among the plurality of second modified refractive index regions includes the lattice point O (x, y) of the unit constituent region R (x, y) and is arranged within a region away from the corresponding first modified refractive index region, within the X-Y plane.

11. The semiconductor light-emitting device according to claim 10,
wherein each of the plurality of second modified refractive index regions is arranged such that a gravity center G2 of the second modified refractive index region matches the lattice point O (x, y) in the corresponding unit constituent region R (x, y).

12. The semiconductor light-emitting device according to claim 1,
wherein a beam for forming the optical image is emitted from the second cladding layer side with respect to the active layer.

13. A semiconductor light-emitting device configured to output an optical image of an arbitrary shape in one of a normal direction of a main surface of a semiconductor substrate, an inclined direction having a predetermined inclination and having a divergence angle with respect to the normal direction, and both the normal direction and the inclined direction, the semiconductor light-emitting device comprising:
the semiconductor substrate;
a first cladding layer provided on the semiconductor substrate;
an active layer provided on the first cladding layer;
a second cladding layer provided on the active layer and having a refractive index equal to or less than a refractive index of the first cladding layer;
a contact layer provided on the second cladding layer; and
a phase modulation layer constituted with a basic layer provided at one of a portion between the first cladding layer and the active layer and a portion between the active layer and the second cladding layer and having a predetermined refractive index, and with a plurality of first modified refractive index regions each having a refractive index different from that of the basic layer,
wherein each of the first cladding layer, the active layer, and the second cladding layer is a compound semiconductor layer formed by elements included in a group constituted with group III elements Ga, Al, and In and Group V element As,
wherein the refractive index of the second cladding layer is smaller than the refractive index of the first cladding layer, and
wherein in a state of satisfying the following first to seventh conditions:
the first condition defined that a virtual square lattice formed with square-shaped M1 (integer of one or more)×N1 (integer of one or more) unit constituent regions R is set on an X-Y plane including an X-axis and a Y-axis orthogonal to each other and matching one surface of the phase modulation layer including the plurality of first modified refractive index regions, in an XYZ orthogonal coordinate system defined by a Z-axis matching the normal direction and by the X-Y plane;
the second condition defined that coordinates (x, y, z) in the XYZ orthogonal coordinate system satisfy a relationship expressed by the following formulas (1) to (3) with respect to spherical coordinates (r, $\theta_{tilt}$, $\theta_{rot}$) defined by a radius vector length r, an inclination angle $\theta_{tilt}$ from the Z-axis, and a rotation angle $\theta_{rot}$ from the X-axis specified on the X-Y plane, $$x = r \sin\theta_{tilt} \cos\theta_{rot} \qquad (1)$$

$$y = r \sin\theta_{tilt} \sin\theta_{rot} \qquad (2)$$

$$z = r \cos\theta_{tilt} \qquad (3);$$

the third condition defined that letting a beam pattern corresponding to the optical image outputted from the semiconductor light-emitting device be a set of bright spots directed in a direction defined by the angles $\theta_{tilt}$ and $\theta_{rot}$, the angles $\theta_{tilt}$ and $\theta_{rot}$ are converted into a coordinate value $k_x$ on a Kx-axis corresponding to the X-axis, that is, a normalized wavenumber defined by the following formula (4) and into a coordinate value $k_y$ on a Ky-axis corresponding to the Y-axis and orthogonal to the Kx-axis, that is, a normalized wavenumber defined by the following formula (5), $$k_x = \frac{a}{\lambda}\sin\theta_{tilt}\cos\theta_{rot} \qquad (4)$$

$$k_y = \frac{a}{\lambda}\sin\theta_{tilt}\sin\theta_{rot} \qquad (5)$$

a: lattice constant of the virtual square lattice
λ: oscillation wavelength of the semiconductor light-emitting device;
the fourth condition defined that a specific wavenumber range including the beam pattern is constituted with square-shaped M2 (integer of one or more)×N2 (integer of one or more) image regions FR in a wavenumber space defined by the Kx-axis and the Ky-axis;
the fifth condition defined that a complex amplitude F (x, y) is given by the following formula (6) with j being an imaginary unit, the complex amplitude F (x, y) being obtained, in the wavenumber space, by performing two-dimensional inverse Fourier transform on an image region FR ($k_x$, $k_y$) specified individually by a coordinate component $k_x$ (integer of one or more and M2 or less) in the Kx-axis direction and a coordinate component $k_y$ (integer of one or more and N2 or less) in the Ky-axis direction so as to be transformed onto a unit constituent region R (x, y) on the X-Y plane, specified by a coordinate component x (integer of one or more and M1 or less) in the X-axis direction and a coordinate component y (integer of one or more and N1 or less) in the Y-axis direction, $$F(x, y) = \sum_{k_x=1}^{M2} \sum_{k_y=1}^{N2} FR(k_x, k_y)\exp[j2\pi(k_x x + k_y y)]; \qquad (6)$$

the sixth condition defined that letting an amplitude term be A (x, y) and a phase term be P (x, y) in the unit constituent region R (x, y), the complex amplitude F (x, y) is defined by the following formula (7), $$F(x,y) = A(x,y)\times\exp[jP(x,y)] \qquad (7); \text{ and}$$

the seventh condition defined that the unit constituent region R (x, y) is defined by an s-axis and a t-axis each being parallel to the X-axis and the Y-axis, respectively, and orthogonal to each other on a lattice point O (x, y) as a center of the unit constituent region R (x, y), the phase modulation layer is configured such that:
corresponding any of the plurality of first modified refractive index regions is arranged with a gravity center G1 of the first modified refractive index region being away from the lattice point O (x, y) within the unit constituent region R (x, y); and,
in a state where a length r (x, y) of a line segment from the lattice point O (x, y) to the gravity center G1 of the corresponding first modified refractive index region is set to a common value in each of the M1×N1 unit constituent regions R, the corresponding first modified refractive index region is arranged in the unit constituent region R (x, y) such that an angle φ (x, y) formed by the line segment connecting the lattice point O (x, y) with the gravity center G1 of the corresponding first modified refractive index region and the s-axis satisfies the following relationship, $$\varphi(x,y) = C \times P(x,y) + B$$

C: proportionality constant
B: arbitrary constant.

14. A semiconductor light-emitting device configured to output an optical image of an arbitrary shape in one of a normal direction of a main surface of a semiconductor substrate, an inclined direction having a predetermined inclination and having a divergence angle with respect to the normal direction, and both the normal direction and the inclined direction, the semiconductor light-emitting device comprising:
the semiconductor substrate;
a first cladding layer provided on the semiconductor substrate;
an active layer provided on the first cladding layer;
a second cladding layer provided on the active layer and having a refractive index equal to or less than a refractive index of the first cladding layer;
a contact layer provided on the second cladding layer; and
a phase modulation layer constituted with a basic layer provided at one of a portion between the first cladding layer and the active layer and a portion between the active layer and the second cladding layer and having a predetermined refractive index, and with a plurality of first modified refractive index regions each having a refractive index different from that of the basic layer,
wherein in a state of satisfying the following first to seventh conditions:
the first condition defined that a virtual square lattice formed with square-shaped M1 (integer of one or more)×N1 (integer of one or more) unit constituent regions R is set on an X-Y plane including an X-axis and a Y-axis orthogonal to each other and matching one surface of the phase modulation layer including the plurality of first modified refractive index regions, in an XYZ orthogonal coordinate system defined by a Z-axis matching the normal direction and by the X-Y plane;
the second condition defined that coordinates (x, y, z) in the XYZ orthogonal coordinate system satisfy a relationship expressed by the following formulas (1) to (3) with respect to spherical coordinates (r, $\theta_{tilt}$, $\theta_{rot}$) defined by a radius vector length r, an inclination angle $\theta_{tilt}$ from the Z-axis, and a rotation angle $\theta_{rot}$ from the X-axis specified on the X-Y plane, $$x = r \sin\theta_{tilt} \cos\theta_{rot} \qquad (1)$$

$$y = r \sin\theta_{tilt} \sin\theta_{rot} \qquad (2)$$

$$z = r \cos\theta_{tilt} \qquad (3);$$

the third condition defined that letting a beam pattern corresponding to the optical image outputted from the semiconductor light-emitting device be a set of bright spots directed in a direction defined by the angles $\theta_{tilt}$ and $\theta_{rot}$, the angles $\theta_{tilt}$ and $\theta_{rot}$ are converted into a coordinate value $k_x$ on a Kx-axis corresponding to the X-axis, that is, a normalized wavenumber defined by the following formula (4) and into a coordinate value $k_y$ on a Ky-axis corresponding to the Y-axis and orthogonal to the Kx-axis, that is, a normalized wavenumber defined by the following formula (5), $$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: lattice constant of the virtual square lattice
λ: oscillation wavelength of the semiconductor light-emitting device;
the fourth condition defined that a specific wavenumber range including the beam pattern is constituted with square-shaped M2 (integer of one or more)×N2 (integer of one or more) image regions FR in a wavenumber space defined by the Kx-axis and the Ky-axis;
the fifth condition defined that a complex amplitude F (x, y) is given by the following formula (6) with j being an imaginary unit, the complex amplitude F (x, y) being obtained, in the wavenumber space, by performing two-dimensional inverse Fourier transform on an image region FR ($k_x$, $k_y$) specified individually by a coordinate component $k_x$ (integer of one or more and M2 or less) in the Kx-axis direction and a coordinate component $k_y$ (integer of one or more and N2 or less) in the Ky-axis direction so as to be transformed onto a unit constituent region R (x, y) on the X-Y plane, specified by a coordinate component x (integer of one or more and M1 or less) in the X-axis direction and a coordinate component y (integer of one or more and N1 or less) in the Y-axis direction, $$F(x, y) = \sum_{k_x=1}^{M2}\sum_{k_y=1}^{N2} FR(k_x, k_y)\exp[j2\pi(k_x x + k_y y)]; \quad (6)$$

the sixth condition defined that letting an amplitude term be A (x, y) and a phase term be P (x, y) in the unit constituent region R (x, y), the complex amplitude F (x, y) is defined by the following formula (7), $$F(x,y)=A(x,y)\times\exp[jP(x,y)] \quad (7); \text{ and}$$

the seventh condition defined that the unit constituent region R (x, y) is defined by an s-axis and a t-axis each being parallel to the X-axis and the Y-axis, respectively, and orthogonal to each other on a lattice point O (x, y) as a center of the unit constituent region R (x, y),
the phase modulation layer is configured such that:
corresponding any of the plurality of first modified refractive index regions is arranged with a gravity center G1 of the first modified refractive index region being away from the lattice point O (x, y) within the unit constituent region R (x, y); and,
in a state where a length r (x, y) of a line segment from the lattice point O (x, y) to the gravity center G1 of the corresponding first modified refractive index region is set to a common value in each of the M1×N1 unit constituent regions R, the corresponding first modified refractive index region is arranged in the unit constituent region R (x, y) such that an angle φ (x, y) formed by the line segment connecting the lattice point O (x, y) with the gravity center G1 of the corresponding first modified refractive index region and the s-axis satisfies the following relationship, $$\varphi(x,y)=C\times P(x,y)+B$$

C: proportionality constant
B: arbitrary constant, and
wherein, in a three-layer slab waveguide structure including an optical waveguide layer and two layers adjacent to the optical waveguide layer, in which the optical waveguide layer is formed with the active layer in a case where the refractive index of the phase modulation layer is smaller than the refractive index of the first cladding layer, while the optical waveguide layer is formed with the phase modulation layer and the active layer in a case where the refractive index of the phase modulation layer is the refractive index of the first cladding layer or more,
where a propagation mode in a layer thickness direction is a TE mode, $n_1$ is a refractive index of the optical waveguide layer including the active layer, $n_2$ is a refractive index of the layer having a higher refractive index among the layers adjacent to the optical waveguide layer, $N_1$ is a mode order, $n_{clad}$ is a refractive index of the first cladding layer, $n_3$ is a refractive index of a layer having a lower refractive index among the layers adjacent to the optical waveguide layer, and $n_{eff}$ is an equivalent refractive index of the TE mode in the three-layer slab waveguide structure, in addition to this, when the normalized waveguide width $V_1$ in the TE mode is defined by the following formulas (8) and (9), and when an asymmetric parameter a' and a normalized propagation coefficient b are real numbers satisfying the following formulas (10) and (11), respectively, $$V_1 = \frac{1}{\sqrt{1-b}}\left[\tan^{-1}\sqrt{\frac{b}{1-b}} + \tan^{-1}\sqrt{\frac{b+a'}{1-b}} + N_1\pi\right] \quad (8)$$

$$b \geq \frac{n_{clad}^2 - n_2^2}{n_1^2 - n_2^2} \quad (9)$$

$$a' = \frac{n_2^2 - n_3^2}{n_1^2 - n_2^2} \quad (10)$$

$$b = \frac{n_{eff}^2 - n_2^2}{n_1^2 - n_2^2}, \quad (11)$$

the normalized waveguide width $V_1$ and the normalized propagation coefficient b are set so as to be within a range having solely one solution to the normalized waveguide width $V_1$.

15. A manufacturing method for a semiconductor light-emitting device configured to output an optical image of an arbitrary shape in one of a normal direction of a main surface of a semiconductor substrate, an inclined direction having a predetermined inclination and having a divergence angle with respect to the normal direction, and both the normal direction and the inclined direction, the method comprising:
a first step of forming a first cladding layer on the semiconductor substrate;

a second step of forming an active layer on the first cladding layer;
a third step of forming a second cladding layer on the active layer, the second cladding layer having a refractive index equal to or less than a refractive index of the first cladding layer;
a fourth step of forming a contact layer on the second cladding layer; and
a fifth step executed between the first step and the second step, or between the second step and the third step and provided for forming a phase modulation layer constituted with a basic layer provided at one of a portion between the first cladding layer and the active layer and a portion between the active layer and the second cladding layer and having a predetermined refractive index, and with a plurality of first modified refractive index regions each having a refractive index different from the refractive index of the basic layer,
wherein in the fifth step, in a state of satisfying the following first to seventh conditions:
the first condition defined that a virtual square lattice formed with square-shaped M1 (integer of one or more)×N1 (integer of one or more) unit constituent regions R is set on an X-Y plane including an X-axis and a Y-axis orthogonal to each other and matching one surface of the phase modulation layer including the plurality of first modified refractive index regions, in an XYZ orthogonal coordinate system defined by a Z-axis matching the normal direction and by the X-Y plane;
the second condition defined that coordinates (x, y, z) in the XYZ orthogonal coordinate system satisfy a relationship expressed by the following formulas (16) to (18) with respect to spherical coordinates (r, $\theta_{tilt}$, $\theta_{rot}$) defined by a radius vector length r, an inclination angle $\theta_{tilt}$ from the Z-axis, and a rotation angle $\theta_{rot}$ from the X-axis specified on the X-Y plane, $x = r \sin\theta_{tilt} \cos\theta_{rot}$ (16)

$y = r \sin\theta_{tilt} \sin\theta_{rot}$ (17)

$z = r \cos\theta_{tilt}$ (18);

the third condition defined that letting a beam pattern corresponding to the optical image outputted from the semiconductor light-emitting device be a set of bright spots directed in a direction defined by the angles $\theta_{tilt}$ and $\theta_{rot}$, the angles $\theta_{tilt}$ and $\theta_{rot}$ are converted into a coordinate value $k_x$ on a Kx-axis corresponding to the X-axis, that is, a normalized wavenumber defined by the following formula (19) and into a coordinate value $k_y$ on a Ky-axis corresponding to the Y-axis and orthogonal to the Kx-axis, that is, a normalized wavenumber defined by the following formula (20), $k_x = \frac{a}{\lambda} \sin\theta_{tilt} \cos\theta_{rot}$ (19)

$k_y = \frac{a}{\lambda} \sin\theta_{tilt} \sin\theta_{rot}$ (20)

a: lattice constant of the virtual square lattice
λ: oscillation wavelength of the semiconductor light-emitting device;
the fourth condition defined that a specific wavenumber range including the beam pattern is constituted with square-shaped M2 (integer of one or more)×N2 (integer of one or more) image regions FR in a wavenumber space defined by the Kx-axis and the Ky-axis;
the fifth condition defined that a complex amplitude F (x, y) is given by the following formula (21) with j being an imaginary unit, the complex amplitude F (x, y) being obtained, in the wavenumber space, by performing two-dimensional inverse Fourier transform on an image region FR ($k_x$, $k_y$) specified individually by a coordinate component $k_x$ (integer of one or more and M2 or less) in the Kx-axis direction and a coordinate component $k_y$ (integer of one or more and N2 or less) in the Ky-axis direction so as to be transformed onto a unit constituent region R (x, y) on the X-Y plane, specified by a coordinate component x (integer of one or more and M1 or less) in the X-axis direction and a coordinate component y (integer of one or more and N1 or less) in the Y-axis direction, $$F(x, y) = \sum_{k_x=1}^{M2} \sum_{k_y=1}^{N2} FR(k_x, k_y) \exp[j2\pi(k_x x + k_y y)];$$ (21)

the sixth condition defined that letting an amplitude term be A (x, y) and a phase term be P (x, y) in the unit constituent region R (x, y), the complex amplitude F (x, y) is defined by the following formula (22), $F(x,y) = A(x,y) \times \exp[jP(x,y)]$ (22); and the seventh condition defined that the unit constituent region R (x, y) is defined by an s-axis and a t-axis each being parallel to the X-axis and the Y-axis, respectively, and orthogonal to each other on a lattice point O (x, y) as a center of the unit constituent region R (x, y),
the phase modulation layer is configured such that:
corresponding any of the plurality of first modified refractive index regions is arranged with a gravity center G1 of the first modified refractive index region being away from the lattice point O (x, y) within the unit constituent region R (x, y); and,
in a state where a length r (x, y) of a line segment from the lattice point O (x, y) to the gravity center G1 of the corresponding first modified refractive index region is set to a common value in each of the M1×N1 unit constituent regions R, the corresponding first modified refractive index region is arranged in the unit constituent region R (x, y) such that an angle φ (x, y) formed by the line segment connecting the lattice point O (x, y) with the gravity center G1 of the corresponding first modified refractive index region and the s-axis satisfies the following relationship, $\varphi(x,y) = C \times P(x,y) + B$ C: proportionality constant
B: arbitrary constant.
16. The manufacturing method according to claim 15, wherein each of the first cladding layer, the active layer, and the second cladding layer is a compound semiconductor layer formed by elements included in a group constituted with group III elements Ga, Al, and In and Group V element As, and
the refractive index of the second cladding layer is smaller than the refractive index of the first cladding layer.
17. The manufacturing method according to claim 15, wherein, in a three-layer slab waveguide structure including an optical waveguide layer and two layers adjacent to the optical waveguide layer, in which the optical waveguide layer is formed with the active layer in a case where the refractive index of the phase modulation layer is smaller than the refractive index of the first cladding layer, while the optical waveguide layer is formed with the phase modulation layer and the active layer in a case where the refractive index of the phase modulation layer is the refractive index of the first cladding layer or more, where a propagation mode in a layer thickness direction is a TE mode, $n_1$ is a refractive index of the optical waveguide layer including the active layer, $n_2$ is a refractive index of the layer having a higher refractive index among the layers adjacent to the optical waveguide layer, $N_1$ is a mode order, $n_{clad}$ is a refractive index of the first cladding layer, $n_3$ is a refractive index of a layer having a lower refractive index among the layers adjacent to the optical waveguide layer, and $n_{eff}$ is an equivalent refractive index of the TE mode in the three-layer slab waveguide structure, in addition to this, when the normalized waveguide width $V_1$ in the TE mode is defined by the following formulas (23) and (24), and when an asymmetric parameter a' and a normalized propagation coefficient b are real numbers satisfying the following formulas (25) and (26), respectively, $$V_1 = \frac{1}{\sqrt{1-b}}\left[tan^{-1}\sqrt{\frac{b}{1-b}} + tan^{-1}\sqrt{\frac{b+a'}{1-b}} + N_1\pi\right] \quad (23)$$

$$b \geq \frac{n_{clad}^2 - n_2^2}{n_1^2 - n_2^2} \quad (24)$$

$$a' = \frac{n_2^2 - n_3^2}{n_1^2 - n_2^2} \quad (25)$$

$$b = \frac{n_{eff}^2 - n_2^2}{n_1^2 - n_2^2}, \quad (26)$$

the normalized waveguide width $V_1$ and the normalized propagation coefficient b are set so as to be within a range having solely one solution to the normalized waveguide width $V_1$.

18. The manufacturing method according to claim 17,
wherein, in another three-layer slab waveguide structure including the contact layer and two layers adjacent to the contact layer,
where $n_4$ is a refractive index of the contact layer, $n_5$ is a refractive index of a layer having a higher refractive index among the layers adjacent to the contact layer, $n_6$ is a refractive index of a layer having a lower refractive index among the layers adjacent to the contact layer, $n_{eff}$ is an equivalent refractive index of the TE mode in the other three-layer slab waveguide structure, and $N_2$ is the mode order, and in addition, when a normalized waveguide width $V_2$ of the contact layer is defined by the following formulas (27) and (28) and when the asymmetric parameter a' and the normalized propagation coefficient b are real numbers satisfying the following formulas (29) and (30), respectively, $$V_2 = \frac{1}{\sqrt{1-b}}\left[tan^{-1}\sqrt{\frac{b}{1-b}} + tan^{-1}\sqrt{\frac{b+a'}{1-b}} + N_2\pi\right] \quad (27)$$

$$b \geq \frac{n_{clad}^2 - n_5^2}{n_4^2 - n_5^2} \quad (28)$$

$$a' = \frac{n_5^2 - n_6^2}{n_4^2 - n_5^2} \quad (29)$$

$$b = \frac{n_{eff}^2 - n_5^2}{n_4^2 - n_5^2}, \quad (30)$$

the normalized waveguide width $V_2$ and the normalized propagation coefficient b are set so as to be within a range having no solution to the normalized waveguide width $V_2$.

19. The manufacturing method according to claim 15, wherein sizes of the plurality of first modified refractive index regions are equal to each other within the X-Y plane.

20. The manufacturing method according to claim 15, wherein the shape of each of the plurality of first modified refractive index regions has mirror symmetry in the X-Y plane.

21. The manufacturing method according to claim 15, wherein the shape of each of the plurality of first modified refractive index regions has no rotational symmetry of 180° in the X-Y plane.

22. The manufacturing method according to claim 15, wherein lengths of the plurality of first modified refractive index regions in a Z direction orthogonal to the X-Y plane and matching the thickness direction of the phase modulation layer, are equal to each other.

23. The manufacturing method according to claim 15, wherein the plurality of first modified refractive index regions has an identical shape in the X-Y plane.

24. The manufacturing method according to claim 15, wherein the phase modulation layer further includes a plurality of second modified refractive index regions provided corresponding to each of the M1×N1 unit constituent regions R, and
the second modified refractive index region provided within the unit constituent region R (x, y) among the plurality of second modified refractive index regions includes the lattice point O (x, y) of the unit constituent region R (x, y) and is arranged within a region away from the corresponding first modified refractive index region, within the X-Y plane.

25. The manufacturing method according to claim 24, wherein each of the plurality of second modified refractive index regions is arranged such that a gravity center G2 of the second modified refractive index region matches the lattice point O (x, y) in the corresponding unit constituent region R (x, y).

26. The manufacturing method according to claim 15, wherein a beam for forming the optical image is emitted from the second cladding layer side with respect to the active layer.

\* \* \* \* \*

UNITED STATES PATENT AND TRADEMARK OFFICE
CERTIFICATE OF CORRECTION

PATENT NO. : 9,991,669 B2  
APPLICATION NO. : 15/656096  
DATED : June 5, 2018  
INVENTOR(S) : Hirose et al.

Page 1 of 1

It is certified that error appears in the above-identified patent and that said Letters Patent is hereby corrected as shown below:

On the Title Page

Item (30) change "(JP) 2014-053409" to --(JP) 2017-053409--

Signed and Sealed this  
Thirty-first Day of July, 2018

Andrei Iancu  
*Director of the United States Patent and Trademark Office*